United States Patent
Kim et al.

(10) Patent No.: US 11,282,896 B2
(45) Date of Patent: Mar. 22, 2022

(54) ELECTROLUMINESCENT DISPLAY APPARATUS COMPRISING MULTILAYER ELECTRODE

(71) Applicant: LG Display Co., Ltd., Seoul (KR)

(72) Inventors: Ho-Jin Kim, Paju-si (KR); Gyungmin Kim, Paju-si (KR); Sul Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 9 days.

(21) Appl. No.: 16/526,035

(22) Filed: Jul. 30, 2019

(65) Prior Publication Data
US 2020/0043986 A1 Feb. 6, 2020

(30) Foreign Application Priority Data

Jul. 31, 2018 (KR) .................. 10-2018-0089425
Oct. 30, 2018 (KR) .................. 10-2018-0131057
Apr. 17, 2019 (KR) .................. 10-2019-0045038

(51) Int. Cl.
H01L 27/32 (2006.01)
H01L 51/52 (2006.01)

(52) U.S. Cl.
CPC ........ H01L 27/3211 (2013.01); H01L 27/322 (2013.01); H01L 27/3258 (2013.01);
(Continued)

(58) Field of Classification Search
CPC ............... H01L 27/3211; H01L 27/322; H01L 27/3258; H01L 27/3246; H01L 27/3206;
(Continued)

(56) References Cited

U.S. PATENT DOCUMENTS 7,980,911 B2 7/2011 Maeda et al.
2007/0194696 A1* 8/2007 Hsu ................. H01L 51/5271
313/504

(Continued)

FOREIGN PATENT DOCUMENTS

GB 2577377 A 3/2020
JP 2006-269329 A 10/2006
(Continued)

OTHER PUBLICATIONS

Notice of Allowance dated Sep. 10, 2019, issued in corresponding Korean Patent Application No. 10-2019-0045038.
(Continued)

Primary Examiner — Thao X Le
Assistant Examiner — Gardner W. S. Swan
(74) Attorney, Agent, or Firm — Morgan, Lewis & Bockius LLP

(57) ABSTRACT

An electroluminescent display apparatus includes: a substrate including: first to third subpixels, a circuit device layer including a driving thin-film transistor respectively in each of the first to third subpixels on the substrate, a first electrode respectively in each of the first to third subpixels, a light-emitting layer on the first electrodes, and a second electrode on the light-emitting layer, wherein the first electrode of the first subpixel includes: a first lower electrode, and a first upper electrode, wherein the first electrode of the second subpixel includes: a second lower electrode, and a second upper electrode, wherein a distance between the first lower electrode and the first upper electrode differs from a distance between the second lower electrode and the second upper electrode, and wherein the first lower electrode and the first upper electrode are electrically connected to each other through a first contact electrode therebetween.

20 Claims, 45 Drawing Sheets

(52) U.S. Cl.
CPC .. *H01L 51/5206* (2013.01); *H01L 2251/5315* (2013.01); *H01L 2251/558* (2013.01)

(58) Field of Classification Search
CPC ............ H01L 27/3248; H01L 27/3244; H01L 27/3213; H01L 27/3276; H01L 2251/5315; H01L 2251/558; H01L 51/5206; H01L 51/5218; H01L 51/5265; H01L 51/5203; H01L 51/56; H01L 51/5275
USPC .......................................................... 257/40
See application file for complete search history.

(56) References Cited

U.S. PATENT DOCUMENTS

| | | | | |
|---|---|---|---|---|
| 2008/0252979 | A1* | 10/2008 | Matsumoto | G02B 5/204 359/588 |
| 2009/0267494 | A1* | 10/2009 | Lee | H01L 51/5265 313/504 |
| 2010/0090594 | A1* | 4/2010 | Choi | H01L 51/5215 313/506 |
| 2010/0253222 | A1 | 10/2010 | Koshihara | |
| 2014/0103385 | A1* | 4/2014 | Hatano | H01L 33/005 257/99 |
| 2014/0159007 | A1* | 6/2014 | Song | H01L 27/322 257/40 |
| 2014/0159020 | A1* | 6/2014 | Song | H01L 51/5265 257/40 |
| 2014/0183460 | A1* | 7/2014 | Kim | H01L 51/5265 257/40 |
| 2015/0001558 | A1* | 1/2015 | Nozawa | H01L 27/3246 257/88 |
| 2016/0149156 | A1* | 5/2016 | Kim | H01L 27/3246 257/40 |
| 2016/0190520 | A1 | 6/2016 | Koshihara | |
| 2016/0225828 | A1* | 8/2016 | Lee | H01L 27/322 |
| 2017/0213876 | A1* | 7/2017 | Ohsawa | H01L 51/5203 |
| 2019/0189701 | A1* | 6/2019 | Bang | H01L 51/5206 |
| 2020/0044177 | A1 | 2/2020 | Kim et al. | |

FOREIGN PATENT DOCUMENTS

| | | |
|---|---|---|
| JP | 2007-059116 A | 3/2007 |
| JP | 2013-165014 A | 8/2013 |
| KR | 10-2010-0069337 A | 6/2010 |
| KR | 10-2015-0078352 A | 7/2015 |
| KR | 10-2016-0039105 A | 4/2016 |

OTHER PUBLICATIONS

Examination Report dated Jun. 26, 2020, issued in corresponding United Kingdom Patent Application No. GB1910934.7.

* cited by examiner

ELECTROLUMINESCENT DISPLAY APPARATUS COMPRISING MULTILAYER ELECTRODE

CROSS-REFERENCE TO RELATED APPLICATION(S)

This application claims the benefit of and priority to Korean Patent Applications No. 10-2018-0089425, filed on Jul. 31, 2018; No. 10-2018-0131057, filed on Oct. 30, 2018; and No. 10-2019-0045038, filed on Apr. 17, 2019, the entirety of each of which is hereby incorporated by reference.

BACKGROUND

1. Technical Field

The present disclosure relates to an electroluminescent display apparatus, and more particularly, to an electroluminescent display apparatus for emitting white light.

2. Discussion of the Related Art

Electroluminescent display apparatuses are apparatuses in which a light-emitting layer is between two electrodes (e.g., an anode electrode and a cathode electrode), and emits light with an electric field generated between the two electrodes, thereby displaying an image. The light-emitting layer may be formed of an organic material or an inorganic material, such as a quantum dot. In the light-emitting layer, an exciton is generated by a combination of an electron and a hole. When the exciton is shifted from an excited state to a ground state, light is emitted.

The light-emitting layer may emit light of different colors (for example, red, green, and blue) in subpixels, and may emit light of the same color (for example, white light) in the subpixels. When the light-emitting layer emits light of different colors by units of subpixels, because different light-emitting layers should be deposited in subpixels using a mask, there is a limitation in which a mask process is additionally performed. When a mask is not precisely aligned, there is a problem in which it is difficult to deposit the light-emitting layer in each subpixel.

On the other hand, when the light-emitting layer emits light of the same color (for example, white light) in subpixels, a mask for forming the light-emitting layer is not needed. Thus, a problem caused by a mask process does not occur.

However, when the light-emitting layer is implemented to emit white light, a color filter should be further provided in each subpixel. Light emitted from the light-emitting layer is absorbed by the color filter, causing a reduction in light efficiency.

SUMMARY

Accordingly, the present disclosure is directed to an electroluminescent display apparatus that substantially obviates one or more of the issues due to limitations and disadvantages of the related art.

An aspect of the present disclosure is to provide electroluminescent display apparatus that includes a light-emitting layer for emitting white light and that enhances light efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: An electroluminescent display apparatus, including: a substrate including: a first subpixel, a second subpixel, and a third subpixel, a circuit device layer including a driving thin-film transistor respectively in each of the first to third subpixels on the substrate, a first electrode respectively in each of the first to third subpixels on the circuit device layer, a light-emitting layer on the first electrodes, and a second electrode on the light-emitting layer, wherein the first electrode of the first subpixel includes: a first lower electrode, and a first upper electrode, wherein the first electrode of the second subpixel includes: a second lower electrode, and a second upper electrode, wherein a distance between the first lower electrode and the first upper electrode differs from a distance between the second lower electrode and the second upper electrode, and wherein the first lower electrode and the first upper electrode are electrically connected to each other through a first contact electrode therebetween.

In another aspect, there is provided an electroluminescent display device, including: a first subpixel including: a first emission area, and a first contact area, a second subpixel including: a second emission area, and a second contact area, a third subpixel including: a third emission area, and a third contact area, a first lower electrode and a first upper electrode in the first emission area, a second lower electrode and a second upper electrode in the second emission area, a third lower electrode and a third upper electrode in the third emission area, a first contact electrode in the first contact area, the first contact electrode being electrically connected to: the first lower electrode, and the first upper electrode, a second contact electrode in the second contact area, the second contact electrode being electrically connected to the second upper electrode, and a third contact electrode in the third contact area, the third contact electrode being electrically connected to the third lower electrode, wherein a distance between the second lower electrode and the second upper electrode is less than a distance between the first lower electrode and the first upper electrode, and wherein the distance between the second lower electrode and the second upper electrode is greater than a distance between the third lower electrode and the third upper electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
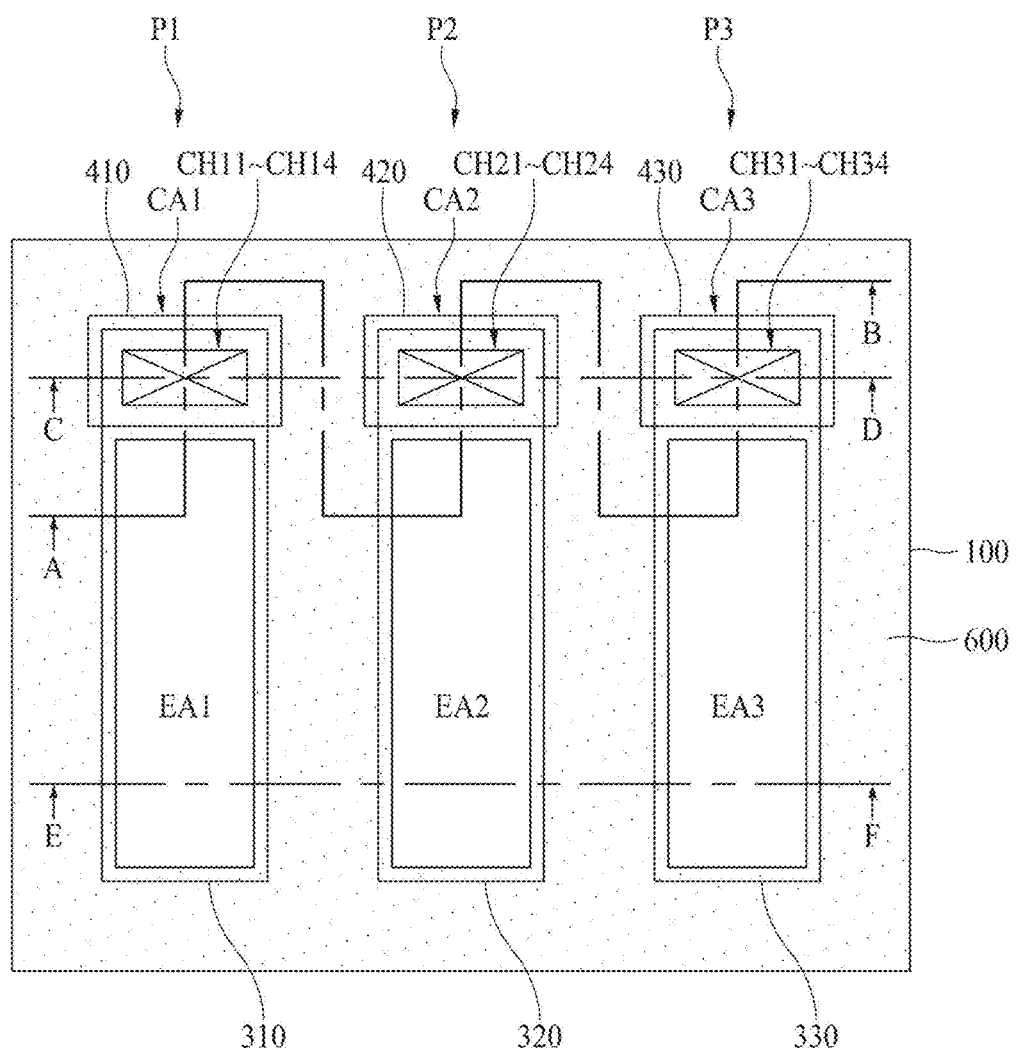
FIG. 1 is a plan view of an electroluminescent display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto. Also, the term "connected" should be understood as including "electrically connected."

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an electroluminescent display device according to an embodiment of the present disclosure will be described in detail with reference to the accompanying drawings.

FIG. 1 is a plan view of an electroluminescent display apparatus according to an embodiment of the present disclosure.

In FIG. 1, only three subpixels are illustrated for convenience, but embodiments may be not limited thereto.

As shown in FIG. 1, the electroluminescent display apparatus according to an embodiment of the present disclosure may include a substrate 100, a plurality of first electrodes 310 to 330, a plurality of contact electrodes 410 to 430, and a bank 600. A plurality of subpixels (for example, first to third subpixels) P1 to P3 may be on the substrate 100.

A plurality of emission areas (for example, first to third emission areas) EA1 to EA3 and a plurality of contact areas (for example, first to third contact areas) CA1 to CA3 may be respectively in the plurality of subpixels P1 to P3. For example, the first emission area EA1 and the first contact area CA1 may be in the first subpixel P1, the second emission area EA2 and the second contact area CA2 may be in the second subpixel P2, and the third emission area EA3 and the third contact area CA3 may be in the third subpixel P3.

The plurality of emission areas EA1 to EA3 may be defined by the bank 600. For example, the plurality of emission areas EA1 to EA3 may be regions that may be exposed, without being covered by the bank 600. The first emission area EA1 may be a red emission area, the second emission area EA2 may be a green emission area, and the third emission area EA3 may be a blue emission area. However, embodiments of the present disclosure are not limited thereto.

The plurality of contact areas CA1 to CA3 may be in a region covered by the bank 600. Therefore, each of the plurality of contact areas CA1 to CA3 may be outside one side of a corresponding emission area of the plurality of emission areas EA1 to EA3. For example, the first contact area CA1 may be outside an upper portion of the first emission area EA1, the second contact area CA2 may be outside an upper portion of the second emission area EA2, and the third contact area CA3 may be outside an upper portion of the third emission area EA3. However, embodiments of the present disclosure are not limited thereto.

A plurality of contact holes CH1 to CH4, CH21 to CH24, and CH31 to CH34 may be respectively in the plurality of contact areas CA1 to CA3. Thus, a step height may occur. Therefore, when at least a portion of each of the plurality of contact areas CA1 to CA3 is exposed without being covered by the bank 600, and overlaps a corresponding emission area of the plurality of emission areas EA1 to EA3, a problem in which lights may be not uniform in the emission areas EA1 to EA3 may occur due to the step height. Therefore, in an embodiment of the present disclosure, the plurality of contact areas CA1 to CA3 may be covered by the bank 600, and thus, may not overlap the plurality of emission areas EA1 to EA3. However, embodiments of the present disclosure are not limited thereto, and there may be a possibility that at least a portion of each of the plurality of contact areas CA1 to CA3 may be not covered by the bank 600. Thus, the plurality of contact areas CA1 to CA3 may overlap a corresponding emission area of the plurality of emission areas EA1 to EA3.

The first electrodes 310 to 330 may be respectively patterned in the subpixels P1 to P3. For example, one first electrode 310 may be in the first subpixel P1, one other first electrode 320 may be in the second subpixel P2, and one other first electrode 330 may be in the third subpixel P3. Each of the first electrodes 310 to 330 may function as an anode of the electroluminescent display apparatus.

The first electrode 310 of the first subpixel P1 may extend from the first emission area EA1 to the first contact area CA1. An exposed portion, which may be exposed without being covered by the bank 600, of the first electrode 310 may be the first emission area EA1. The first electrode 310 of the first subpixel P1 may be connected to the first contact electrode 410 in the first contact area CA1.

The first electrode 320 of the second subpixel P2 may extend from the second emission area EA2 to the second contact area CA2. An exposed portion, which may be exposed without being covered by the bank 600, of the first electrode 320 may be the second emission area EA2. The first electrode 320 of the second subpixel P2 may be connected to the second contact electrode 420 in the second contact area CA2.

The first electrode 330 of the third subpixel P3 may extend from the third emission area EA3 to the third contact area CA3. An exposed portion, which may be exposed without being covered by the bank 600, of the first electrode 330 may be the third emission area EA3. The first electrode 330 of the third subpixel P3 may be connected to the third contact electrode 430 in the third contact area CA3.

The contact electrodes 410 to 430 may be respectively in the contact areas CA1 to CA3. For example, the first contact electrode 410 may be in the first contact area CA1, the second contact electrode 420 may be in the second contact area CA2, and the third contact electrode 430 may be in the third contact area CA3.

The first contact electrode 410 may be connected to the first electrode 310, and may overlap the first electrode 310 of the first subpixel P1 in the first contact area CA1. Although the drawings illustrate a horizontal width of the first contact electrode 410 as being greater than a horizontal width of the first electrode 310, embodiments are not limited thereto. For example, the horizontal width of the first contact electrode 410 may be equal to or less than the horizontal width of the first electrode 310.

The second contact electrode 420 may be connected to the first electrode 320, and may overlap the first electrode 320 of the second subpixel P2 in the second contact area CA2. Although the drawings illustrate a horizontal width of the second contact electrode 420 as being greater than a horizontal width of the first electrode 320, embodiments are not limited thereto. For example, the horizontal width of the second contact electrode 420 may be equal to or less than the horizontal width of the first electrode 320.

The third contact electrode 430 may be connected to the first electrode 330, and may overlap the first electrode 330 of the third subpixel P3 in the third contact area CA3. Although the drawings illustrate a horizontal width of the third contact electrode 430 as being greater than a horizontal width of the first electrode 330, embodiments are not limited thereto. For example, the horizontal width of the third contact electrode 430 may be equal to or less than the horizontal width of the first electrode 330.

Hereinafter, various embodiments of the present disclosure will be described in detail with reference to a cross-sectional structure view.

Figure 2A:
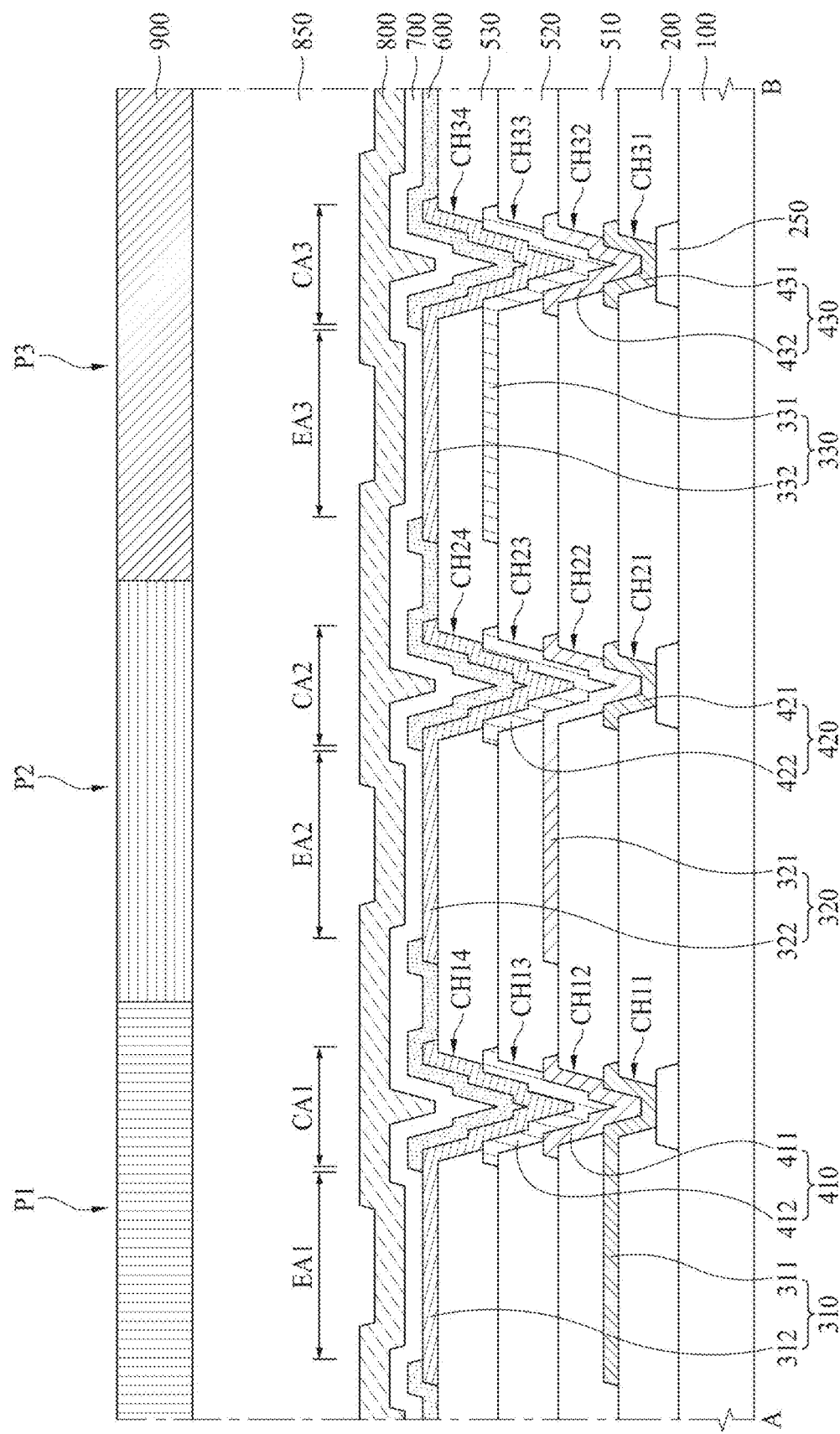
FIGS. 2A to 2C are cross-sectional views of an electroluminescent display apparatus according to an embodiment of the present disclosure.
Figure 2B:
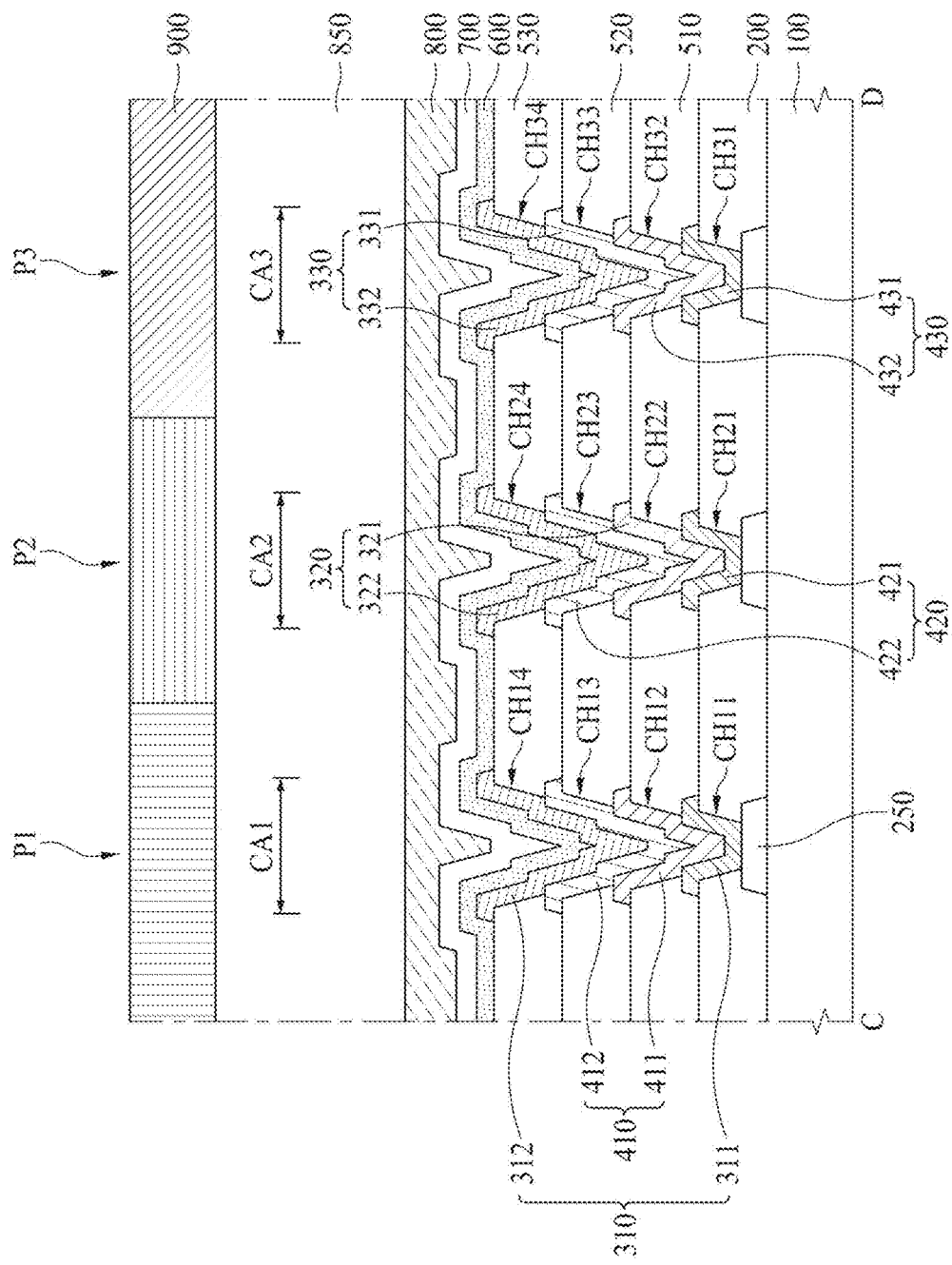
Figure 2C:
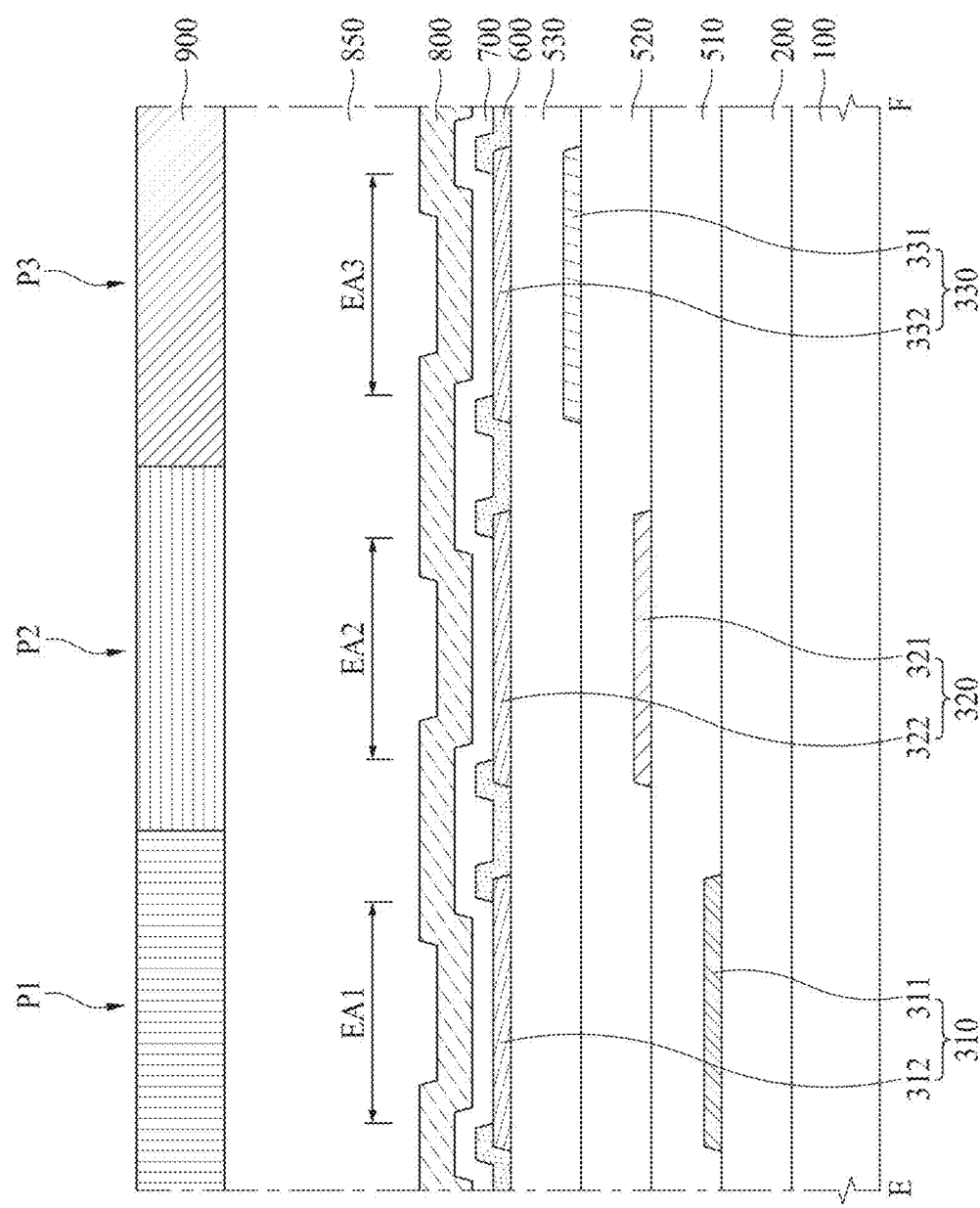

FIGS. 2A to 2C are cross-sectional views of an electroluminescent display apparatus according to an embodiment of the present disclosure.

FIG. 2A corresponds to a cross-sectional view taken along line A-B of FIG. 1. As shown in FIG. 2A, the electroluminescent display apparatus according to an embodiment of the present disclosure may include a substrate 100, a circuit device layer 200, a plurality of first electrodes 310 to 330, a plurality of contact electrodes 410 to 430, a plurality of insulation layers 510 to 530, a bank 600, a light-emitting layer 700, a second electrode 800, an encapsulation layer 850, and a color filter layer 900.

The substrate 100 may include glass or plastic, but is not limited thereto. For example, the substrate 100 may include a semiconductor material, such as a silicon wafer. The substrate 100 may include a transparent material or an opaque material. A first subpixel P1, a second subpixel P2, and a third subpixel P3 may be in the substrate 100. The first subpixel P1 may emit red light, the second subpixel P2 may emit green light, and the third subpixel P3 may emit blue light. However, embodiments of the present disclosure are not limited thereto. For example, an arrangement order of the subpixels P1 to P3 may be variously modified.

The electroluminescent display apparatus according to an embodiment of the present disclosure may be implemented as a top-emission type in which light may be emitted toward an upper portion. Accordingly, a material of the substrate 100 may use an opaque material, as well as a transparent material.

The circuit device layer 200 may be on the substrate 100. A circuit device, including various signal lines, a thin-film transistor (TFT), a capacitor, and the like, may be in the circuit device layer 200 in each of the subpixels P1 to P3. The signal lines may include a gate line, a data line, a power line, and a reference line. The TFT may include a switching TFT, a driving TFT 250, and a sensing TFT.

The switching TFT may be turned on according to a gate signal supplied through the gate line, and may transfer a data voltage, supplied through the data line, to the driving TFT. The driving TFT 250 may be turned on with the data voltage supplied through the switching TFT, and may generate a data current from power supplied through the power line to supply the data current to the first electrodes 310 to 330.

The sensing TFT may sense a threshold voltage deviation of the driving TFT, which may cause degradation in image quality, and may supply a current of the driving TFT to the reference line in response to a sensing control signal supplied through the gate line or a separate sensing line. The capacitor may hold the data voltage supplied to the driving TFT 250 during one frame, and may be connected to a gate terminal and a source terminal of the driving TFT 250.

A plurality of first contact holes CH11, CH21, and CH31 may be in the circuit device layer 200 in each of the subpixels P1 to P3. Thus, the source terminal or a drain terminal of the driving TFT 250 may be exposed through the first contact holes CH11, CH21, and CH31.

The first electrodes 310 to 330 and the contact electrodes (for example, first to third contact electrodes) 410 to 430 may be patterned on the circuit device layer 200 in the respective subpixels P1 to P3. One first electrode 310 and first contact electrode 410 may be in the first subpixel P1. One other first electrode 320 and second contact electrode 420 may be in the second subpixel P2. One other first electrode 330 and third contact electrode 430 may be in the third subpixel P3.

The first electrodes 310 to 330 may be connected (e.g., electrically connected) to the driving TFT 250 in the circuit device layer 200. For example, the first electrodes 310 to 330 may be connected to the source terminal or the drain terminal of the driving TFT 250.

The first electrode 310 in the first subpixel P1 may include a first lower electrode 311 and a first upper electrode 312. The first lower electrode 311 and the first upper electrode 312 may extend from the first emission area EA1 to the first contact area CA1.

The first lower electrode 311 may be connected to the driving TFT 250 through a first contact hole CH11 of the circuit device layer 200 in the first subpixel P1 area. Depending on the case, the first lower electrode 311 may be connected to the driving TFT 250 through a conductive material filled into the first contact hole CH11, and this may be similarly applied to any of the following embodiments.

The first upper electrode 312 may be connected to a first upper contact electrode 412 configuring the first contact electrode 410 through a fourth contact hole CH14 of a third insulation layer 530 in the first subpixel P1 area.

The first contact electrode 410 in the first subpixel P1 may include a first lower contact electrode 411 and a first upper contact electrode 412. The first lower contact electrode 411 may be connected to the first lower electrode 311 through a second contact hole CH12 of the first insulation layer 510 in the first subpixel P1 area, and the first upper contact electrode 412 may be connected to the first lower contact electrode 411 through a third contact hole CH13 of the second insulation layer 520 in the first subpixel P1 area.

In the first subpixel P1, the first lower electrode 311 may be directly connected to the driving TFT 250 in the circuit device layer 200, and the first upper electrode 312 may be connected to the first lower electrode 311 through the first lower contact electrode 411 and the first upper contact electrode 412. Therefore, the first to third insulation layers 510 to 530 may be between the first lower electrode 311 and the first upper electrode 312 in the first emission area EA1 of the first subpixel P1.

The first electrode 320 in the second subpixel P2 may include a second lower electrode 321 and a second upper electrode 322. The second lower electrode 321 and the second upper electrode 322 may extend from the second emission area EA2 to the second contact area CA2.

The second lower electrode 321 may be connected to the second lower contact electrode 421, configuring the second contact electrode 420, through a second contact hole CH22 of the first insulation layer 510 in the second subpixel P2 area. The second upper electrode 322 may be connected to the second upper contact electrode 422, configuring the second contact electrode 420, through a fourth contact hole CH24 of the third insulation layer 530 in the second subpixel P2 area.

The second contact electrode 420 in the second subpixel P2 may include a second lower contact electrode 421 and a second upper contact electrode 422. The second lower contact electrode 421 may be connected to the driving TFT 250 through a first contact hole CH21 of the circuit device layer 200 in the second subpixel P2 area, and the second upper contact electrode 422 may be connected to the second lower electrode 321 through a third contact hole CH23 of the second insulation layer 520 in the second subpixel P2 area. Depending on the case, the second lower contact electrode 421 may be connected to the driving TFT 250 through a conductive material filled into the first contact hole CH21, and this may be similarly applied to any of the following embodiments.

In the second subpixel P2, the second lower electrode 321 may be directly connected to the driving TFT 250 in the circuit device layer 200 through the second lower contact electrode 421, and the second upper electrode 322 may be connected to the second lower electrode 321 through the second upper contact electrode 422. Therefore, the second and third insulation layers 520 and 530 may be between the second lower electrode 321 and the second upper electrode 322 in the second emission area EA2 of the second subpixel P2.

The first electrode 330 in the third subpixel P3 may include a third lower electrode 331 and a third upper electrode 332. The third lower electrode 331 and the third upper electrode 332 may extend from the third emission area EA3 to the third contact area CA3.

The third lower electrode 331 may be connected to the third upper contact electrode 432 configuring the third contact electrode 430 through a third contact hole CH33 of the second insulation layer 520 in the third subpixel P3 area. The third upper electrode 332 may be connected to the third lower electrode 331 through a fourth contact hole CH34 of the third insulation layer 530 in the third subpixel P3 area.

The third contact electrode 430 in the third subpixel P3 may include a third lower contact electrode 431 and a third upper contact electrode 432. The third lower contact electrode 431 may be connected to the driving TFT 250 through a first contact hole CH31 of the circuit device layer 200 in the third subpixel P3 area, and the third upper contact electrode 432 may be connected to the third lower contact electrode 431 through a second contact hole CH32 of the first insulation layer 510 in the third subpixel P3 area.

In the third subpixel P3, the third lower electrode 331 may be connected to the driving TFT 250 in the circuit device layer 200 through the third lower contact electrode 431 and the third upper contact electrode 432, and the third upper electrode 332 may be directly connected to the second lower electrode 321. Therefore, the third insulation layer 530 may be between the second lower electrode 321 and the second upper electrode 322 in the third emission area EA3 of the third subpixel P3. Depending on the case, the third lower contact electrode 431 may be connected to the driving TFT 250 through a conductive material filled into the first contact hole CH31, and this may be similarly applied to all of the following embodiments.

As described above, according to an embodiment of the present disclosure, a distance between the first lower electrode 311 and the first upper electrode 312 in the first subpixel P1, a distance between the second lower electrode 321 and the second upper electrode 322 in the second subpixel P2, and a distance between the third lower electrode 331 and the third upper electrode 332 in the third subpixel P3 may be differently set. Thus, a micro-cavity characteristic may be obtained. This will be described below in detail.

The first insulation layer 510 may be on the circuit device layer 200. For example, the first insulation layer 510 may be under the first lower contact electrode 411, the second lower electrode 321, and the third upper contact electrode 432. The second contact holes CH12, CH22, and CH32 may be in the first insulation layer 510 in the respective subpixels P1 to P3. The first insulation layer 510 may be provided all over the plurality of subpixels P1 to P3 area, except on the second contact holes CH12, CH22, and CH32. Thus, the first insulation layer 510 in the first subpixel P1, the second insulation layer 510 in the second subpixel P2, and the first insulation layer 510 in the third subpixel P3 may be connected to one another.

The second insulation layer 520 may be on the first insulation layer 510. For example, the second insulation layer 520 may be under the first upper contact electrode 412, the second upper electrode 422, and the third lower electrode 331. The third contact holes CH13, CH23, and CH33 may be in the second insulation layer 520 in the respective subpixels P1 to P3. The second insulation layer 520 may be provided all over the plurality of subpixels P1 to P3 area, except for the third contact holes CH13, CH23, and CH33. Thus, the second insulation layer 520 in the first subpixel P1, the second insulation layer 520 in the second subpixel P2, and the second insulation layer 520 in the third subpixel P3 may be connected to one another.

The third insulation layer 530 may be on the second insulation layer 520. For example, the third insulation layer 530 may be under the first upper electrode 312, the second upper electrode 322, and the third upper electrode 332. The fourth contact holes CH14, CH24, and CH34 may be in the third insulation layer 530 in the respective subpixels P1 to P3.

The third insulation layer 530 may be provided all over the plurality of subpixels P1 to P3 area, except for the fourth contact holes CH14, CH24, and CH34. Thus, the third insulation layer 530 in the first subpixel P1, the third insulation layer 530 in the second subpixel P2, and the third insulation layer 530 in the third subpixel P3 may be connected to one another.

The electroluminescent display apparatus according to an embodiment of the present disclosure may be implemented as the top-emission type. Thus, the first electrodes 310 to 330 may reflect light, emitted from the light-emitting layer 700, to an upper portion. For example, each of the first to third lower electrodes 311, 321, and 331, respectively disposed under the first electrodes 310 to 330 having a two-layer structure, may be a reflective electrode; and each of the first to third upper electrodes 312, 322, and 332, respectively disposed on the first electrodes 310 to 330, may be a transparent electrode or a semitransparent electrode. For example, the first to third upper electrodes 312, 322, and 332 may function as respective anodes of the first to third subpixels P1 to P3.

Herein, a reflective electrode may be an electrode that reflects incident light, a transparent electrode may be an electrode that transmits incident light, and a semitransparent electrode may be an electrode that transmits a portion of light and reflects the other light. The reflective electrode, the semitransparent electrode, and the transparent electrode may be sequentially good in transparency; and the transparent electrode, the semitransparent electrode, and the reflective electrode may be sequentially good in reflectivity.

For example, the second lower contact electrode 421 of the second subpixel P2 and the third lower contact electrode 431 of the third subpixel P3, each disposed on the same layer as the first lower electrode 311 of the first subpixel P1, may include the same material as that of the first lower electrode 311 and patterned through the same process. The third lower contact electrode 411 of the first subpixel P1 and the third upper contact electrode 432 of the third subpixel P3, each disposed on the same layer as the second lower electrode 321 of the second subpixel P2, may include the same material as that of the second lower electrode 321, and may be patterned through the same process.

The first upper contact electrode 412 of the first subpixel P1 and the second upper contact electrode 422 of the second subpixel P2, each disposed on the same layer as the third lower electrode 331 of the third subpixel P3, may include the same material as that of the third lower electrode 331, and may be patterned through the same process. The first upper electrode 312 of the first subpixel P1, the second upper electrode 322 of the second subpixel P2, and the third upper electrode 332 of the third subpixel P3, each disposed on the same layer, may include the same material, and may be patterned through the same process.

When each of the first to third lower electrodes 311, 321, and 331 is a reflective electrode, and each of the first to third upper electrodes 312, 322, and 332 is a transparent electrode, a portion of the light emitted from the light-emitting layer 700 may be reflected by the first to third lower electrodes 311, 321, and 331, may pass through the first to third upper electrodes 312, 322, and 332, and may be discharged in an upward direction.

When each of the first to third lower electrodes 311, 321, and 331 is a reflective electrode, and each of the first to third upper electrodes 312, 322, and 332 is a semitransparent electrode, a portion of the light emitted from the light-emitting layer 700 may be reflected by the first to third lower electrodes 311, 321, and 331, and may be discharged in an upward direction; and the other portion of the light emitted from the light-emitting layer 700 may pass through the first to third upper electrodes 312, 322, and 332, may travel in a downward direction, and may be reflected by the first to third lower electrodes 311, 321, and 331. As such, a portion of light reflected by each of the first to third lower electrodes 311, 321, and 331 may pass through the first to third upper electrodes 312, 322, and 332, and may be discharged in the upward direction; and the other portion of the light reflected by each of the first to third lower electrodes 311, 321, and 331 may be reflected by the first to third upper electrodes 312, 322, and 332, may travel in the downward direction, and may be re-reflected by the first to third lower electrodes 311, 321, and 331. Such a reflection process may be repeated. As described above, reflection and re-reflection of light may be repeated between the first to third lower electrodes 311, 321, and 331 and the first to third upper electrodes 312, 322, and 332. Thus, light may be amplified, thereby enhancing light efficiency.

For example, when each of distances between the first to third lower electrodes 311, 321, and 331 and the first to third upper electrodes 312, 322, and 332 is an integer multiple of a half wavelength ($\lambda/2$) of light discharged from each of the subpixels P1 to P3, constructive inference may occur. Thus, light may be further amplified. When the above-described reflection and re-reflection process may be repeated, a degree to which light may be amplified may continuously increase. Thus, an external extraction efficiency of light may be enhanced. Such a characteristic may be referred to as a "micro-cavity" characteristic.

Therefore, according to an embodiment of the present disclosure, using the first contact electrode 410, the second contact electrode 420, and the third contact electrode 430, a first distance between the first lower electrode 311 and the first upper electrode 312 in the first subpixel P1, a second distance between the second lower electrode 321 and the second upper electrode 322 in the second subpixel P2, and a third distance between the third lower electrode 331 and the third upper electrode 332 in the third subpixel P3 may be differently se. Thus, a micro-cavity characteristic may be obtained in each of the subpixels P1 to P3.

For example, the first distance may be longest in the first subpixel P1, which may discharge red light of a long wavelength range, and the third distance may be shorter in the third subpixel P3, which may discharge blue light of a short wavelength range. However, embodiments of the present disclosure are not limited thereto.

Moreover, according to an embodiment of the present disclosure, distances between the first to third upper electrodes 312, 322, and 332 and the second electrode 800 may be the same in the respective subpixels P1 to P3, and the first to third upper electrodes 312, 322, and 332 may be provided at the same height on the third insulation layer 530. Therefore, a lower surface of the light-emitting layer 700 on the first to third upper electrodes 312, 322, and 332 may have a wholly uniform height. Thus, a profile of the light-emitting layer 700 may be improved more than in a case in which the first to third upper electrodes 312, 322, and 332 are provided at different heights. Hereinafter, in various embodiments, the distances between the first to third upper electrodes 312, 322, and 332 and the second electrode 800 may be the same in the respective subpixels P1 to P3, and the first to third upper electrodes 312, 322, and 332 may be provided at the same height on the third insulation layer 530. However, embodiments of the present disclosure are not limited thereto.

The bank 600 may cover ends of the first to third upper electrodes 312, 322, and 332 of the first electrodes 310 to 330 on the third insulation layer 530. Thus, a current may concentrate on the ends of the first to third upper electrodes 312, 322, and 332, thereby solving a problem in which emission efficiency may be reduced.

The bank 600 may be in a matrix structure in a boundary between the plurality of subpixels P1 to P3, and may define the emission areas EA1 to EA3 in the respective subpixels P1 to P3. For example, exposed regions, which may be exposed without the bank 600 being provided therein, of the first to third upper electrodes 312, 322, and 332 may be the emission areas EA1 to EA3 in the respective subpixels P1 to P3.

For example, the bank 600 may overlap the contact areas CA1 to CA3 in which the contact electrodes 410 to 430 may be respectively provided. Thus, the contact areas CA1 to CA3, which may be stepped, may not overlap the emission areas EA1 to EA3. The bank 600 may include an inorganic insulation layer having a relatively thin thickness, or may include an organic insulation layer having a relatively thick thickness.

The light-emitting layer 700 may be on the first to third upper electrodes 312, 322, and 332 of the first electrodes 310 to 330. The light-emitting layer 700 may be on the bank 600. For example, the light-emitting layer 700 may be in the subpixels P1 to P3 and in a boundary region between the subpixels P1 to P3.

The light-emitting layer 700 may emit white (W) light. For example, the light-emitting layer 700 may include a plurality of stacks that may emit light of different colors. For example, the light-emitting layer 700 may include a first stack for emitting blue light, a second stack for emitting yellowish-green light, and a charge generating layer (CGL) between the first stack and the second stack. As another example, the light-emitting layer 700 may include a first stack for emitting blue light, a second stack for emitting green light, a third stack for emitting red light, a first charge generating layer between the first stack and the second stack, and a second charge generating layer between the second stack and the third stack. Each of the stacks may include a hole transporting layer, an organic light-emitting layer, and an electron transporting layer, which may be sequentially stacked. A configuration of the light-emitting layer 700 may be changed to various configurations as understood by those skilled in the art.

The second electrode 800 may be on the light-emitting layer 700. The second electrode 800 may function as a cathode of the electroluminescent display apparatus. The second electrode 800, similarly to the light-emitting layer 700, may be in the subpixels P1 to P2 and the boundary region between the subpixels P1 to P3. For example, the second electrode 800 may be on the bank 600. When the electroluminescent display apparatus according to an embodiment of the present disclosure is implemented as the top-emission type, the second electrode 800 may include a transparent conductive material for transmitting light, emitted from the light-emitting layer 700, to an upper portion.

The second electrode 800 may include a semitransparent electrode. Thus, a micro-cavity effect may be obtained in each of the subpixels P1 to P3. When the second electrode 800 includes the semitransparent electrode, reflection and re-reflection of light may be repeated between the second electrode 800 and the first to third lower electrodes 311, 321, and 331 of the first to third electrodes 310, 320, and 330. Thus, the micro-cavity effect may be obtained. Also, reflection and re-reflection of light may be repeated between the second electrode 800 and the first to third upper electrodes 312, 322, and 332 of the first to third electrodes 310, 320, and 330. Thus, the micro-cavity effect may be obtained.

The encapsulation layer 850 may be on the second electrode 800 and may reduce or prevent external water from penetrating into the light-emitting layer 700. The encapsulation layer 850 may include an inorganic insulating material, or may be formed in a structure in which an inorganic insulating material and an organic insulating material are alternately stacked, but is not limited thereto.

The color filter layer 900 may be on the encapsulation layer 850. The color filter layer 900 may face the emission areas EA1 to EA3 of the respective subpixels P1 to P3. The color filter layer 900 may include a red color filter in the first subpixel P1, a green color filter in the second subpixel P2, and a blue color filter in the third subpixel P3, but is not limited thereto. Although not shown, a black matrix may be further provided in a boundary between adjacent color filters of the color filter layer 900, and may reduce or prevent light from being leaked to a region other than the emission areas EA1 to EA3.

FIG. 2B is a cross-sectional view taken along line C-D of FIG. 1. FIG. 2B is a cross-sectional view illustrating a plurality of contact areas CA1 to CA3.

As seen in the example of FIG. 2B, a circuit device layer 200, including a driving TFT 250, may be on a substrate 100. A plurality of first contact holes CH11, CH21, and CH31 may be in the circuit device layer 200 and in respective subpixels P1 to P3. Thus, a source terminal or a drain terminal of the driving TFT 250 may be exposed through the first contact holes CH11, CH21, and CH31.

A first lower electrode 311 may be in a first subpixel P1 on the circuit device layer 200, a second lower contact electrode 421 may be in a second subpixel P2 on the circuit device layer 200, and a third lower contact electrode 431 may be in a third subpixel P3 on the circuit device layer 200. The first lower electrode 311, the second lower contact electrode 421, and the third lower contact electrode 431 may be connected to the source terminal or the drain terminal of the driving TFT 250 through the first contact holes CH11, CH21, and CH31.

A first insulation layer 510 may be on the first lower electrode 311, the second lower contact electrode 421, and the third lower contact electrode 431. A plurality of second contact holes CH12, CH22, and CH32 may be in the first insulation layer 510. The first lower contact electrode 411 may be in the first subpixel P1 on the first insulation layer 510, the second lower electrode 321 may be in the second subpixel P2 on the first insulation layer 510, and a third upper contact electrode 432 may be in the third subpixel P3 on the first insulation layer 510. The first lower contact electrode 411 may be connected to the first lower electrode 311 through the second contact hole CH12, the second lower electrode 321 may be connected to the second lower contact electrode 421 through the second contact hole CH22, and the third upper contact electrode 432 may be connected to the third lower contact electrode 431 through the second contact hole CH32.

A second insulation layer 520 may be on the first lower contact electrode 411, the second lower electrode 321, and the third upper contact electrode 432. A plurality of third contact holes CH13, CH23, and CH33 may be in the second insulation layer 520.

A first upper contact electrode 412 may be in the first subpixel P1 on the second insulation layer 520, a second upper contact electrode 422 may be in the second subpixel P2 on the second insulation layer 520, and a third lower electrode 331 may be in the third subpixel P3 on the second insulation layer 520. The first upper contact electrode 412 may be connected to the first lower contact electrode 411 through the third contact hole CH13, the second upper contact electrode 422 may be connected to the second lower electrode 321 through the third contact hole CH23, and the third lower electrode 331 may be connected to the third upper contact electrode 432 through the third contact hole CH33.

A third insulation layer 530 may be on the first upper contact electrode 412, the second upper electrode 422, and the third lower contact electrode 331. A plurality of fourth contact holes CH14, CH24, and CH34 may be in the third insulation layer 530.

A first upper electrode 312 may be in the first subpixel P1 on the third insulation layer 530, a second upper electrode 322 may be in the second subpixel P2 on the third insulation layer 530, and a third upper electrode 332 may be in the third subpixel P3 on the third insulation layer 530. The first upper electrode 312 may be connected to the first upper contact electrode 412 through the fourth contact hole CH14, the second upper electrode 322 may be connected to the second upper contact electrode 422 through the fourth contact hole CH24, and the third upper electrode 332 may be connected to the third lower electrode 331 through the fourth contact hole CH34.

A bank 600 may be on each of the first upper electrode 312, the second upper electrode 322, and the third upper electrode 332, and may cover both ends of each of the first upper electrode 312, the second upper electrode 322, and the third upper electrode 332. A light-emitting layer 700 may be on the bank 600, a second electrode 800 may be on the light-emitting layer 700, an encapsulation layer 850 may be on the second electrode 800, and a color filter layer 900 may be on the encapsulation layer 850.

FIG. 2C is a cross-sectional view taken along line E-F of FIG. 1. FIG. 2C is a cross-sectional view illustrating a plurality of emission areas EA1 to EA3.

As seen in the FIG. 2C example, a circuit device layer 200 may be on a substrate 100, and a first lower electrode 311 may be in a first subpixel P1 on the circuit device layer 200. A first insulation layer 510 may be on the first lower electrode 311, and a second lower electrode 321 may be in a first subpixel P2 on the first insulation layer 510. A second insulation layer 520 may be on the second lower electrode 321, and a third lower electrode 331 may be in a third subpixel P3 on the second insulation layer 520. A third insulation layer 530 may be on the third lower electrode 331, a first upper electrode 312 may be in the first subpixel P1 on the third insulation layer 530, a second upper electrode 322 may be in the second subpixel P2 on the third insulation layer 530, and a third upper electrode 332 may be in the third subpixel P3 on the third insulation layer 530.

A bank 600 may be on each of the first upper electrode 312, the second upper electrode 322, and the third upper electrode 332, and may cover both ends of each of the first upper electrode 312, the second upper electrode 322, and the third upper electrode 332. A light-emitting layer 700 may be on the bank 600, a second electrode 800 may be on the light-emitting layer 700, an encapsulation layer 850 may be on the second electrode 800, and a color filter layer 900 may be on the encapsulation layer 850.

Figure 3A:
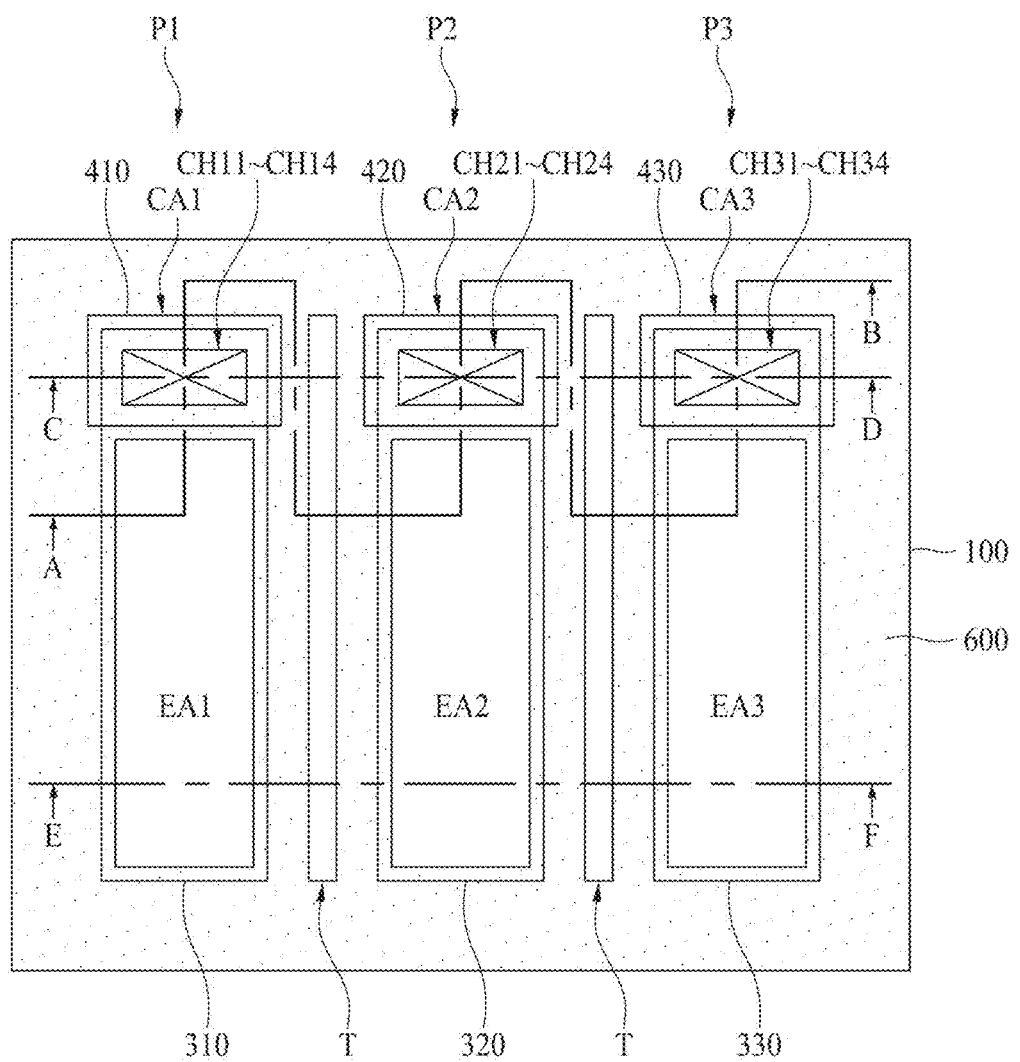
FIG. 3A is a plan view of an electroluminescent display apparatus according to an embodiment of the present disclosure.

FIG. 3A is a plan view of an electroluminescent display apparatus according to an embodiment of the present disclosure.

The example of FIG. 3A differs from the above-described electroluminescent display apparatus of the FIG. 1 example in that a trench T is further provided in a boundary between a plurality of subpixels P1 to P3. Therefore, like reference numerals refer to like elements, and only different elements will be described below.

As shown in FIG. 3A, a trench T may be in a boundary region between a plurality of subpixels P1 to P3. According to an embodiment of the present disclosure, when the trench T is provided, a long current path may be formed between the subpixels P1 to P3 adjacent to one another. Thus, a leakage current occurring between the subpixels P1 to P3 adjacent to one another may be reduced. This will be described in more detail with reference to a cross-sectional structure.

Figure 3B:
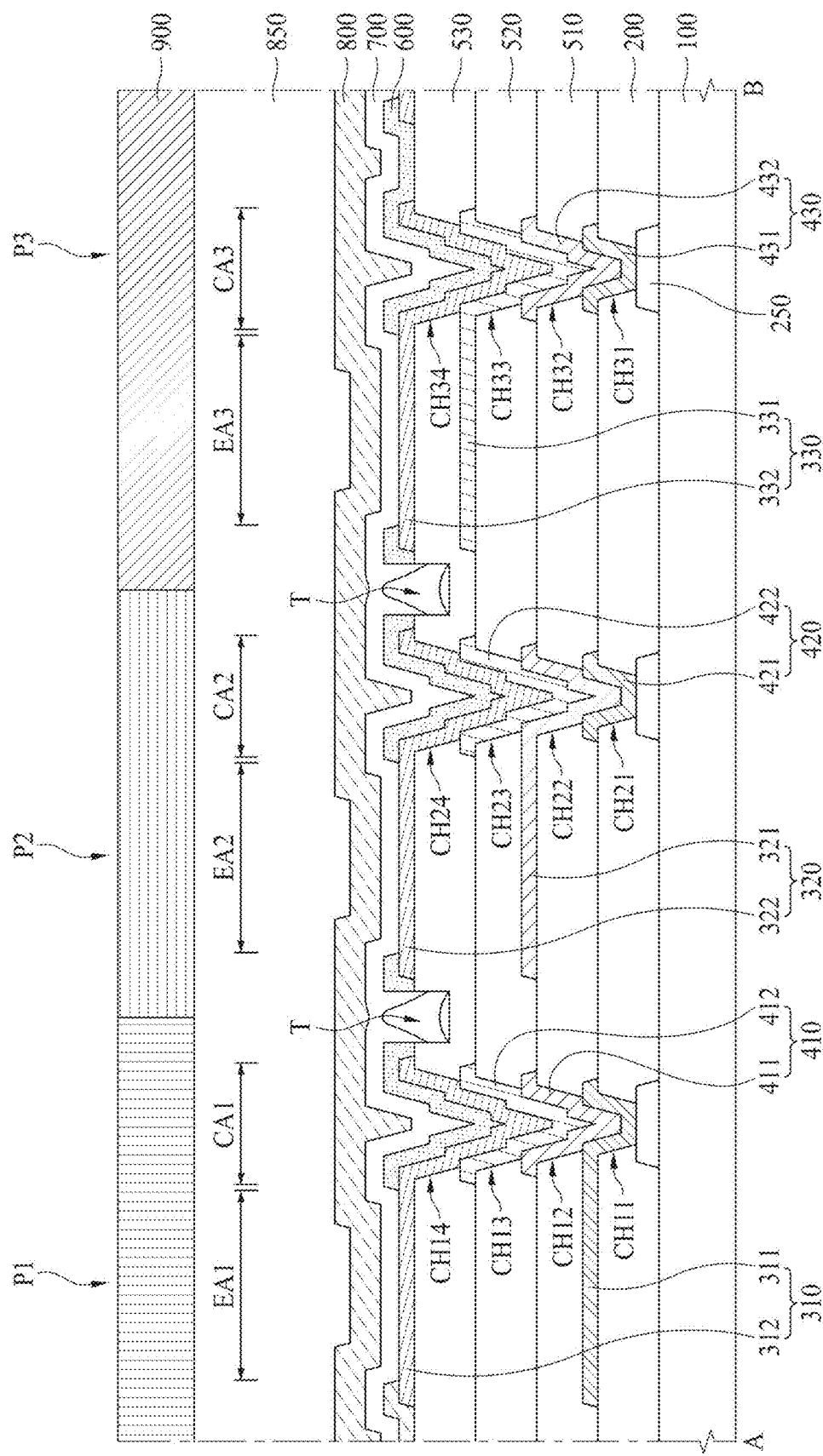
FIG. 3B is a cross-sectional view taken along line A-B of FIG. 3A.
Figure 3C:
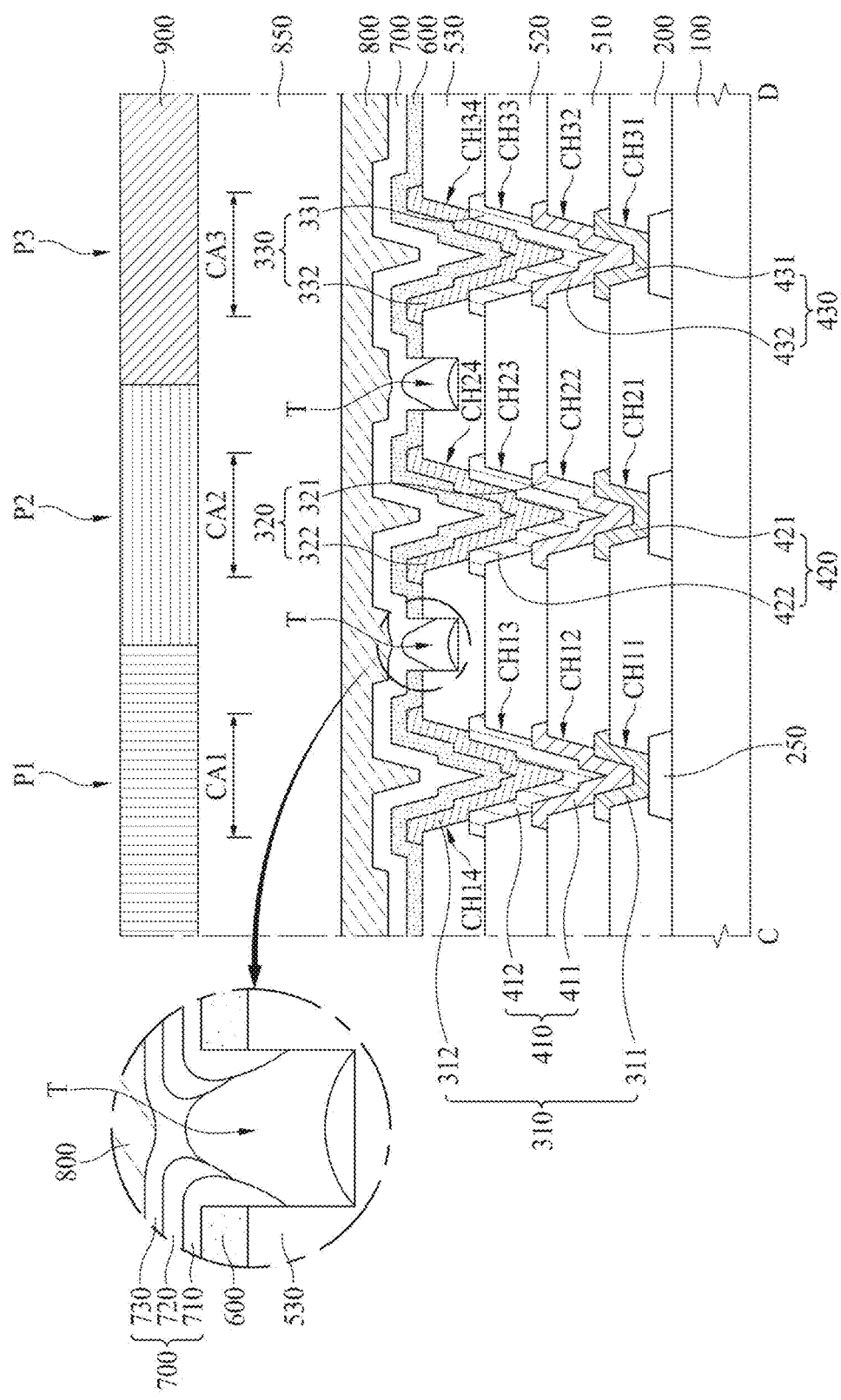
FIG. 3C is a cross-sectional view taken along line C-D of FIG. 3A.
Figure 3D:
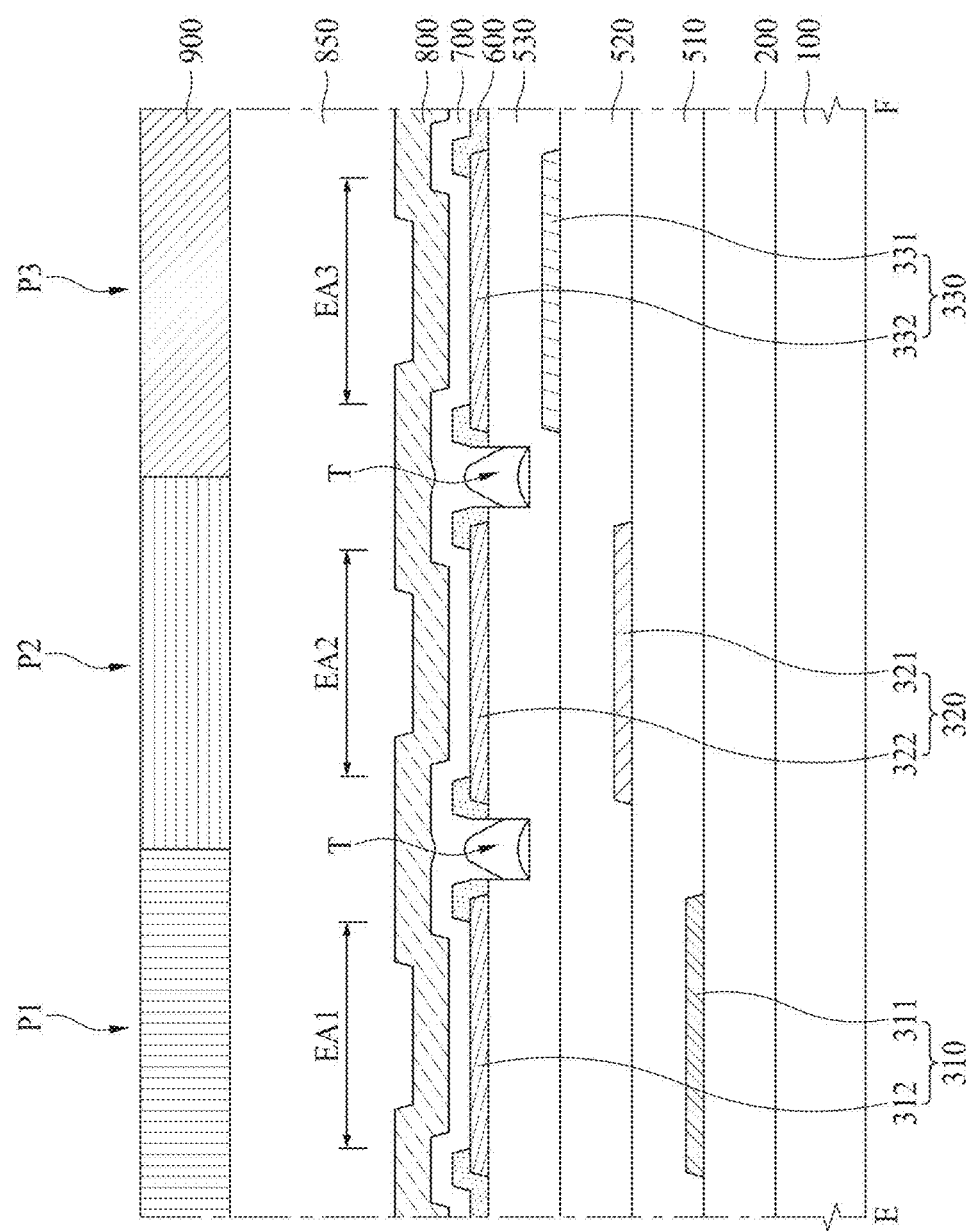
FIG. 3D is a cross-sectional view taken along line E-F of FIG. 3A.

FIG. 3B is a cross-sectional view taken along line A-B of FIG. 3A. FIG. 3C is a cross-sectional view taken along line C-D of FIG. 3A. FIG. 3D is a cross-sectional view taken along line E-F of FIG. 3A.

The example of FIG. 3B differs from the example of FIG. 2A in that a trench T is further provided in a bank 600 and a third insulation layer 530 thereunder. The example of FIG. 3C differs from the example of FIG. 2B in that a trench T is further provided in a bank 600 and a third insulation layer 530 thereunder. The example of FIG. 3D differs from the example of FIG. 2C in that a trench T is further provided in a bank 600 and a third insulation layer 530 thereunder. Therefore, like reference numerals refer to like elements, and only different elements will be described below.

As shown in FIGS. 3B to 3D, a trench T may be in a bank 600 and in a third insulation layer 530 in a boundary region between subpixels P1 to P3. As described above, according to an embodiment of the present disclosure, when the trench T is in the bank 600 and the third insulation layer 530, a light-emitting layer 700 may be in the trench T. Therefore, a long current path may be formed between the subpixels P1 to P3 adjacent to one another. Thus, a leakage current occurring between the subpixels P1 to P3 adjacent to one another may be reduced. For example, when an interval between the subpixels P1 to P3 is densely set for implementing a high resolution, there may be a possibility that, when light is emitted from the light-emitting layer 700 in one of the subpixels P1 to P3, an electric charge of the light-emitting layer 700 of the one subpixel may move to the light-emitting layer 700 of another subpixel adjacent thereto, which may cause a leakage current.

Therefore, in an embodiment of the present disclosure, when the trench T is in a boundary between the subpixels P1 to P3, and the light-emitting layer is in the trench T, a long current path between adjacent subpixels may be formed. Thus, a resistance may increase, thereby reducing the occurrence of a leakage current.

The trench T may be only in the bank 600. Alternatively, the trench T may extend to the bank 600 and the third insulation layer 530. Furthermore, the trench T may extend to an inner portion of a second insulation layer 520 thereunder, an inner portion of a first insulation layer 510 thereunder, or an inner portion of a circuit device layer 200 thereunder.

For example, with reference to the enlarged view of FIG. 3B, the light-emitting layer 700 may include a first stack 710 for emitting light of a first color, a second stack 730 for emitting light of a second color, and a charge generating layer 720 between the first stack 710 and the second stack 730. The first stack 710 may be on an inner surface of the trench T, or may be on a lower surface of the trench T. For example, a portion of the first stack 710 on the inner side surface of the trench T may be noncontiguous with (e.g., disconnected from or not directly contacting) a portion of the first stack 710 on the inner lower surface of the trench T. Therefore, a portion of the first stack 710 on one side surface (for example, a left surface) of an inner portion of the trench T may be noncontiguous with (e.g., disconnected from) a portion of the first stack 710 on the other side surface (for example, a right surface) of the inner portion of the trench T. Therefore, an electric charge may not move through the first stack 710 and between the subpixels P1 to P3 disposed adjacent to one another with the trench T therebetween. It should be appreciated that the terms "left" and "right" are used herein for convenience of explanation, and are interchangeable, as would be understood by one of ordinary skill in the art.

The charge generating layer 720 may be on the first stack 710 in the inner surface of the trench T. For example, a portion of the charge generating layer 720 on one side surface (for example, the left surface) of the inner portion of the trench T may be noncontiguous with (e.g., disconnected from) a portion of the charge generating layer 720 on the other side surface (for example, the right surface) of the inner portion of the trench T. Therefore, an electric charge may not move through the charge generating layer 720 and between the subpixels P1 to P3 disposed adjacent to one another with the trench T therebetween.

All portions of the second stack 720 may be contiguous with (e.g., connected to or directly contacting) one another between the subpixels P1 to P3, disposed adjacent to one another with the trench T therebetween, on the charge generating layer 720. Therefore, an electric charge may move through the second stack 720 and between the subpixels P1 to P3 disposed adjacent to one another with the trench T therebetween. However, embodiments of the present disclosure are not limited thereto. For example, by appropriately selecting a shape of the trench T and a deposition process performed on the light-emitting layer 700, portions of the second stack 720 may be noncontiguous with (e.g., disconnected from) each other between the subpixels P1 to P3 disposed adjacent to one another with the trench T therebetween. For example, only a portion of a lower portion of the second stack 730 adjacent to the charge generating layer 720 may be noncontiguous with (e.g., disconnected from) the other portion between the subpixels P1 to P3.

The charge generating layer 720 may have a conductivity greater than that of each of the first stack 710 and the second stack 730. For example, an N-type charge generating layer, configuring the charge generating layer 720, may include a metal material, and thus, may have a conductivity greater than that of each of the first stack 710 and the second stack 730. Accordingly, movement of electric charges between the subpixels P1 to P3, disposed adjacent to one another, may be performed through the charge generating layer 720, and the amount of electric charges moving through the second stack 730 may be very small.

In an embodiment of the present disclosure, when the light-emitting layer 700 is in the trench T, a portion of the light-emitting layer 700 may be noncontiguous with (e.g., disconnected from) the other portion in the trench T. Thus, the first stack 710 may be noncontiguous with (e.g., disconnected from) the charge generating layer 720, thereby reducing or preventing a leakage current from occurring between the subpixels P1 to P3 adjacent to one another. A configuration of the trench T illustrated in FIGS. 3A to 3D may be applied to various embodiments described below.

Figure 4:
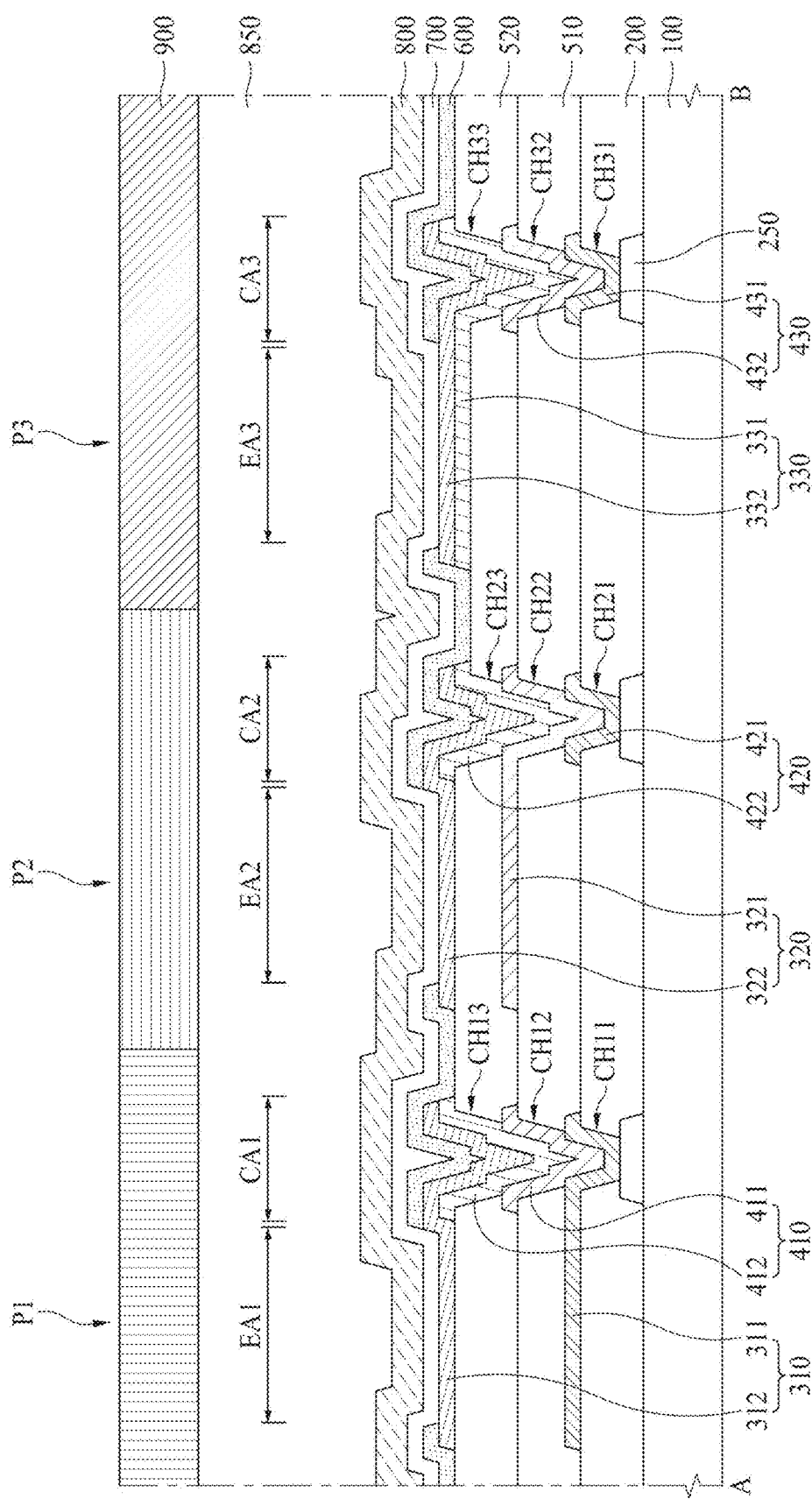
FIG. 4 is a cross-sectional view of an electroluminescent display apparatus according to an embodiment of the present disclosure.

FIG. 4 is a cross-sectional view of an electroluminescent display apparatus according to an embodiment of the present disclosure.

FIG. 4 is a cross-sectional view taken along line A-B of FIG. 1. The electroluminescent display apparatus of the FIG. 4 example differs from the electroluminescent display apparatus of the FIG. 2A example in that the third insulation layer 530 is not provided. Therefore, like reference numerals refer to like elements, and only different elements will be described below.

As shown in FIG. 4, according to an embodiment of the present disclosure, a first upper electrode 312 of a first electrode 310 may be provided directly on an upper surface of a first upper contact electrode 412 of a first contact electrode 410 in a first subpixel P1, without a separate insulation layer. A second upper electrode 322 of a first electrode 320 may be provided directly on an upper surface of a second upper contact electrode 422 of a second contact electrode 420 in a second subpixel P2, without a separate insulation layer. A third upper electrode 332 of a first electrode 330 may be provided directly on an upper surface of a third lower electrode 331 of a first electrode 330 in a third subpixel P3, without a separate insulation layer. Therefore, a first insulation layer 510 and a second insulation layer 520 may be between the first lower electrode 311 and the first upper electrode 312 in a first emission area EA1 of the first subpixel P1, the second insulation layer 520 may be between the second lower electrode 321 and the second upper electrode 322 in a second emission area EA2 of the second subpixel P2, and a separate insulation layer may not be between the third lower electrode 331 and the third upper electrode 332 in a third emission area EA3 of the third subpixel P3.

A distance between the first lower electrode 311 and the first upper electrode 312 in the first emission area EA1 of the first subpixel P1 in the example of FIG. 4 may be shorter than a distance between the first lower electrode 311 and the first upper electrode 312 in the first emission area EA1 of the first subpixel P1 in a structure of FIG. 2A. Also, a distance between the second lower electrode 321 and the second upper electrode 322 in the second emission area EA2 of the second subpixel P2 in the example of FIG. 4 may be shorter than a distance between the second lower electrode 321 and the second upper electrode 322 in the second emission area EA2 of the second subpixel P2 in the structure of FIG. 2A. Also, a distance between the third lower electrode 331 and the third upper electrode 332 in the third emission area EA3 of the third subpixel P3 in the example of FIG. 4 may be shorter than a distance between the third lower electrode 331 and the third upper electrode 332 in the third emission area EA3 of the third subpixel P3 in the structure of FIG. 2A.

As described above, to obtain the micro-cavity effect in each of the subpixels P1 to P3, each respective distance between the first to third lower electrodes 311, 321, and 331 and the first to third upper electrodes 312, 322, and 332 may be an integer multiple of a half wavelength ($\lambda/2$) of light discharged from each of the subpixels P1 to P3. Therefore, to realize an integer multiple of a half wavelength ($\lambda/2$) of light, the respective distances between the first to third lower electrodes 311, 321, and 331 and the first to third upper electrodes 312, 322, and 332 may be variously modified based on the above-described structure illustrated in the examples of FIG. 2A or FIG. 4.

Figure 5:
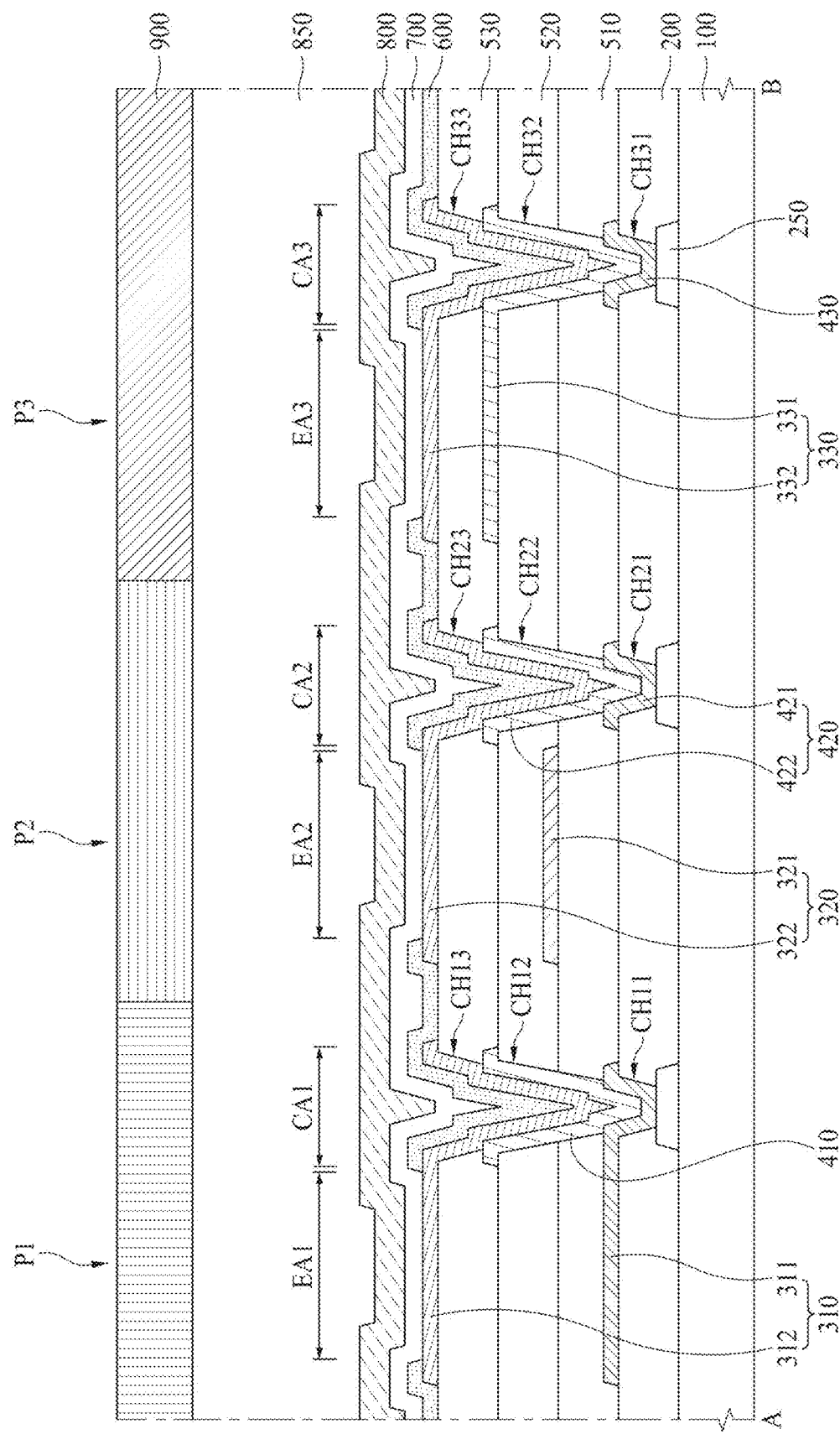
FIG. 5 is a cross-sectional view of an electroluminescent display apparatus according to an embodiment of the present disclosure.

FIG. 5 is a cross-sectional view of an electroluminescent display apparatus according to an embodiment of the present disclosure.

FIG. 5 is a cross-sectional view taken along line A-B of FIG. 1. In structures of first electrodes 310 to 330 and contact electrodes 410 to 430, the electroluminescent display apparatus of the FIG. 5 example differs from the electroluminescent display apparatus of the FIG. 2A example. Therefore, elements differing from the elements described above with reference to FIG. 2A will be described below.

As shown in FIG. 5, the first electrodes 310 to 330 and the contact electrodes 410 to 430 may be patterned in the respective subpixels P1 to P3 on a circuit device layer 200. The first electrode 310 in the first subpixel P1 may include a first lower electrode 311 and a first upper electrode 312. The first lower electrode 311 and the first upper electrode 312 may extend from a first emission area EA1 to a first contact area CA1.

The first lower electrode 311 may be connected to a driving TFT 250 through a first contact hole CH11 of the circuit device layer 200 in the first subpixel P1 area. The first upper electrode 312 may be connected to the first contact electrode 410 through a third contact hole CH13 of a third insulation layer 530 in the first subpixel P1 area.

The first contact electrode 410 in the first subpixel P1 may include one contact layer. The first contact electrode 410 may be connected to the first lower electrode 311 through a second contact hole CH12 provided in a first insulation layer 510 and a second insulation layer 520 each in the first subpixel P1 area.

In the first subpixel P1, the first lower electrode 311 may be directly connected to the driving TFT 250 in the circuit device layer 200, and the first upper electrode 312 may be connected to the first lower electrode 311 through the first contact electrode 410. Therefore, the first to third insulation layers 510 to 530 may be between the first lower electrode 311 and the first upper electrode 312 in the first emission area EA1 of the first subpixel P1.

The first electrode 320 in the second subpixel P2 may include a second lower electrode 321 and a second upper electrode 322. The second lower electrode 321 may be in a second emission area EA2, and may not extend to a second contact area CA2, and the second upper electrode 322 may extend from the second emission area EA2 to the second contact area CA2.

The second lower electrode 321 may have an island structure on the first insulation layer 510. For example, the second lower electrode 321 may be noncontiguous with (e.g., may not be connected to) the second contact electrode 420, the second upper electrode 322, and the driving TFT 250. The second upper electrode 322 contiguous with (e.g., may be connected to) a second upper contact electrode 422 configuring the second contact electrode 420 through a third contact hole CH23 of the third insulation layer 530 in the second subpixel P2 area.

The second contact electrode 420 in the second subpixel P2 may include a second lower contact electrode 421 and a second upper contact electrode 422. The second lower contact electrode 421 may be connected to the driving TFT 250 through a first contact hole CH21 of the circuit device layer 200 in the second subpixel P2 area, and the second upper contact electrode 422 may be connected to the second lower electrode 321 through a second contact hole CH22 of each of the first insulation layer 510 and the second insulation layer 520 each in the second subpixel P2 area.

In the second subpixel P2, the second lower electrode 321 may have an island structure, and may not be directly connected to another conductive material, and the second upper electrode 322 may be connected to the driving TFT 250 through the second lower contact electrode 421 and the second upper contact electrode 422. Therefore, the second and third insulation layers 520 and 530 may be between the second lower electrode 321 and the second upper electrode 322 in the second emission area EA2 of the second subpixel P2.

The first electrode 330 in the third subpixel P3 may include a third lower electrode 331 and a third upper electrode 332. The third lower electrode 331 and the third upper electrode 332 may extend from a third emission area EA3 to a third contact area CA3.

The third lower electrode 331 may be connected to the third contact electrode 430 through a second contact hole CH32 of each of the first and second insulation layers 510 and 520 in the third subpixel P3 area. The third upper electrode 332 may be connected to the third lower electrode 331 through a third contact hole CH33 of the third insulation layer 530 in the third subpixel P3 area.

The third contact electrode 430 in the third subpixel P3 may include one contact layer. The third contact electrode 430 may be connected to the driving TFT 250 through a first contact hole CH31 of the circuit device layer 200 in the third subpixel P3 area.

In the third subpixel P3, the third lower electrode 331 may be connected to the driving TFT 250 in the circuit device layer 200 through the third contact electrode 430, and the third upper electrode 332 may be directly connected to the second lower electrode 321. Therefore, the third insulation layer 530 may be between the third lower electrode 331 and the third upper electrode 332 in the third emission area EA3 of the third subpixel P3.

The first insulation layer 510 may be between the circuit device layer 200 and the second insulation layer 520. For example, the first insulation layer 510 may be under the second lower electrode 321. A plurality of second contact holes CH12, CH22, and CH32 may be in the first insulation layer 510 in the respective subpixels P1 to P3.

The second insulation layer 520 may be on the first insulation layer 510. For example, the second insulation layer 520 may be under the first contact electrode 410, the second upper contact electrode 422, and the third lower electrode 331. The plurality of second contact holes CH12, CH22, and CH32 may be in the second insulation layer 520 in the respective subpixels P1 to P3.

The third insulation layer 530 may be on the second insulation layer 520. For example, the third insulation layer 530 may be under the first upper electrode 312, the second upper electrode 322, and the third upper electrode 332. A plurality of third contact holes CH13, CH23, and CH33 may be in the third insulation layer 530 in the respective subpixels P1 to P3.

In the above-described structure of FIG. 2A, the separate second contact holes CH12, CH22, and CH32 may be in the first insulation layer 510, and the separate second contact holes CH13, CH23, and CH33 may be in the second insulation layer 520. On the other hand, in the structure of FIG. 5, the second contact holes CH12, CH22, and CH32 may rectilinearly and simultaneously pass through the first and second insulation layers 510 and 520. Therefore, in the structure of FIG. 5, the second lower electrode 321 of the first electrode 320 may not overlap the second contact area CA2 to form the second contact hole CH22, which may rectilinearly and simultaneously pass through the first and second insulation layers 510 and 520 in the second subpixel P2. For example, the second lower electrode 321 of the first electrode 320 may not overlap the second contact electrode 420 of the second contact area CA2 in the second subpixel P2. Therefore, comparing with the example of FIG. 2A, the example of FIG. 5 may decrease the number of processes of forming contact holes.

Figure 6:
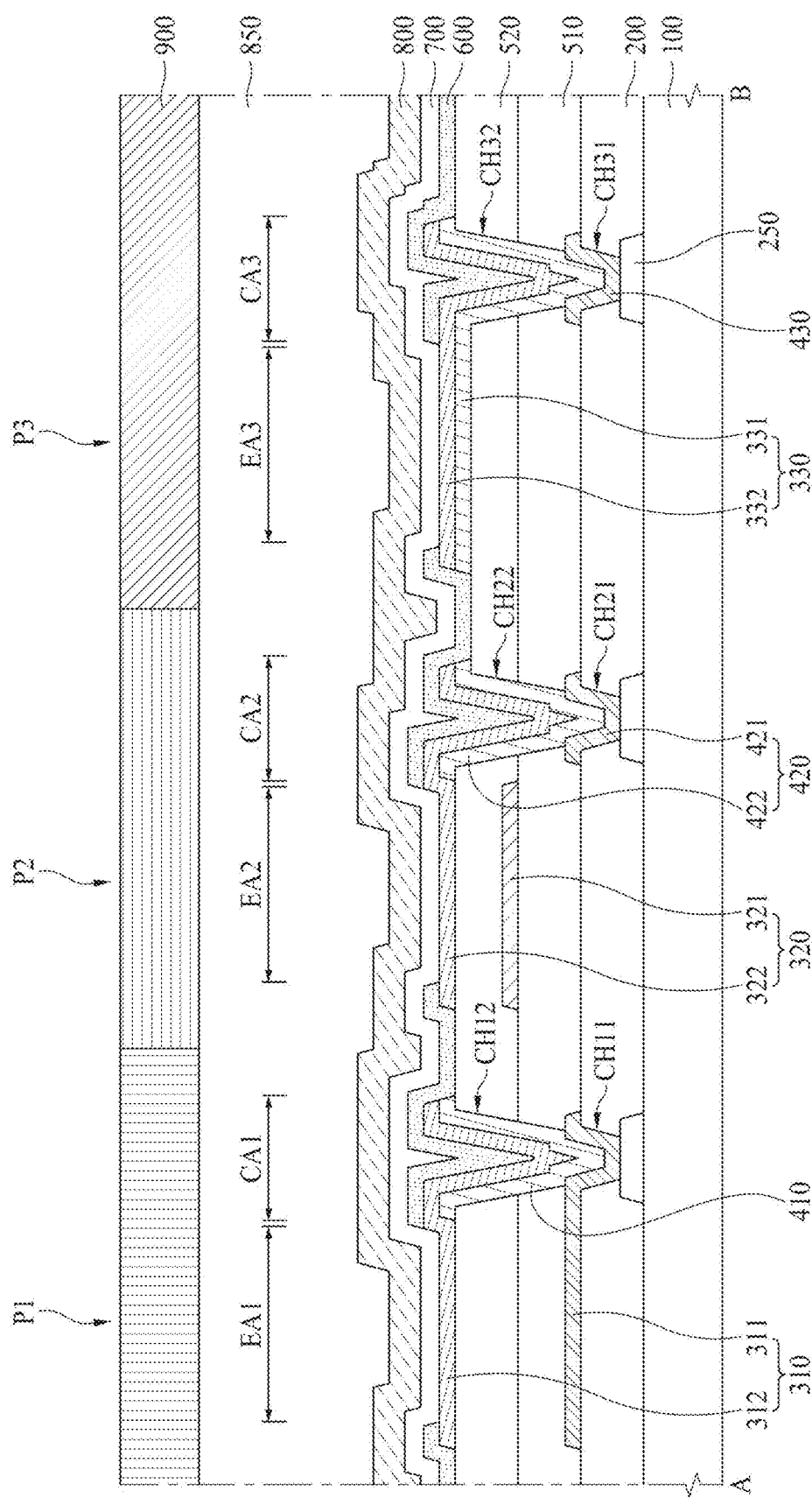
FIG. 6 is a cross-sectional view of an electroluminescent display apparatus according to an embodiment of the present disclosure.

FIG. 6 is a cross-sectional view of an electroluminescent display apparatus according to an embodiment of the present disclosure.

FIG. 6 is a cross-sectional view taken along line A-B of FIG. 1. The electroluminescent display apparatus of the FIG. 6 example differs from the electroluminescent display apparatus of the FIG. 5 example in that the third insulation layer 530 is not provided. Therefore, like reference numerals refer to like elements, and only different elements will be described below.

As shown in FIG. 6, according to an embodiment of the present disclosure, a first upper electrode 312 of a first electrode 310 may be provided directly on an upper surface of a first contact electrode 410 in a first subpixel P1, without a separate insulation layer; a second upper electrode 322 of a first electrode 320 may be provided directly on an upper surface of a second upper contact electrode 422 of a second contact electrode 420 in a second subpixel P2, without a separate insulation layer; and a third upper electrode 332 of a first electrode 330 may be provided directly on an upper surface of a third lower electrode 331 of a first electrode 330 in a third subpixel P3, without a separate insulation layer.

Therefore, a first insulation layer 510 and a second insulation layer 520 may be between the first lower electrode 311 and the first upper electrode 312 in a first emission area EA1 of the first subpixel P1, the second insulation layer 520 may be between the second lower electrode 321 and the second upper electrode 322 in a second emission area EA2 of the second subpixel P2, and a separate insulation layer may not be between the third lower electrode 331 and the third upper electrode 332 in a third emission area EA3 of the third subpixel P3.

A distance between the first lower electrode 311 and the first upper electrode 312 in the first emission area EA1 of the first subpixel P1 in the example of FIG. 6 may be shorter than a distance between the first lower electrode 311 and the first upper electrode 312 in the first emission area EA1 of the first subpixel P1 in the example of FIG. 5. Also, a distance between the second lower electrode 321 and the second upper electrode 322 in the second emission area EA2 of the second subpixel P2 in the example of FIG. 6 may be shorter than a distance between the second lower electrode 321 and the second upper electrode 322 in the second emission area EA2 of the second subpixel P2 in the example of FIG. 5. Also, a distance between the third lower electrode 331 and the third upper electrode 332 in the third emission area EA3 of the third subpixel P3 in the example of FIG. 6 may be shorter than a distance between the third lower electrode 331 and the third upper electrode 332 in the third emission area EA3 of the third subpixel P3 in the example of FIG. 5.

As described above, to obtain the micro-cavity effect in each of the subpixels P1 to P3, each respective distance between the first to third lower electrodes 311, 321, and 331 and the first to third upper electrodes 312, 322, and 332 may be an integer multiple of a half wavelength (λ/2) of light discharged from each of the subpixels P1 to P3. Therefore, to realize an integer multiple of a half wavelength (λ/2) of light, the respective distances between the first to third lower electrodes 311, 321, and 331 and the first to third upper electrodes 312, 322, and 332 may be variously modified based on the above-described structure illustrated in the examples of FIG. 5 or FIG. 6.

Figure 7:
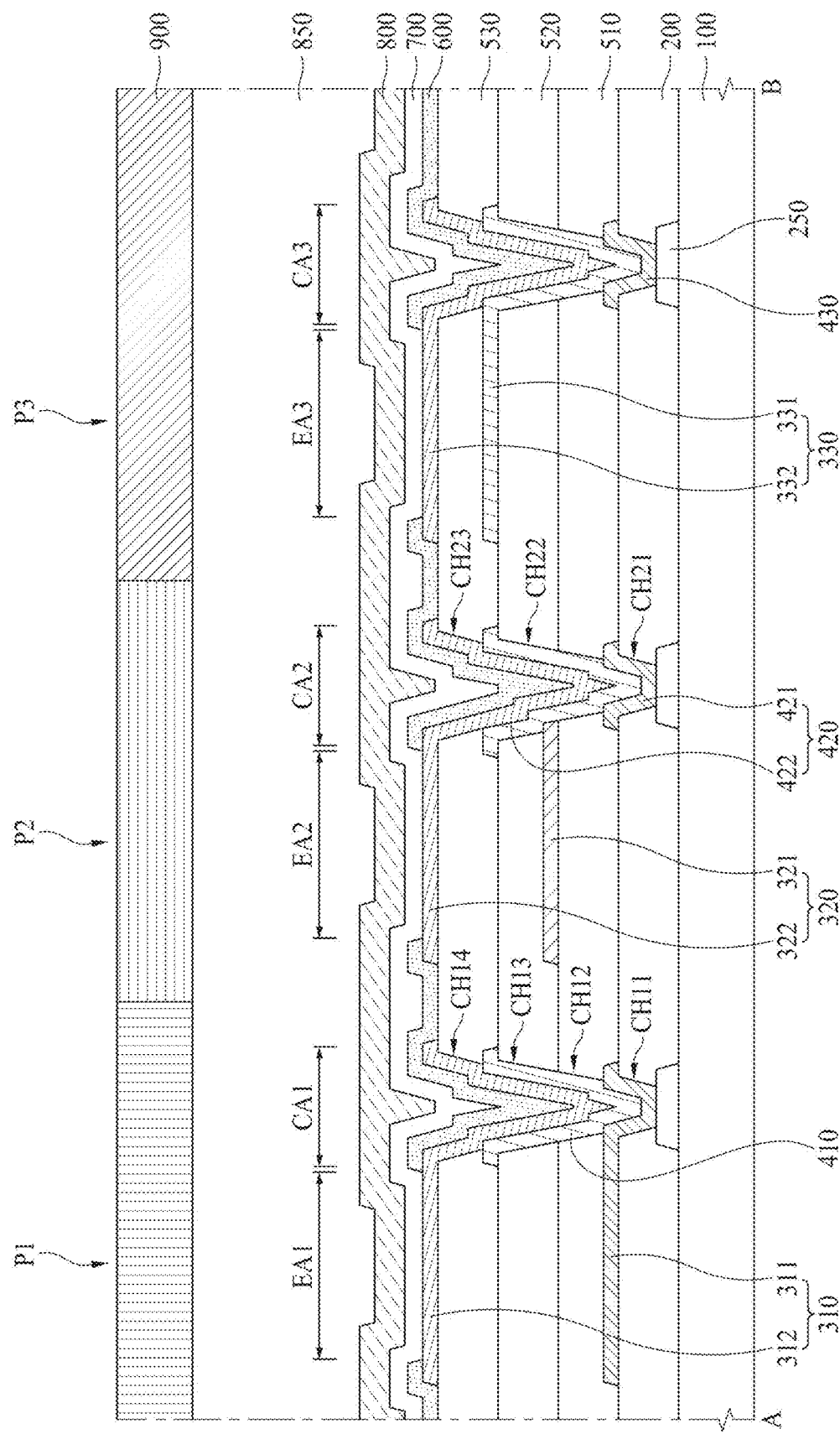
FIG. 7 is a cross-sectional view of an electroluminescent display apparatus according to an embodiment of the present disclosure.

FIG. 7 is a cross-sectional view of an electroluminescent display apparatus according to an embodiment of the present disclosure.

FIG. 7 is a cross-sectional view taken along line A-B of FIG. 1. The electroluminescent display apparatus of the FIG. 7 example differs from the electroluminescent display apparatus of the FIG. 5 example in a configuration of a second lower electrode 321 of a first electrode 310 in a second subpixel P2. Therefore, like reference numerals refer to like elements, and only different elements will be described below.

In the above-described example of FIG. 5, the second lower electrode 321 of the first electrode 320 in the second subpixel P2 may have an island structure on the first insulation layer 510. For example, the second lower electrode 321 may not overlap the second contact area CA2, and thus, may not be connected to the second contact electrode 420, the second upper electrode 322, and the driving TFT 250.

On the other hand, in the example of FIG. 7, a second lower electrode 321 of a first electrode 320 in a second subpixel P2 may overlap a second contact area CA2, and thus, may be connected to a second contact electrode 420 (for example, a side surface of a second upper contact electrode 422 of a second contact electrode 420). In FIG. 7, a second contact hole CH22, which may simultaneously pass through a first insulation layer 510 and a second insulation layer 520, may be in a second subpixel P2.

Comparing with the example of FIG. 5, the example of FIG. 7 may increase an area of the second lower electrode 321 of the first electrode 320 in the second subpixel P2, thereby enhancing light efficiency. Although not shown, the structure of the FIG. 7 example may be applied to the above-described structure of the FIG. 6 example.

Figure 8A:
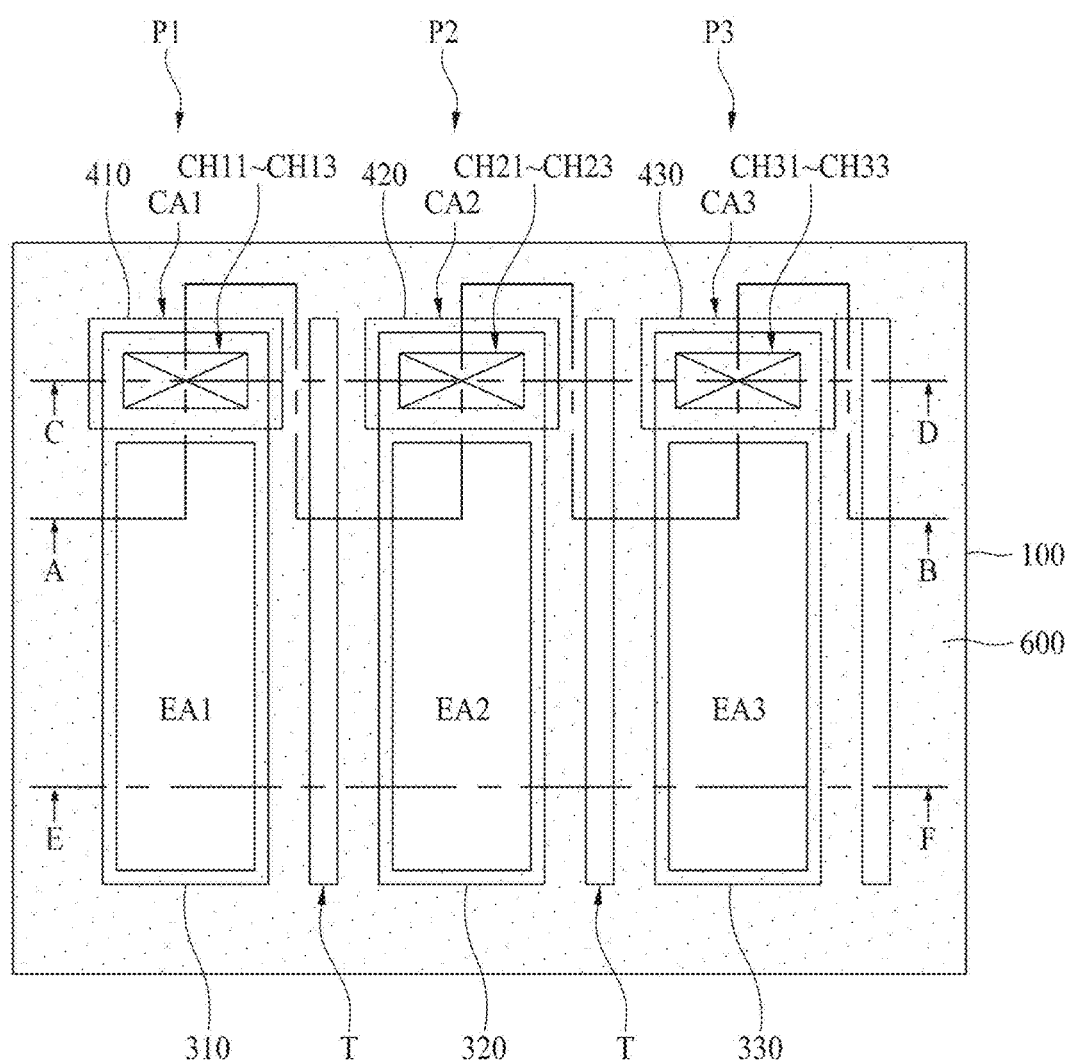
FIG. 8A is a plan view of an electroluminescent display apparatus according to an embodiment of the present disclosure.
Figure 8B:
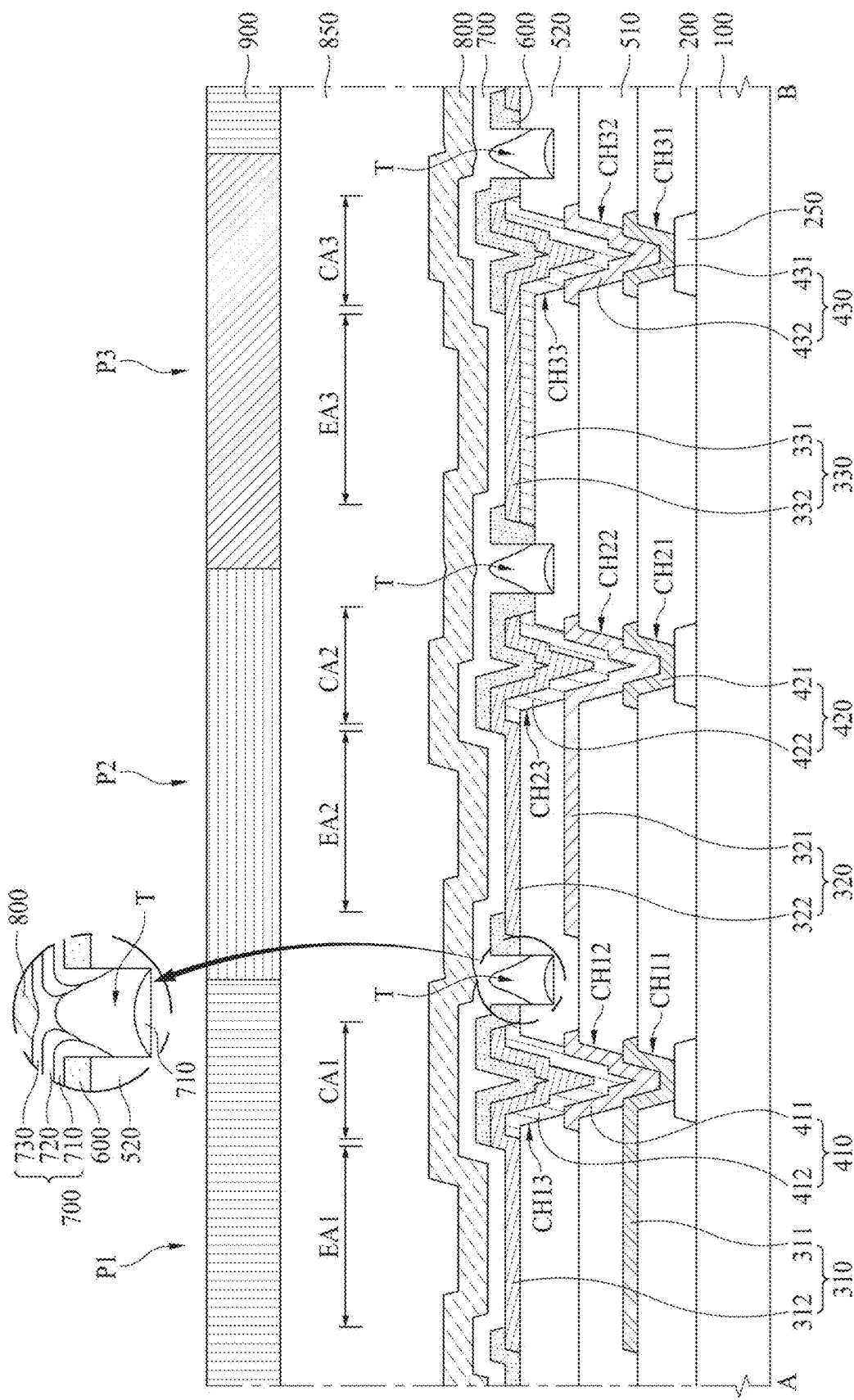
FIG. 8B is a cross-sectional view taken along line A-B of FIG. 8A.
Figure 8C:
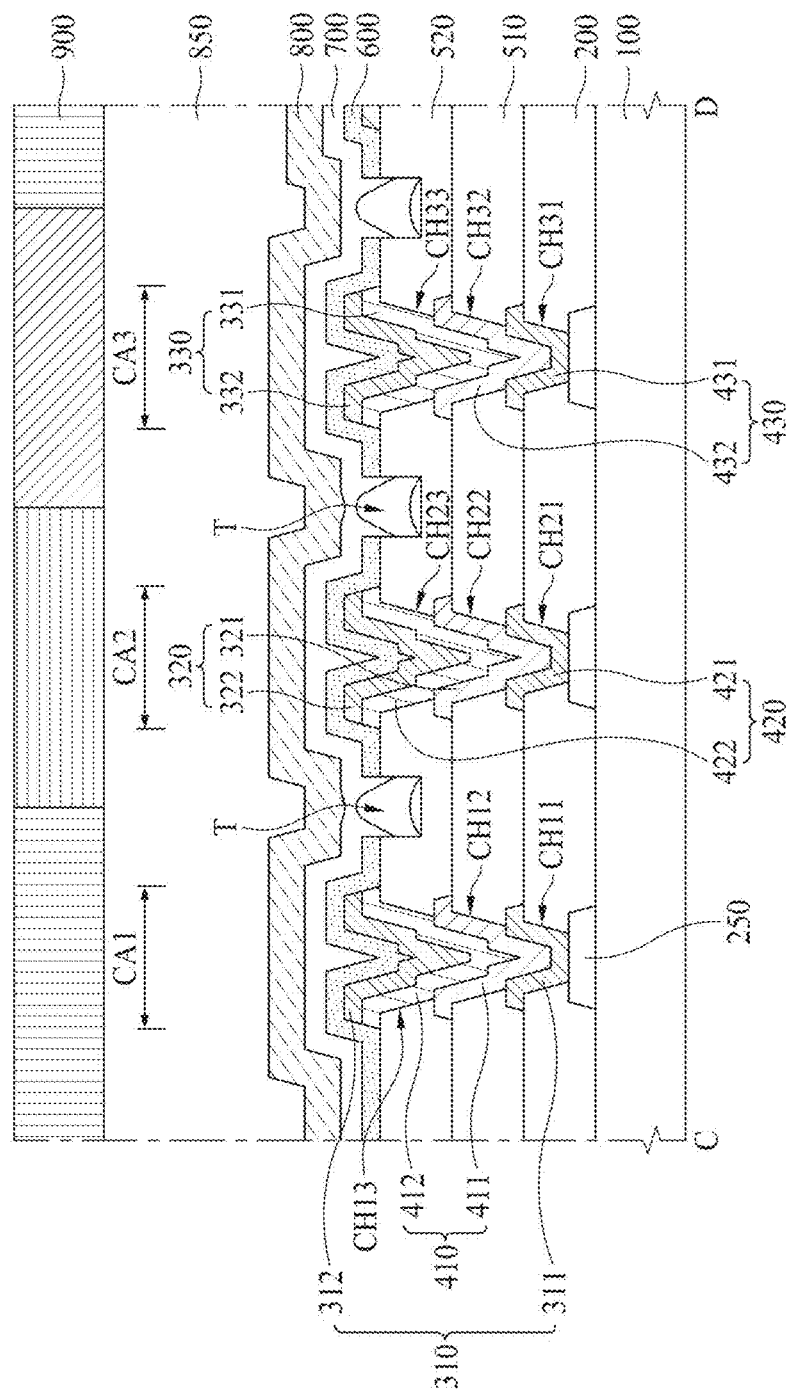
FIG. 8C is a cross-sectional view taken along line C-D of FIG. 8A.
Figure 8D:
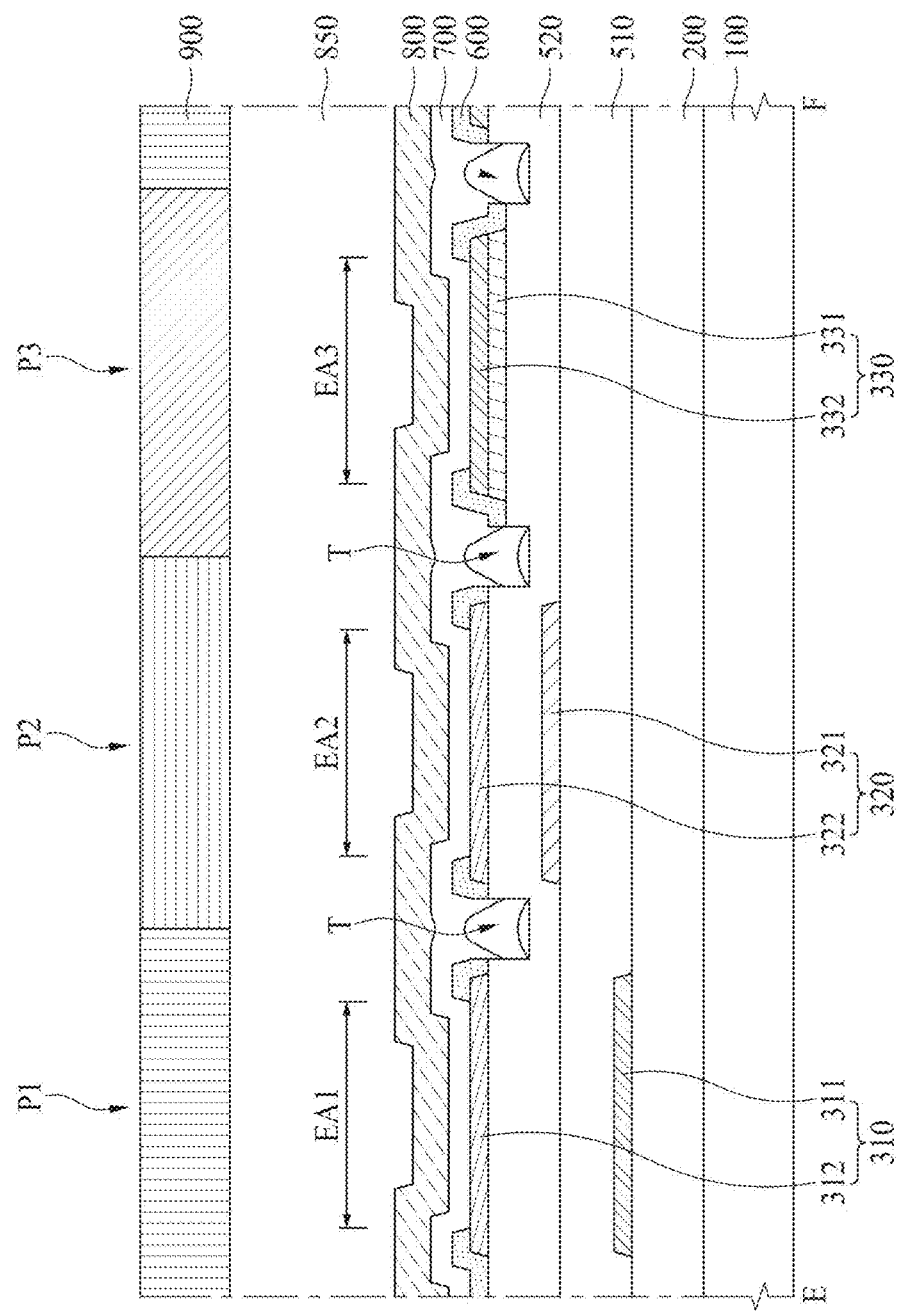
FIG. 8D is a cross-sectional view taken along line E-F of FIG. 8A.

FIG. 8A is a plan view of an electroluminescent display apparatus according to an embodiment of the present disclosure. FIG. 8B is a cross-sectional view taken along line A-B of FIG. 8A. FIG. 8C is a cross-sectional view taken along line C-D of FIG. 8A. FIG. 8D is a cross-sectional view taken along line E-F of FIG. 8A.

The electroluminescent display apparatus of each of the examples of FIGS. 8A to 8D respectively differs from the electroluminescent display apparatus of each of the examples of FIGS. 3A to 3D in that the third insulation layer 530 and the fourth contact holes CH14, CH24, and CH34 are not provided.

With reference to FIG. 8B, according to an embodiment of the present disclosure, a first upper electrode 312 of a first electrode 310 may be provided directly on an upper surface of a first upper contact electrode 412 of a first contact electrode 410 in a first subpixel P1, without a separate insulation layer; a second upper electrode 322 of a first electrode 320 may be provided directly on an upper surface of a second upper contact electrode 422 of a second contact electrode 420 in a second subpixel P2, without a separate insulation layer; and a third upper electrode 332 of a first electrode 330 may be provided directly on an upper surface of a third lower electrode 331 of a first electrode 330 in a third subpixel P3 without a separate insulation layer. Therefore, a first insulation layer 510 and a second insulation layer 520 may be between the first lower electrode 311 and the first upper electrode 312 in a first emission area EA1 of the first subpixel P1, the second insulation layer 520 may be between the second lower electrode 321 and the second upper electrode 322 in a second emission area EA2 of the second subpixel P2, and a separate insulation layer may not be between the third lower electrode 331 and the third upper electrode 332 in a third emission area EA3 of the third subpixel P3.

FIGS. 9A to 9H are process cross-sectional views of an electroluminescent display apparatus according to an embodiment of the present disclosure.

FIGS. 9A to 9H correspond to a cross-sectional view taken along line A-B of FIG. 8A. First, as seen in the FIG. 9A example, a circuit device layer 200, including a driving TFT 250, may be provided on a substrate 100; a plurality of first contact holes CH11, CH21, and CH31 may be provided in the circuit device layer 200 in respective subpixels P1 to P3; and a first lower electrode 311, a second lower contact electrode 421, and a third lower contact electrode 431 may be provided on the circuit device layer 200. The second lower contact electrode 421 and the third lower contact electrode 431 may be connected to a source terminal or a drain terminal of the driving TFT 250 through the first contact holes CH11, CH21, and CH31.

Figure 9A:
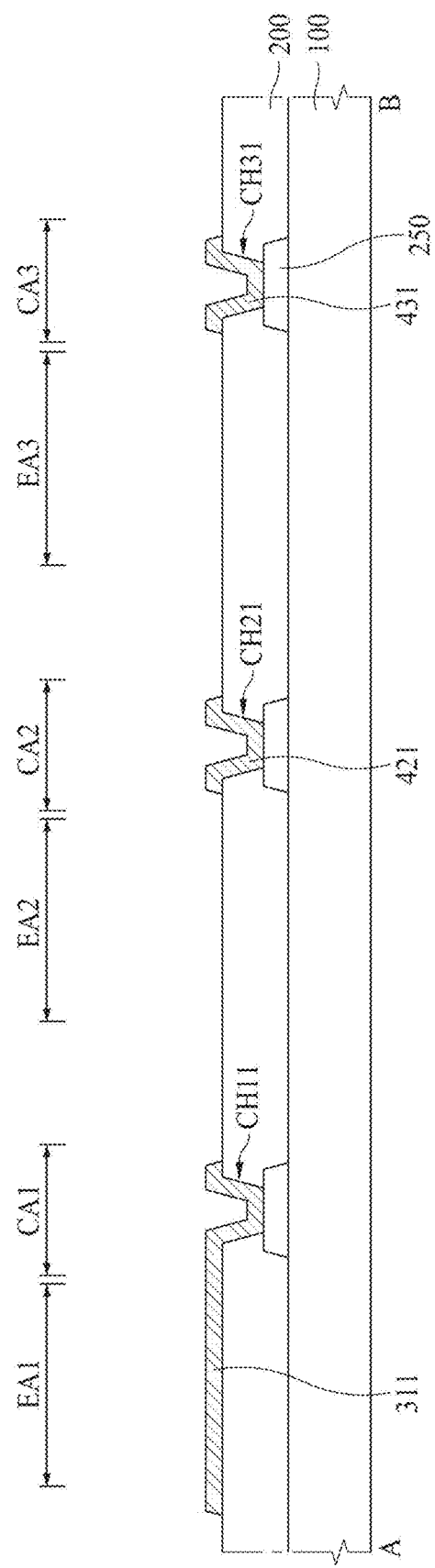
FIGS. 9A to 9H are process cross-sectional views of an electroluminescent display apparatus according to an embodiment of the present disclosure.
Figure 9B:
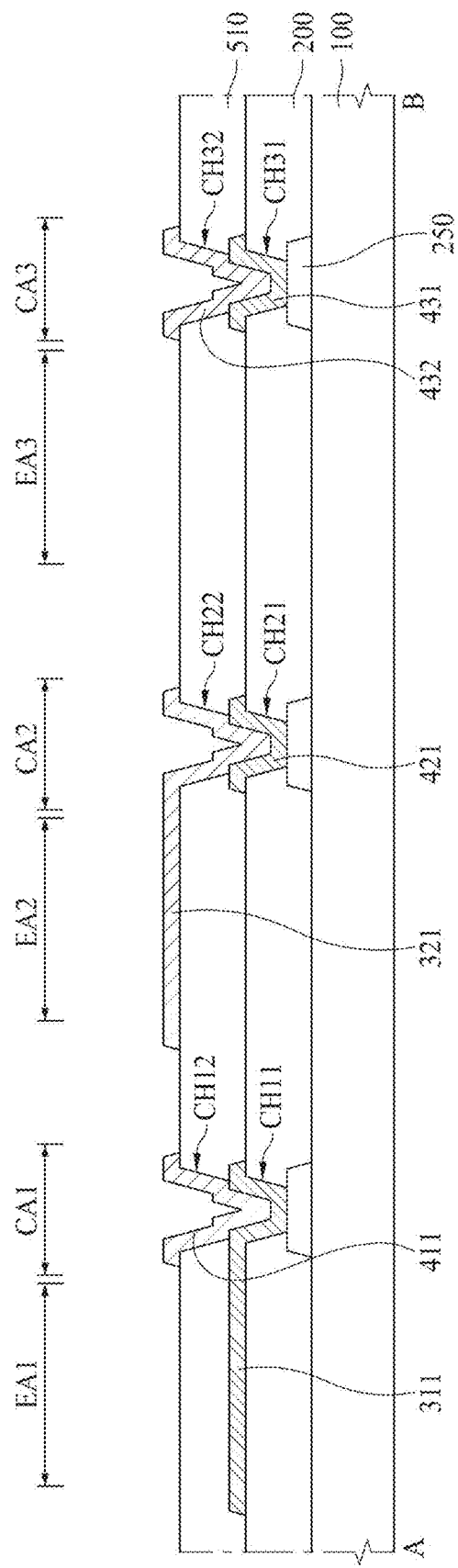

Subsequently, as seen in the example of FIG. 9B, a first insulation layer 510 may be provided on the first lower electrode 311, the second lower contact electrode 421, and the third lower contact electrode 431; a plurality of second contact holes CH12, CH22, and CH32 may be provided in the first insulation layer 510, and a first lower contact electrode 411, a second lower electrode 321; and a third upper contact electrode 432 may be provided on the first insulation layer 510. The first lower contact electrode 411 may be connected to the first lower electrode 311 through the second contact hole CH12, the second lower electrode 321 may be connected to the second lower contact electrode 421 through the second contact hole CH22, and the third upper contact electrode 432 may be connected to the third lower contact electrode 431 through the second contact hole CH32.

Figure 9C:
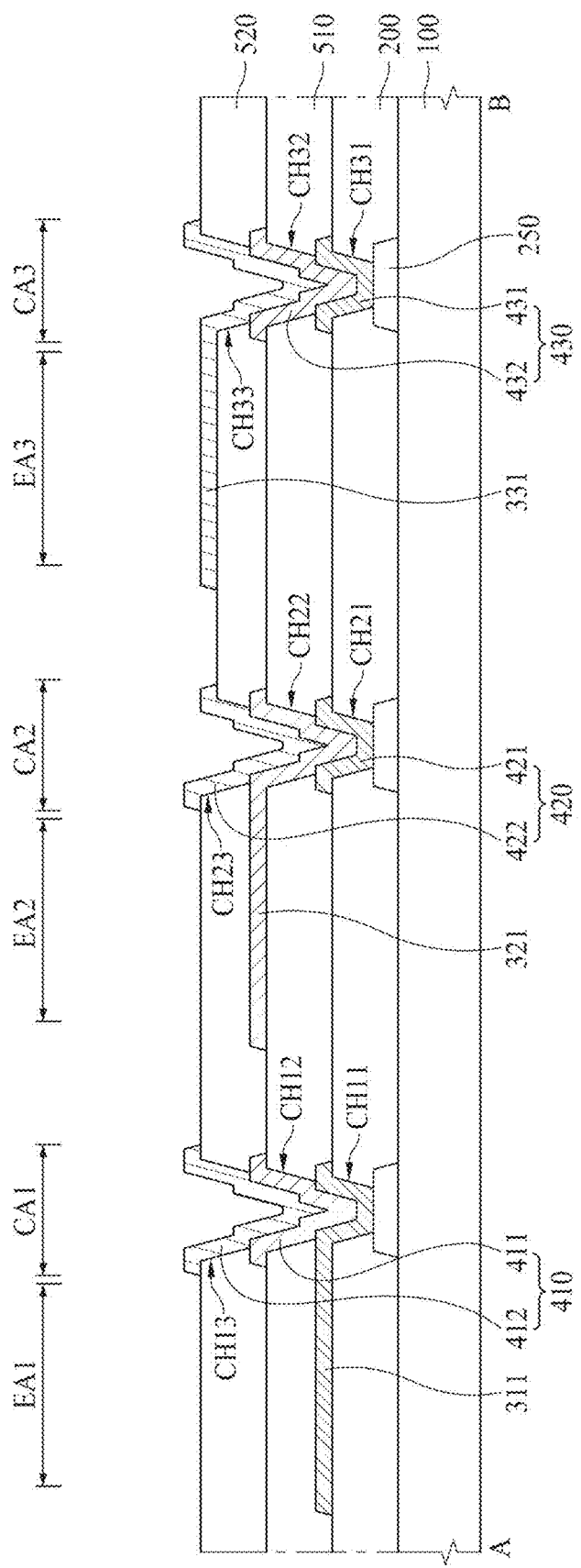

Subsequently, as seen in the example of FIG. 9C, a second insulation layer 520 may be provided on the first lower contact electrode 411, the second lower electrode 321, and the third upper contact electrode 432; a plurality of third contact holes CH13, CH23, and CH33 may be provided in the second insulation layer 520, and a first upper contact electrode 412, a second upper contact electrode 422; and a third lower electrode 331 may be provided on the second insulation layer 520. The first upper contact electrode 412 may be connected to the first lower contact electrode 411 through the third contact hole CH13, the second upper contact electrode 422 may be connected to the second lower electrode 321 through the third contact hole CH23, and the third lower electrode 331 may be connected to the third upper contact electrode 432 through the third contact hole CH33.

Figure 9D:
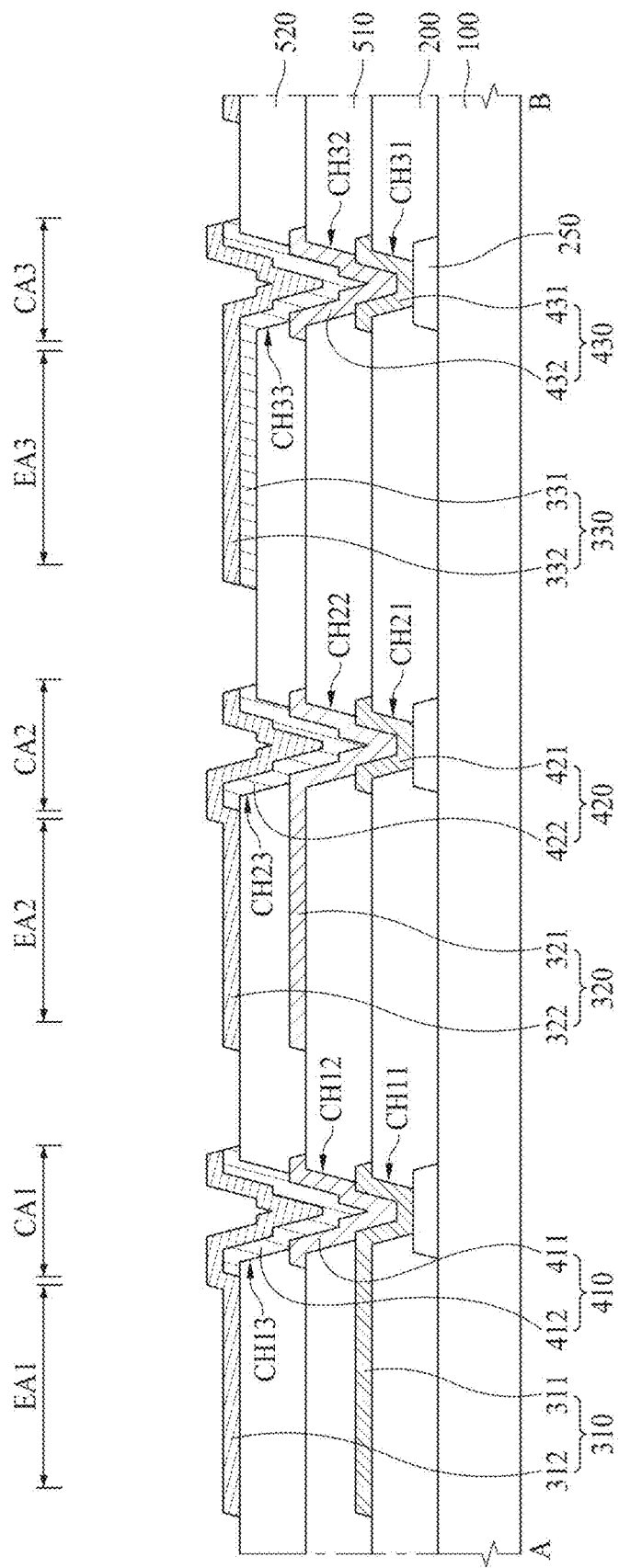
Figure 9E:
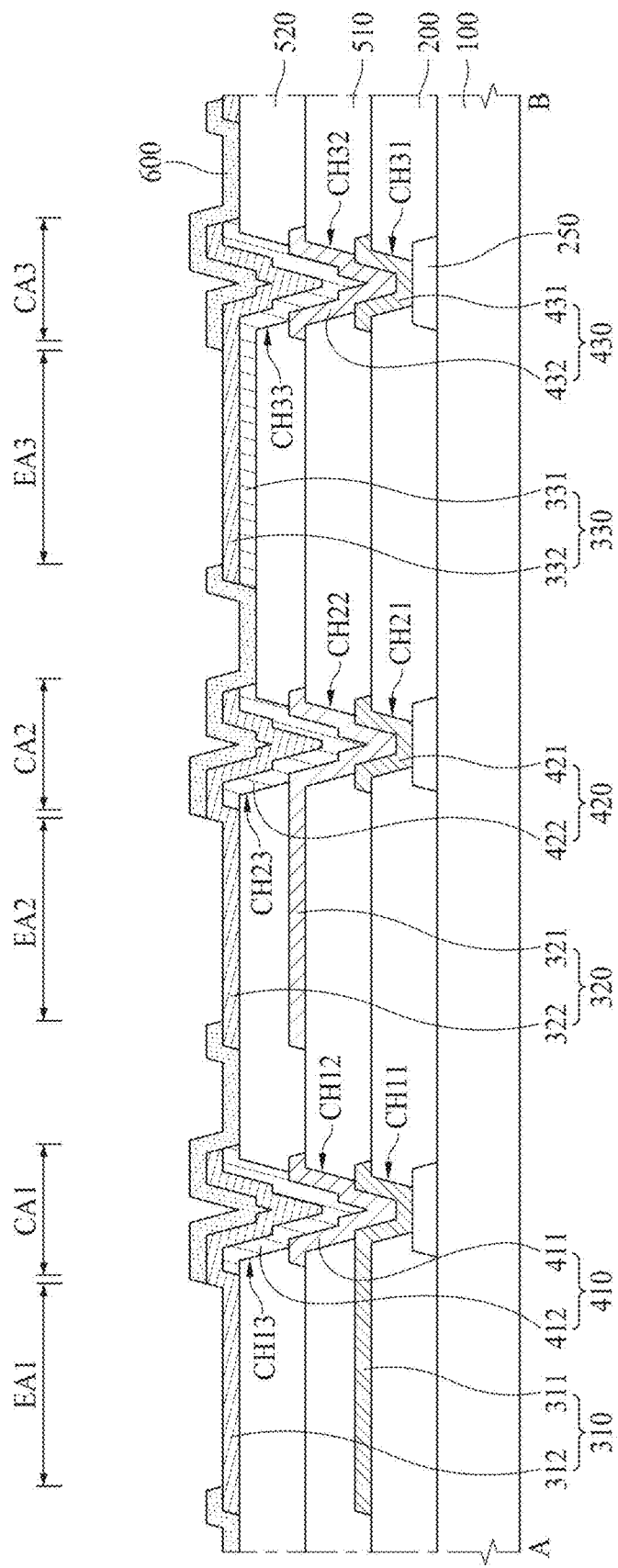

Subsequently, as seen in the example of FIG. 9D, a first upper electrode 312 may be provided on the first upper contact electrode 412; a second upper electrode 322 may be provided on the second upper contact electrode 422; and a third upper electrode 332 may be provided on the third upper electrode 332. Subsequently, as seen in the example of FIG. 9E, a bank 600 may be provided on the first upper electrode 312, the second upper electrode 322, and the third upper electrode 332. The bank 600 may cover both ends of each of the first upper electrode 312, the second upper electrode 322, and the third upper electrode 332.

Figure 9F:
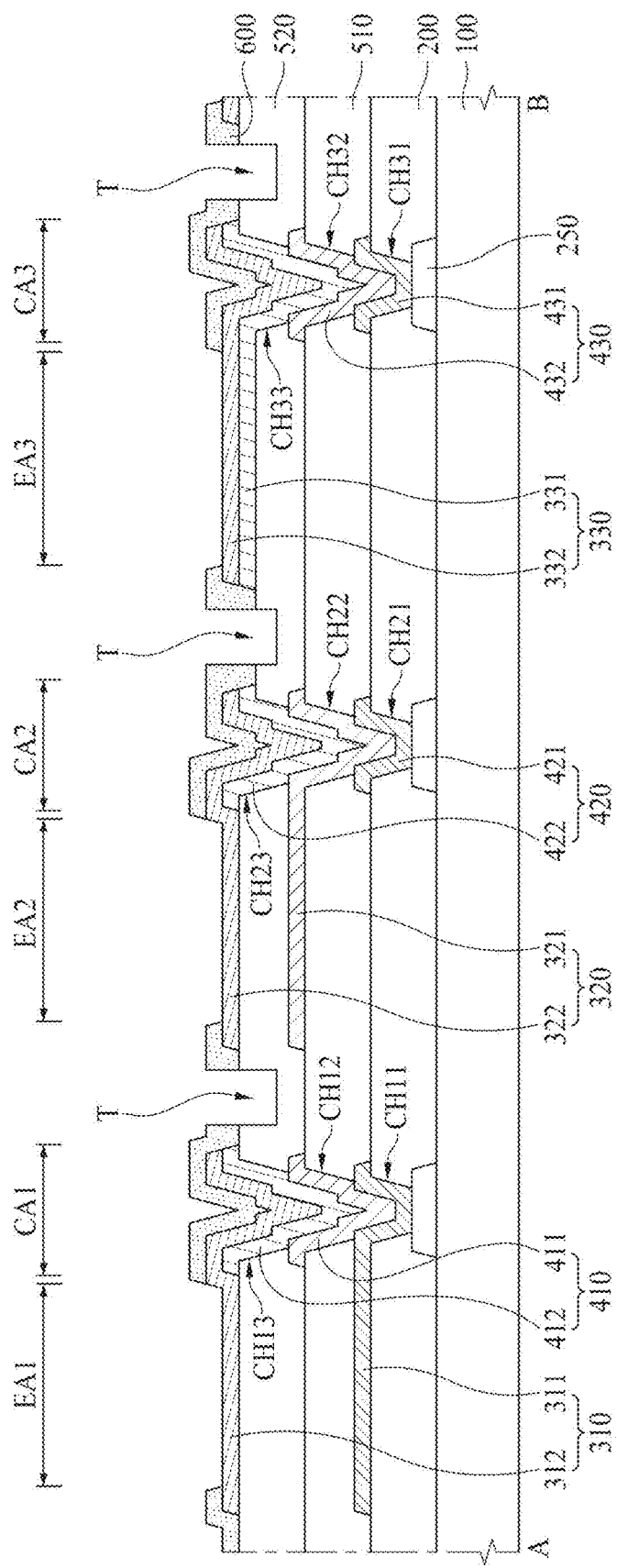

Subsequently, as seen in the example of FIG. 9F, a trench T may be provided in the bank 600 and the second insulation layer 520 in a boundary region between the subpixels P1 to P3. Alternatively, the trench T may be provided only in the bank 600. Furthermore, the trench T may extend to the bank 600 and the third insulation layer 530, and moreover, may extend to an inner portion of the second insulation layer 520 thereunder, an inner portion of the first insulation layer 510 thereunder, or an inner portion of the circuit device layer 200 thereunder.

Figure 9G:
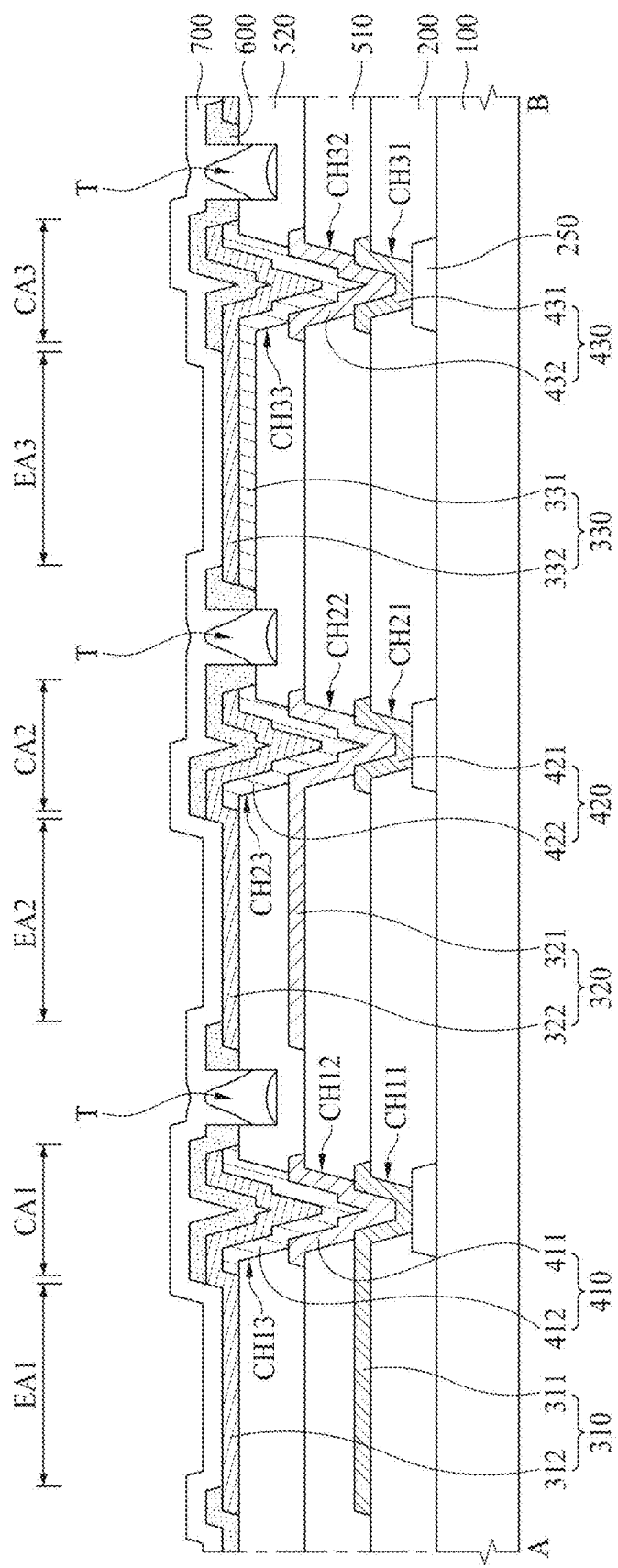
Figure 9H:
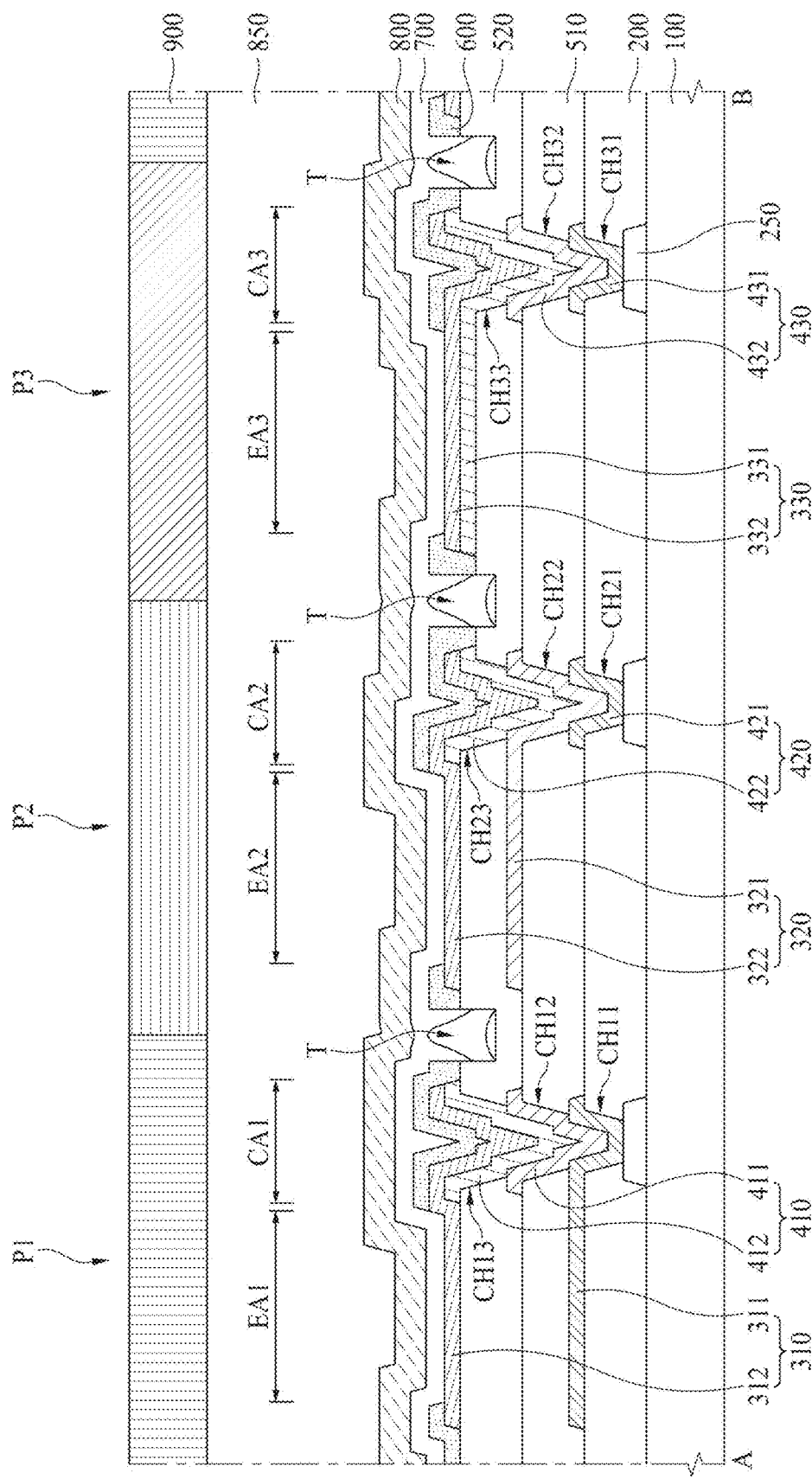

Subsequently, as seen in the example of FIG. 9G, a light-emitting layer 700 may be provided on the bank 600. Subsequently, as seen in the example of FIG. 9H, a second electrode 800 may be provided on the light-emitting layer 700, an encapsulation layer 850 may be provided on the second electrode 800, and a color filter layer 900 may be provided on the encapsulation layer 850.

Figure 10:
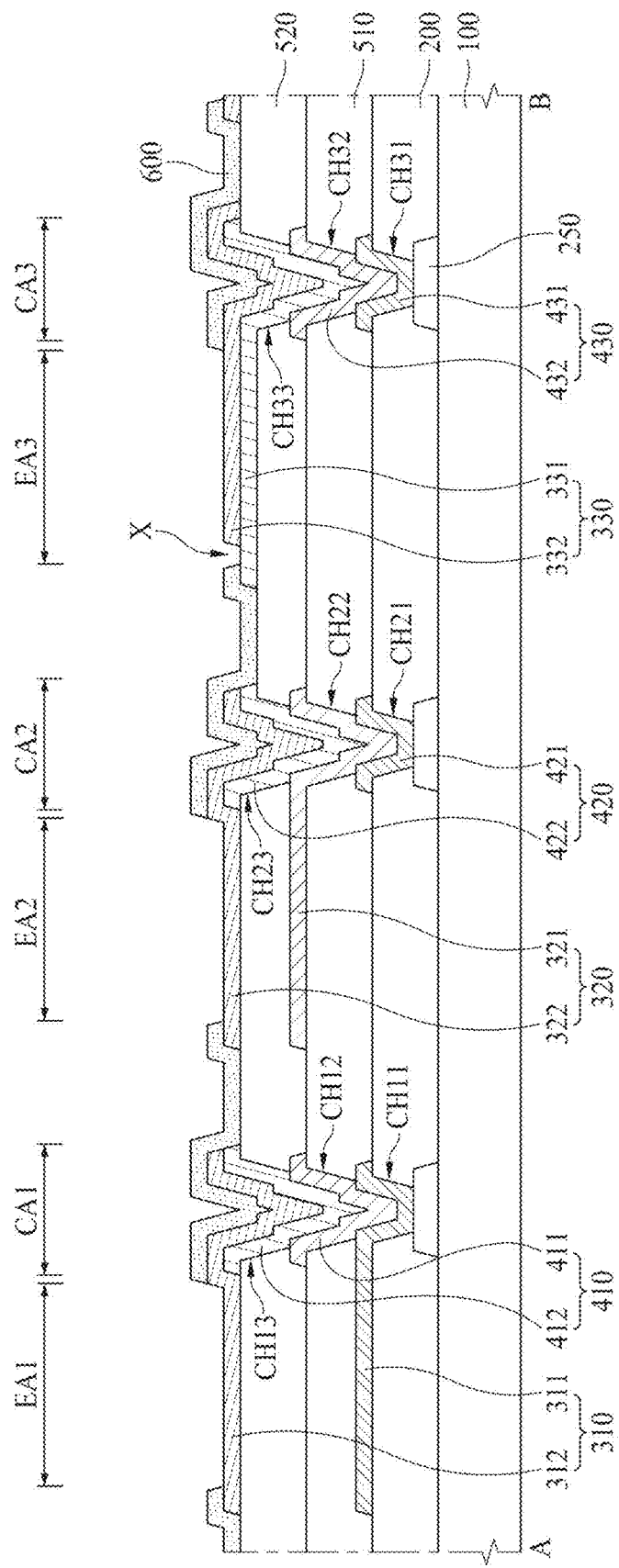
FIG. 10 is a cross-sectional view showing a possibility that emission efficiency is reduced in an electroluminescent display apparatus according to an embodiment of the present disclosure.

FIG. 10 is a cross-sectional view showing a possibility that emission efficiency is reduced in an electroluminescent display apparatus according to an embodiment of the present disclosure.

FIG. 10 shows an example in which a third upper electrode 332 does not have the same pattern as that of a third lower electrode 331, e.g., due to a process error, such as mask misalignment in the above-described process of FIG. 9D. As such, the bank 600 does not cover one end of the third upper electrode 332 in the above-described example process of FIG. 9E.

As shown in FIG. 10, when the bank 600 does not cover the one end of the third upper electrode 332, a region X in which a light-emitting layer 700 directly contacts the third lower electrode 331 may occur. For example, the light-emitting layer 700 may contact the third lower electrode 331 without contacting the third upper electrode 332 in the region X. However, in the other region, the light-emitting layer 700 may contact the third upper electrode 332.

When a work function of the third lower electrode 331 differs from that of the third upper electrode 332, the emission intensity of a portion of the light-emitting layer 700 contacting the third lower electrode 331 may differ from that of a portion of the light-emitting layer 700 contacting the third upper electrode 332. As such, uniform light emission may not be realized, and emission efficiency may be reduced. For example, the third lower electrode 331 may be a reflective electrode, and may include aluminum (Al) or silver (Ag). For example, a work function of Al may be about 4.28 eV and a work function of Ag may be about 4.26 eV. On the other hand, the third upper electrode 332 may be a transparent electrode, and may include titanium nitride (TiN) or indium tin oxide (ITO). For example, a work function of TiN may be about 4.33 eV and a work function of ITO may be about 4.89 eV.

Hereinafter, an electroluminescent display apparatus according to an embodiment of the present disclosure for solving the above-described problem will be described in detail.

Figure 11A:
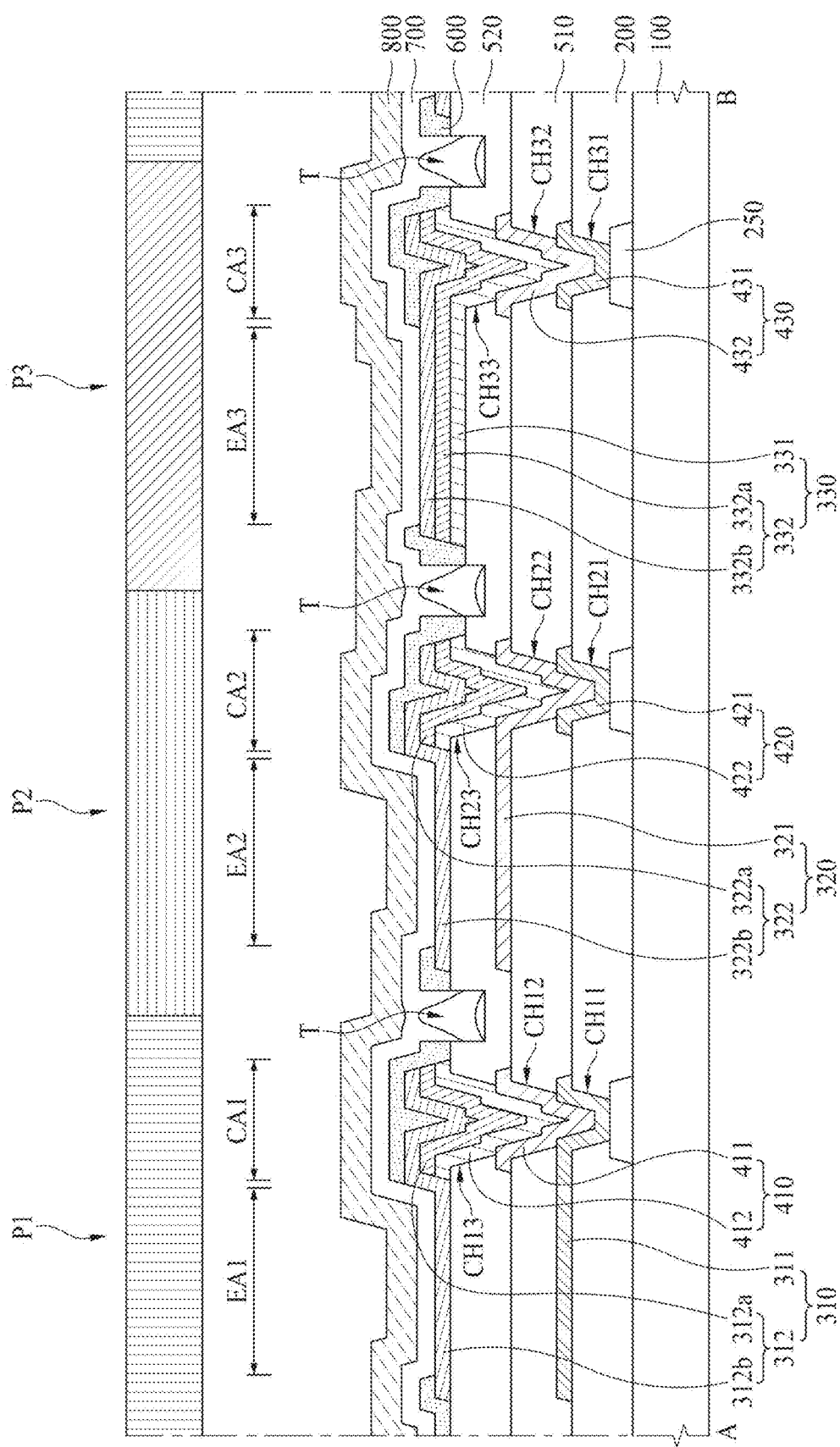
FIGS. 11A to 11C are cross-sectional views of an electroluminescent display apparatus according to an embodiment of the present disclosure.
Figure 11B:
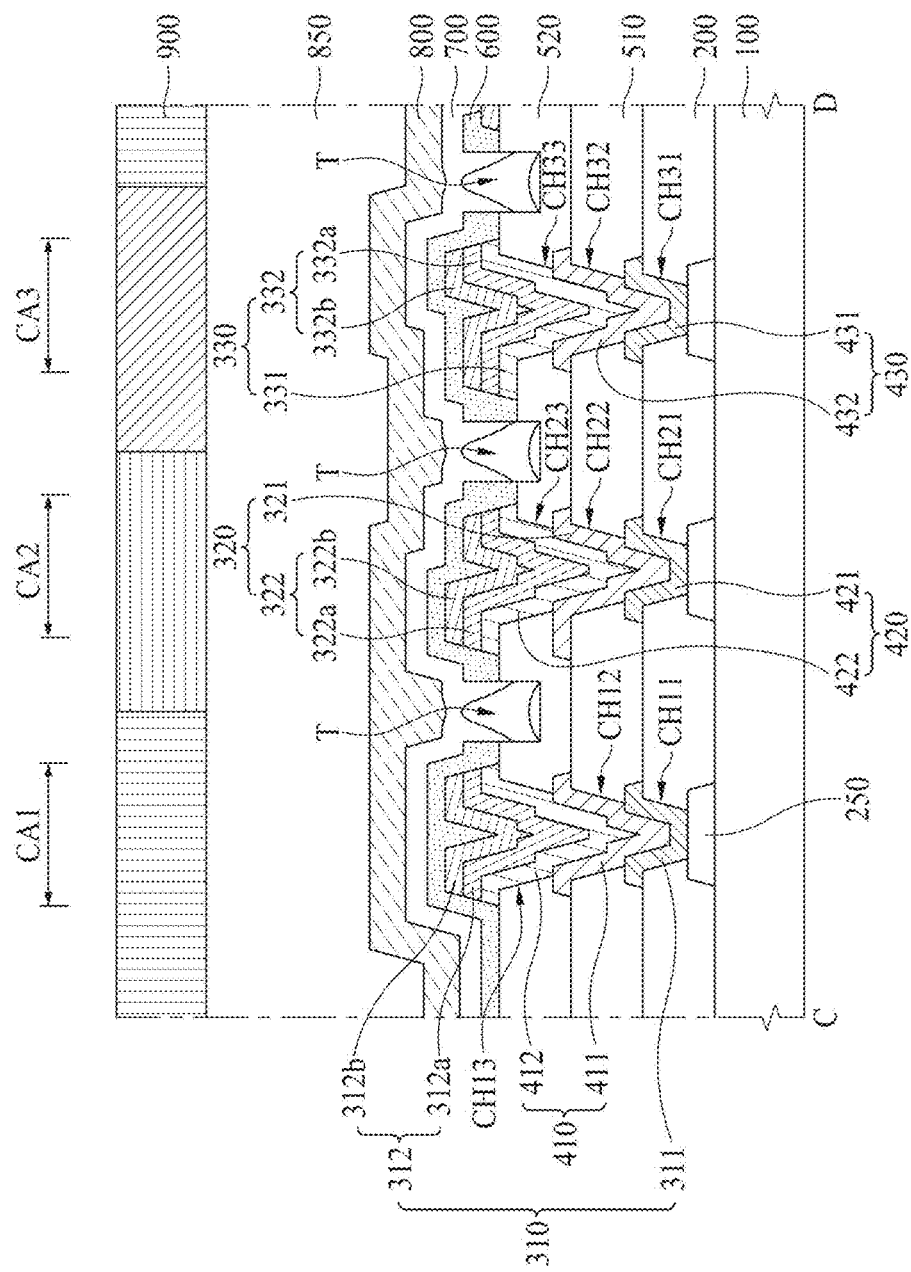
Figure 11C:
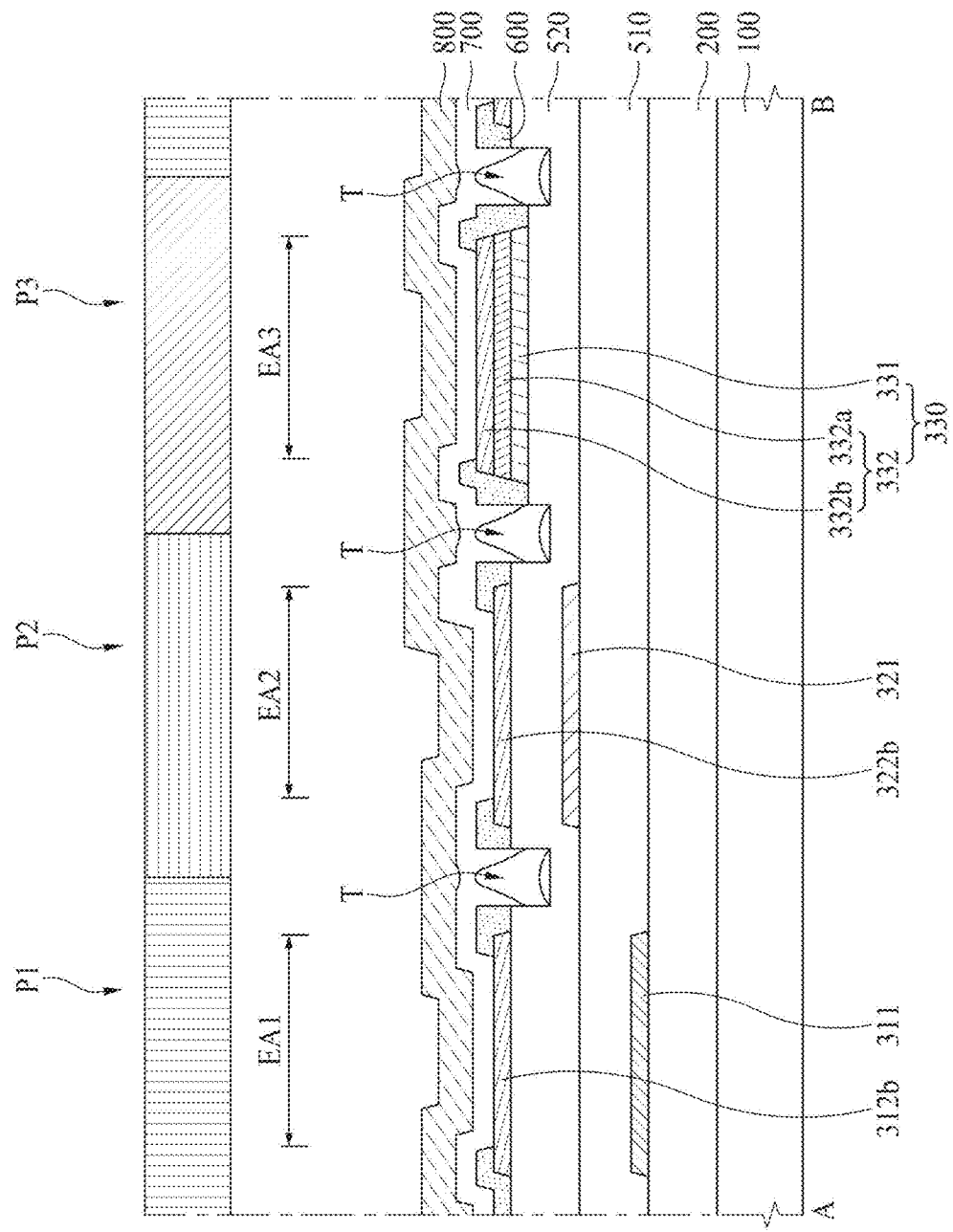

FIGS. 11A to 11C are cross-sectional views of an electroluminescent display apparatus according to an embodiment of the present disclosure.

FIG. 11A is a cross-sectional view taken along line A-B of FIG. 8A. FIG. 11B is a cross-sectional view taken along line C-D of FIG. 8A. FIG. 11C is a cross-sectional view taken along line E-F of FIG. 8A. As shown in the examples of FIGS. 11A to 11C, the electroluminescent display apparatus according to an embodiment of the present disclosure may include a substrate 100, a circuit device layer 200, a plurality of first electrodes 310 to 330, a plurality of contact electrodes 410 to 430, a plurality of insulation layers 510 to 530, a bank 600, a light-emitting layer 700, a second electrode 800, an encapsulation layer 850, and a color filter layer 900.

The substrate 100, the circuit device layer 200, the contact electrodes 410 to 430, the insulation layers 510 to 530, the bank 600, the light-emitting layer 700, the second electrode 800, the encapsulation layer 850, and the color filter layer 900 may be substantially similar to the elements described above with reference to FIGS. 8B to 8D. Thus, their detailed descriptions are not repeated. Hereinafter, only a configuration of each of the first electrodes 310 to 330 will be described.

The first electrode 310 in the first subpixel P1 may include a first lower electrode 311 and a first upper electrode 312. The first lower electrode 311 may be connected (e.g., electrically connected) to a driving TFT 250 through a first contact hole CH11 of the circuit device layer 200 in a first subpixel P1 area.

The first upper electrode 312 may be on an upper surface of a first upper contact electrode 412 configuring the first contact electrode 410 in the first subpixel P1 area, and may be directly connected to the first upper contact electrode 412. For example, the first upper electrode 312 may be formed in a two-layer structure including a first lower layer 312a and a first upper layer 312b. The first lower layer 312a may have the same pattern as that of the first upper contact electrode 412 in an upper surface of the first upper contact electrode 412. The first upper layer 312b may have a pattern differing from that of each of the first lower layer 312a, the first upper contact electrode 412, and the first lower contact electrode 411 in an upper surface of the first lower layer 312a. For example, the first upper layer 312b may extend from a first emission area EA1 to a first contact area CA1. Therefore, in the first emission area EA1, only the first upper layer 312b may be exposed and may contact the light-emitting layer 700. For example, the light-emitting layer 700 may contact only the first upper layer 312b having a particular work function in the first emission area EA1. Thus, uniform light emission may be realized. The first lower layer 312a and the first upper layer 312b may include materials having the same work function. For example, the first lower layer 312a and the first upper layer 312b may include the same materials, but are not limited thereto, and may include different materials having the same work function.

Therefore, each of the first lower electrode 311 and the first upper electrode 312 may extend from the first emission area EA1 to the first contact area CA1. For example, a thickness of the first upper electrode 312 in the first emission area EA1 may be less than that of the first upper electrode 312 in the first contact area CA1.

The first electrode 320 in the second subpixel P2 may include a second lower electrode 321 and a second upper electrode 322. The second lower electrode 321 may be connected to a second lower contact electrode 421, configuring the second contact electrode 420, through a second contact hole CH22 of the first insulation layer 510 in the second subpixel P2 area.

The second upper electrode 322 may be on an upper surface of a second upper contact electrode 422 configuring the second contact electrode 420 in the second subpixel P2 area, and may be directly connected to the second upper contact electrode 422. For example, the second upper electrode 322 may be formed in a two-layer structure including a second lower layer 322a and a second upper layer 322b. The second lower layer 322a may have the same pattern as that of the second upper contact electrode 422 in an upper surface of the second upper contact electrode 422. The second upper layer 322b may have a pattern differing from that of each of the second lower layer 322a, the second upper contact electrode 422, and the second lower contact electrode 421 in an upper surface of the second lower layer 322a. For example, the second upper layer 322b may extend from a second emission area EA2 to a second contact area CA2. Therefore, in the second emission area EA2, only the second upper layer 322b may be exposed and may contact the light-emitting layer 700. For example, the light-emitting layer 700 may contact only the second upper layer 322b having a particular work function in the second emission area EA2. Thus, uniform light emission may be realized. The second lower layer 322a and the second upper layer 322b may include materials having the same work function. For example, the second lower layer 322a and the second upper layer 322b may include the same materials, but are not limited thereto, and may include different materials having the same work function.

Therefore, each of the second lower electrode 321 and the second upper electrode 322 may extend from the second emission area EA2 to the second contact area CA2. For example, a thickness of the second upper electrode 322 in the second emission area EA2 may be less than that of the second upper electrode 322 in the second contact area CA2.

The first electrode 330 in the third subpixel P3 may include a third lower electrode 331 and a third upper electrode 332. The third lower electrode 331 may be connected to a third upper contact electrode 432, configuring the third contact electrode 430, through a third contact hole CH33 of the second insulation layer 520 in the third subpixel P3 area.

The third upper electrode 332 may be on an upper surface of the third lower electrode 331, and may be directly connected to the third lower electrode 331. For example, the third upper electrode 332 may be formed in a two-layer structure including a third lower layer 332a and a third upper layer 332b. The third lower layer 332a may have the same pattern as that of the third lower electrode 331 in an upper surface of the third lower electrode 331, and may have a pattern differing from that of each of the third upper contact electrode 432 and the third lower contact electrode 431. Therefore, the third lower electrode 331 and the third lower layer 332a may extend from a third emission area EA3 to a third contact area CA3. Also, the third upper layer 332b may have the same pattern as that of the third lower layer 332a in an upper surface of the third lower layer 332a, and may have a pattern differing from that of each of the third upper contact electrode 432 and the third lower contact electrode 431. Therefore, the third upper layer 332b may also extend from the third emission area EA3 to the third contact area CA3. Accordingly, in the third emission area EA3, only the third upper layer 332b may be exposed and may contact the light-emitting layer 700. For example, the light-emitting layer 700 may contact only the third upper layer 332b having a particular work function in the third emission area EA3. Thus, uniform light emission may be realized.

For example, the first upper layer 312b exposed at the first emission area EA1 to contact the light-emitting layer 700, the second upper layer 322b exposed at the second emission area EA2 to contact the light-emitting layer 700, and the third upper layer 332b exposed at the third emission area EA3 to contact the light-emitting layer 700 may include materials having the same work function. For example, uniform light emission may be realized in the first to third emission areas EA1 to EA3.

However, the third upper layer 332b may have a pattern differing from that of the third lower layer 332a. The third lower layer 332a and the third upper layer 332b may include materials having the same work function. For example, the third lower layer 332a and the third upper layer 332b may include the same materials, but are not limited thereto, and may include different materials having the same work function.

Therefore, each of the third lower electrode 331 and the third upper electrode 332 may extend from the third emission area EA3 to the third contact area CA3. For example, a thickness of the third upper electrode 322 in the third emission area EA3 may be equal to that of the third upper electrode 332 in the third contact area CA3.

FIGS. 12A to 12H are process cross-sectional views of an electroluminescent display apparatus according to an embodiment of the present disclosure.

Figure 12A:
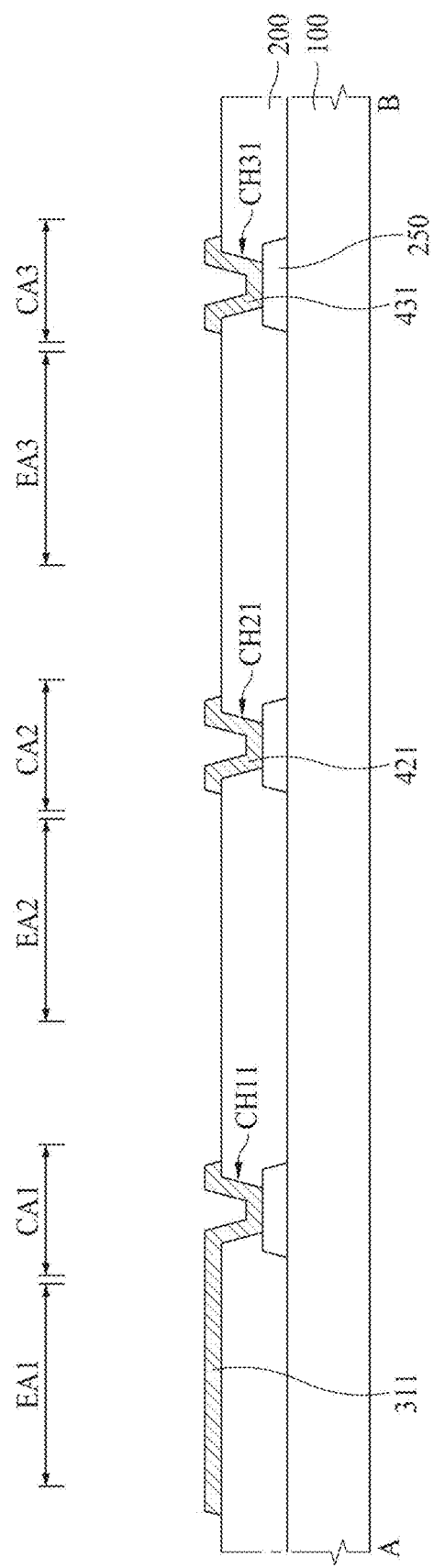
FIGS. 12A to 12H are process cross-sectional views of an electroluminescent display apparatus according to an embodiment of the present disclosure.

The examples of FIGS. 12A to 12H correspond to a cross-sectional view taken along line A-B of FIG. 8A. First, as shown in FIG. 12A, a circuit device layer 200 including a driving TFT 250 may be provided on a substrate 100; a plurality of first contact holes CH11, CH21, and CH31 may be provided in the circuit device layer 200 in respective subpixels P1 to P3; and a first lower electrode 311, a second lower contact electrode 421, and a third lower contact electrode 431 may be provided on the circuit device layer 200. The second lower contact electrode 421 and the third lower contact electrode 431 may be connected to a source terminal or a drain terminal of the driving TFT 250 through the first contact holes CH11, CH21, and CH31.

Figure 12B:
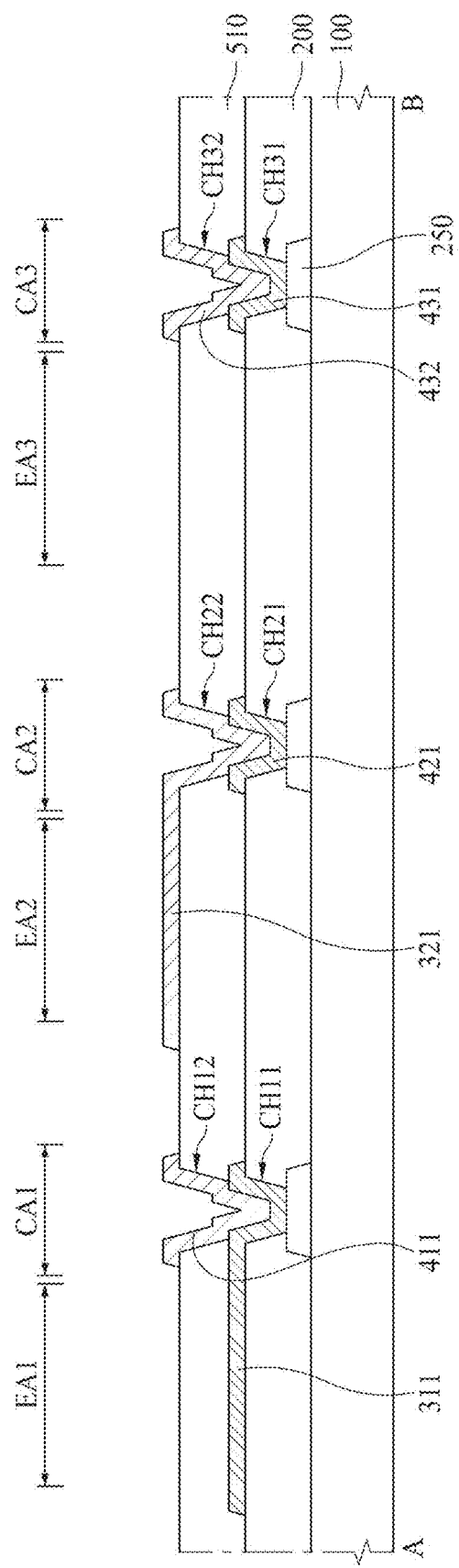

Subsequently, as shown in the example of FIG. 12B, a first insulation layer 510 may be provided on the first lower electrode 311, the second lower contact electrode 421, and the third lower contact electrode 431; a plurality of second contact holes CH12, CH22, and CH32 may be provided in the first insulation layer 510; and a first lower contact electrode 411, a second lower electrode 321, and a third upper contact electrode 432 may be provided on the first insulation layer 510. The first lower contact electrode 411 may be connected to the first lower electrode 311 through the second contact hole CH12, the second lower electrode 321 may be connected to the second lower contact electrode 421 through the second contact hole CH22, and the third upper contact electrode 432 may be connected to the third lower contact electrode 431 through the second contact hole CH32.

Figure 12C:
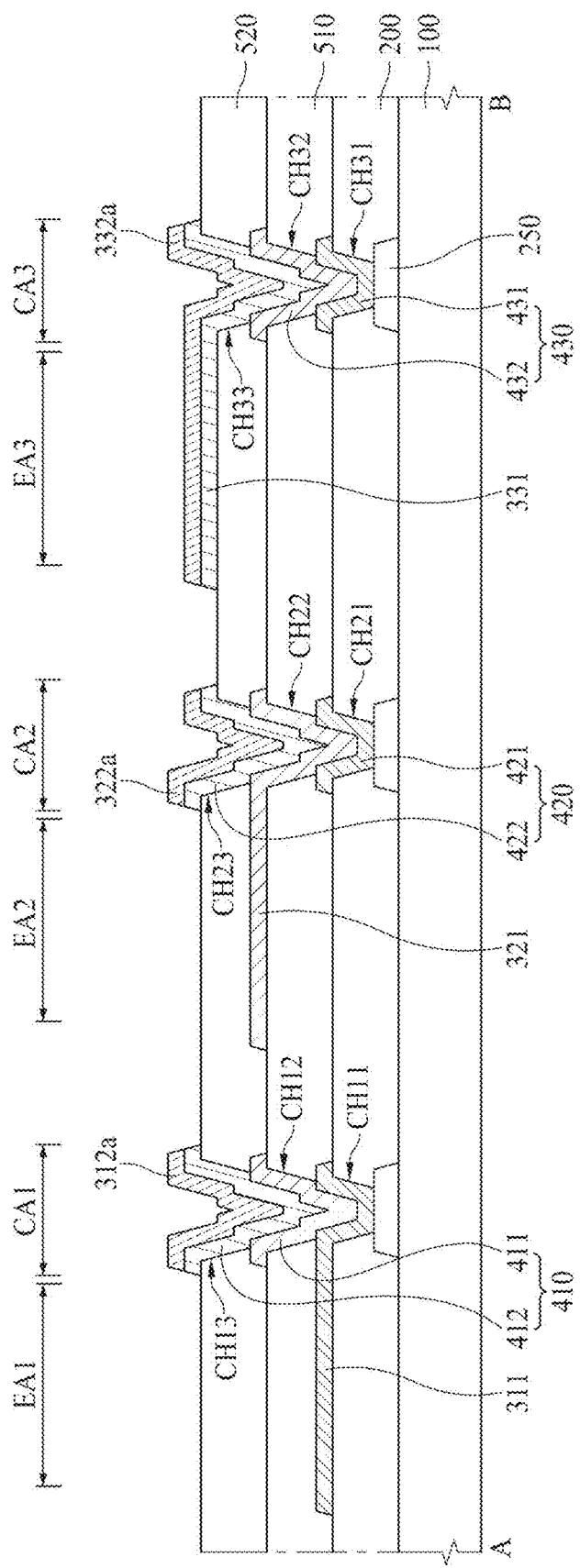

Subsequently, as shown in the example of FIG. 12C, a second insulation layer 520 may be provided on the first lower contact electrode 411, the second lower electrode 321, and the third upper contact electrode 432; and a plurality of third contact holes CH13, CH23, and CH33 may be provided in the second insulation layer 520. Subsequently, a first upper contact electrode 412 and a first lower layer 312a may be simultaneously provided on the second insulation layer 520, and may have the same pattern; a second upper contact electrode 422 and a second lower layer 322a may be simultaneously provided, and may have the same pattern; and a third lower electrode 331 and a third lower layer 332a may be simultaneously provided, and may have the same pattern. The first upper contact electrode 412 may be connected to the first lower contact electrode 411 through the third contact hole CH13, the second upper contact electrode 422 may be connected to the second lower electrode 321 through the third contact hole CH23, and the third lower electrode 331 may be connected to the third upper contact electrode 432 through the third contact hole CH33.

Figure 12D:
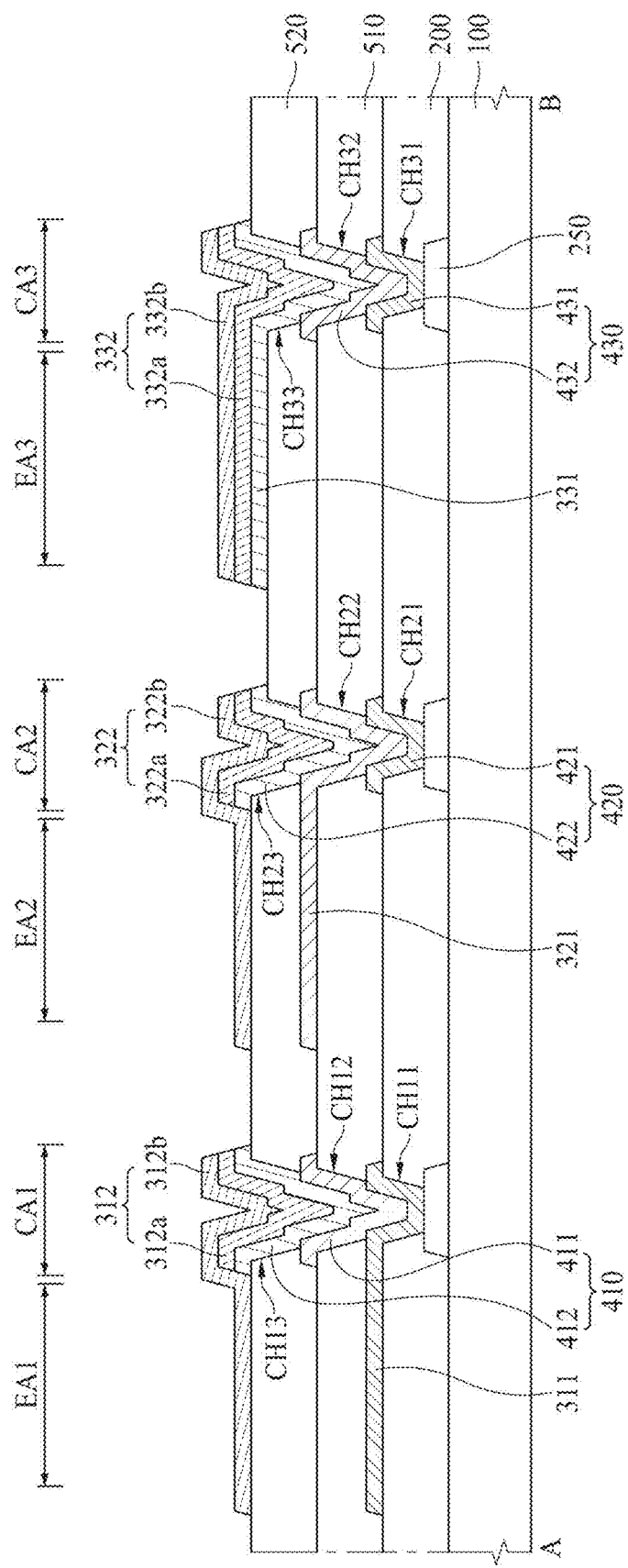
Figure 12E:
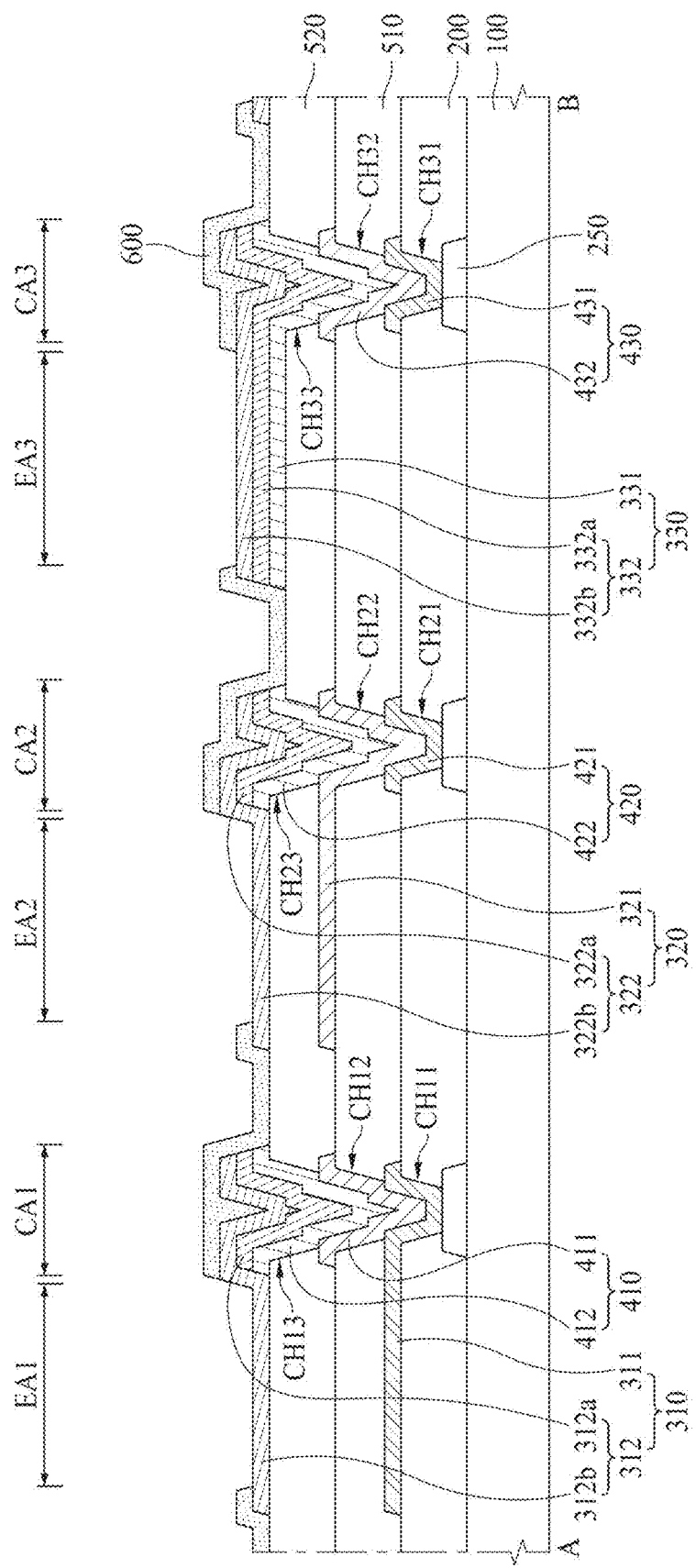

Subsequently, as shown in the example of FIG. 12D, a first upper electrode 312 may be finished by provided a first upper layer 312b on the first lower layer 312a, a second upper electrode 322 may be finished by provided a second upper layer 322b on the second lower layer 322a, and a third upper electrode 332 may be finished by provided a third upper layer 332a on the third lower layer 332a. Subsequently, as shown in the example of FIG. 12E, a bank 600 may be provided on the first upper layer 312b, the second upper layer 322b, and the third upper layer 332b. The bank 600 may cover both ends of each of the first upper electrode 312, the second upper electrode 322, and the third upper electrode 332.

Figure 12F:
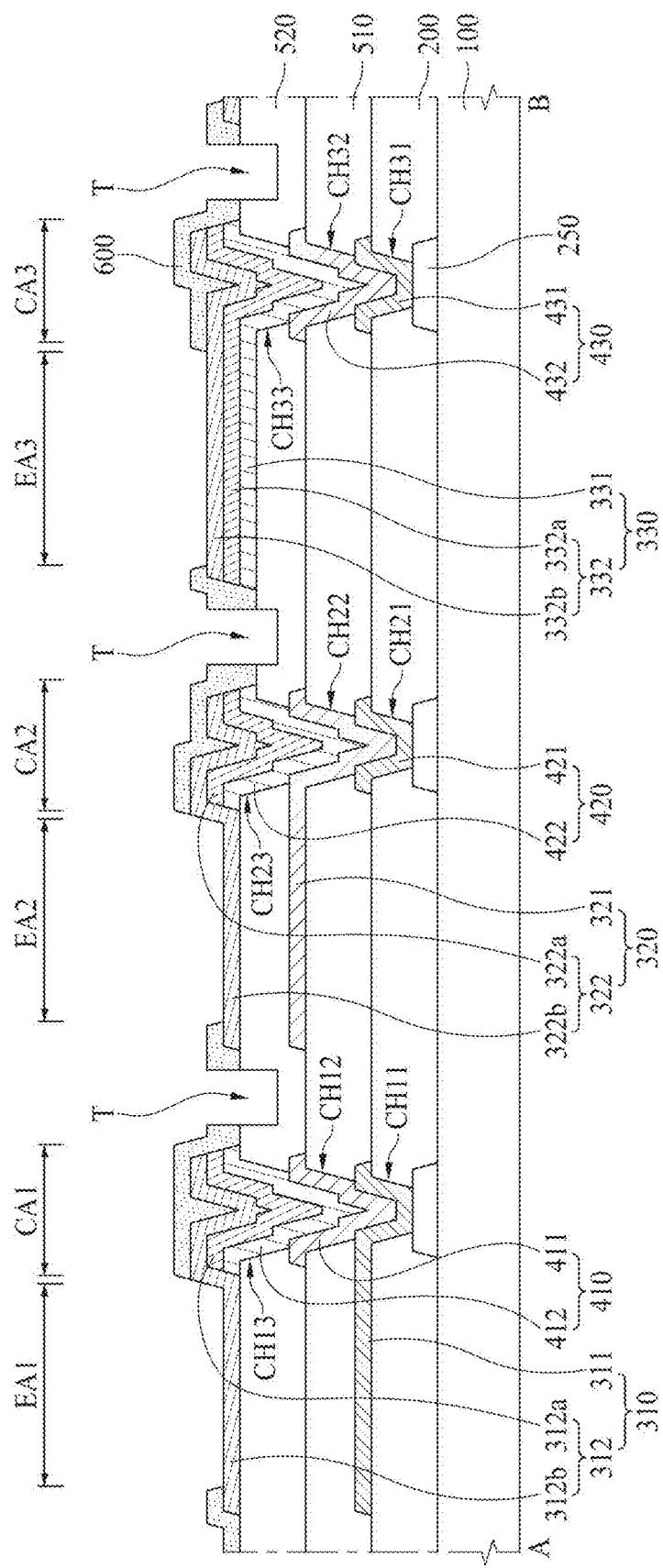

Subsequently, as shown in the example of FIG. 12F, a trench T may be provided in the bank 600 and the second insulation layer 520 in a boundary region between the subpixels P1 to P3. The trench T may be provided only in the bank 600. Alternatively, the trench T may extend to the bank 600 and the third insulation layer 530, and moreover, may extend to an inner portion of the second insulation layer 520 thereunder, an inner portion of the first insulation layer 510 thereunder, or an inner portion of the circuit device layer 200 thereunder.

Figure 12G:
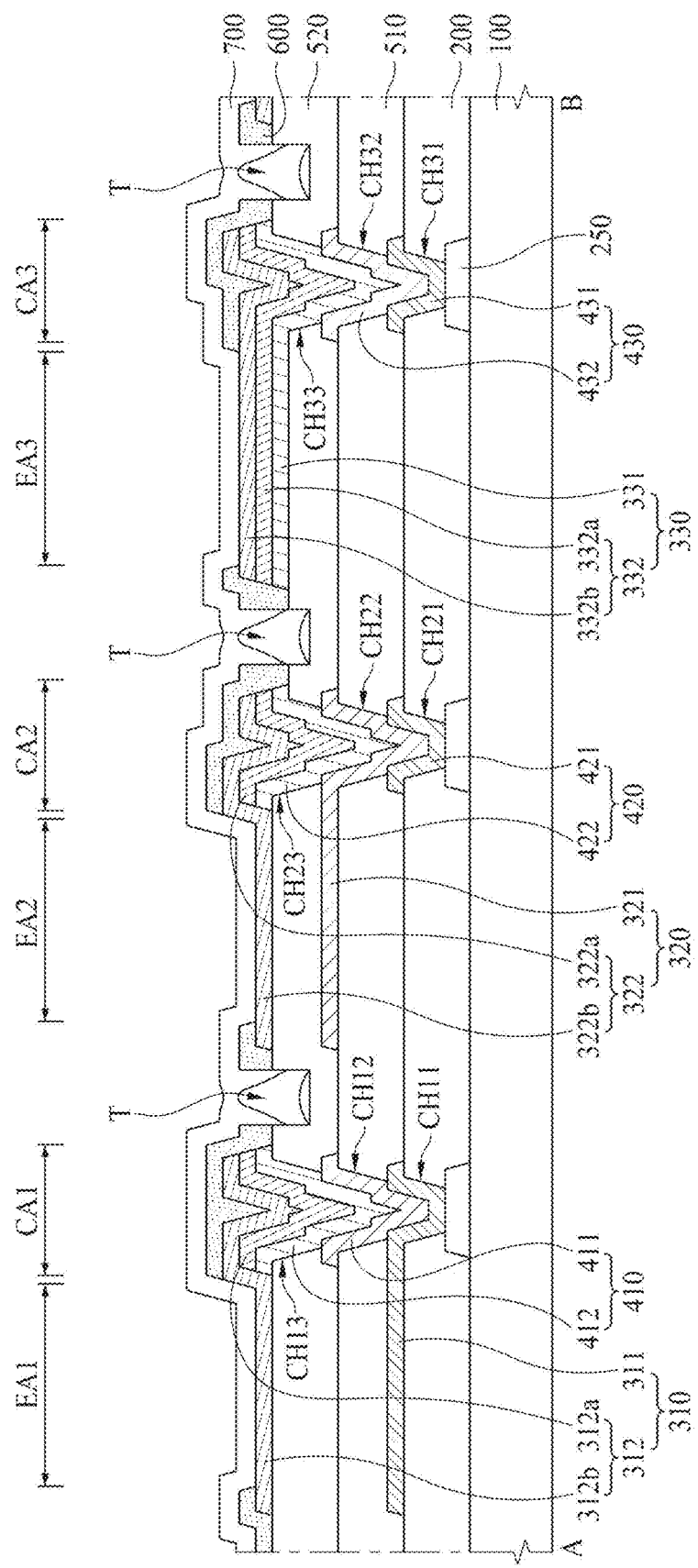
Figure 12H:
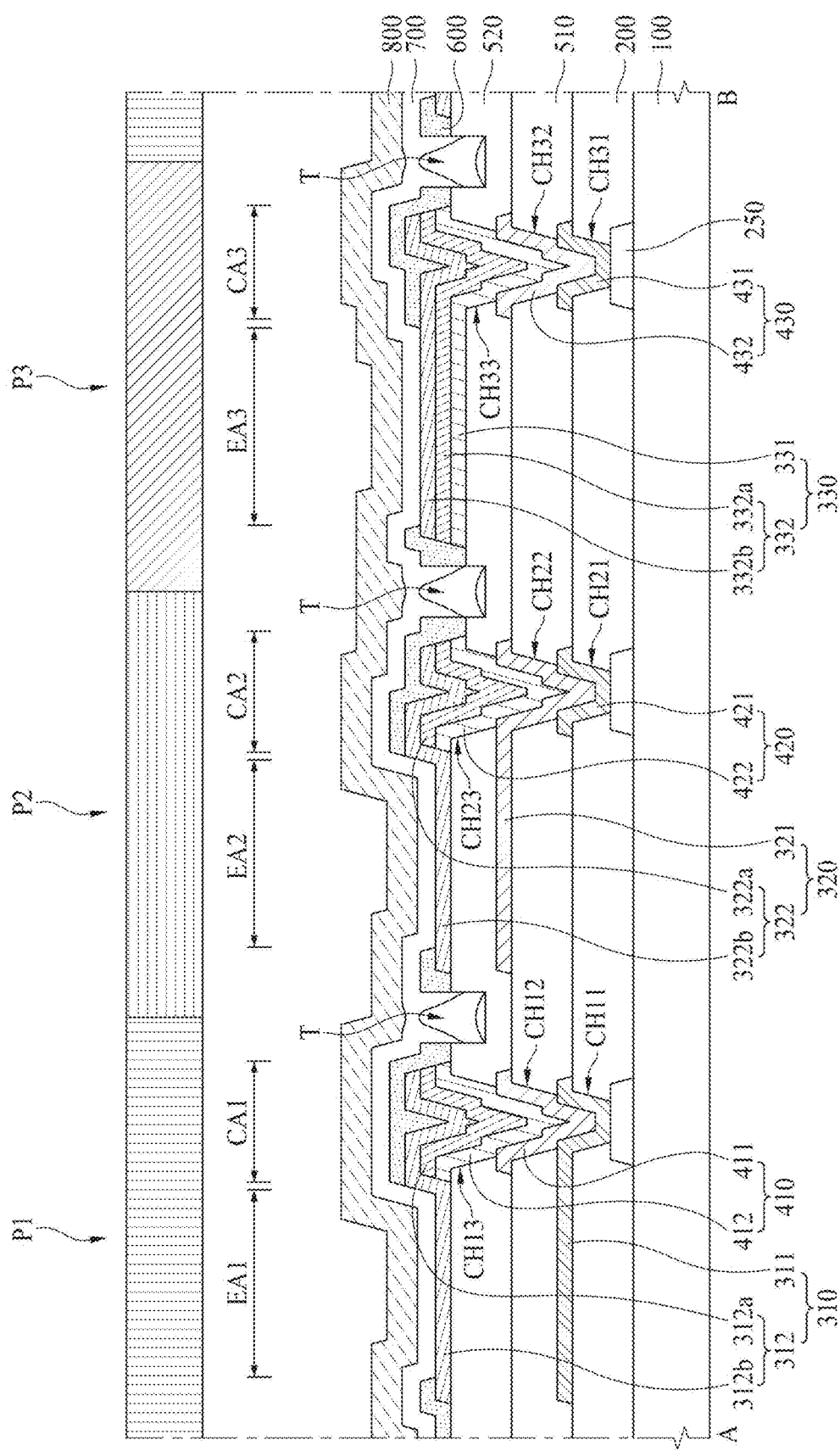

Subsequently, as shown in the example of FIG. 12G, a light-emitting layer 700 may be provided on the bank 600. Subsequently, as shown in the example of FIG. 12H, a second electrode 800 may be provided on the light-emitting layer 700, an encapsulation layer 850 may be provided on the second electrode 800, and a color filter layer 900 may be provided on the encapsulation layer 850.

In an electroluminescent display apparatus manufactured through the processes of the examples of FIGS. 12A to 12H, emission efficiency may be not reduced, even if a process error, such as mask misalignment, occurs. This will be described below with reference to the example of FIG. 13.

Figure 13:
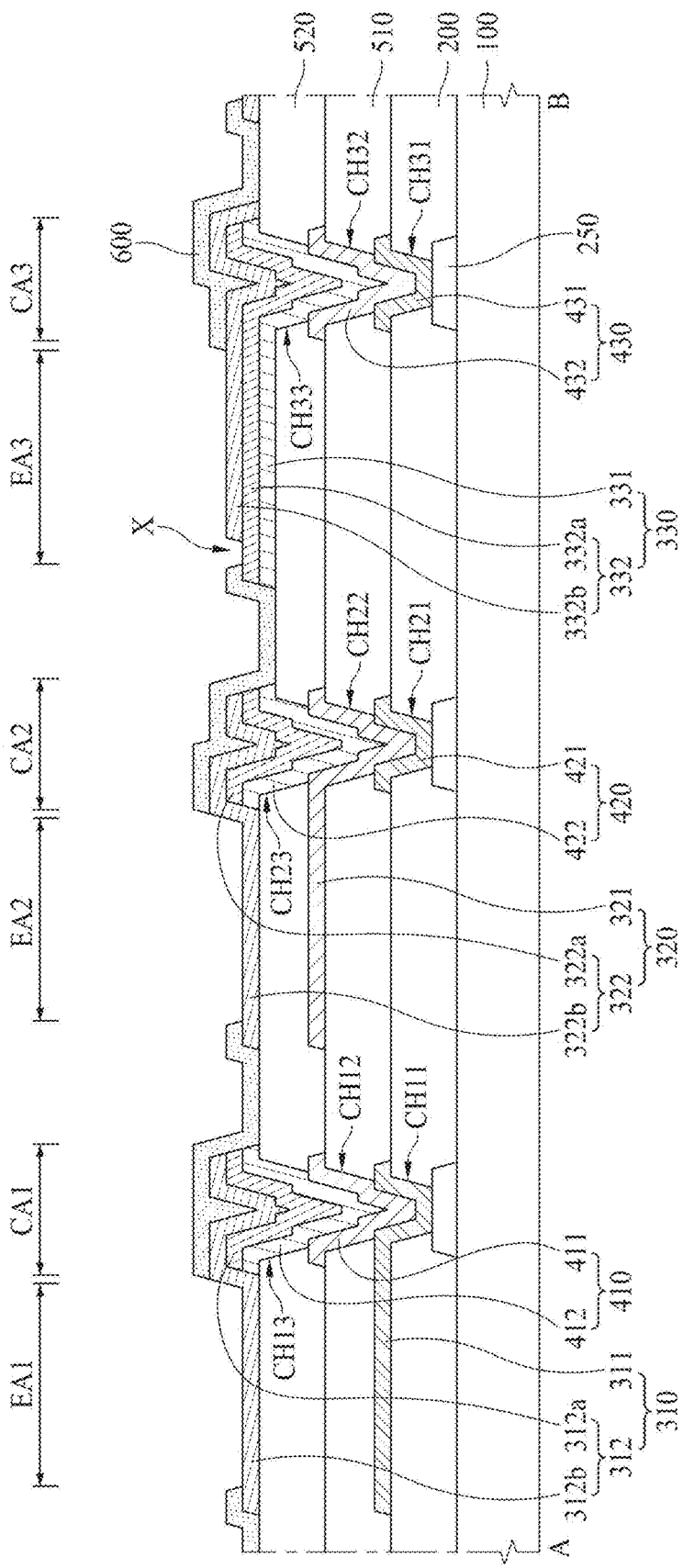
FIG. 13 is a cross-sectional view of an electroluminescent display apparatus according to an embodiment of the present disclosure.

FIG. 13 is a cross-sectional view of an electroluminescent display apparatus according to an embodiment of the present disclosure.

FIG. 13 shows an example in which a third upper layer 332b may be not formed to have the same pattern as that of a third lower layer 332a, e.g., due to a process error, such as mask misalignment, in the above-described process of the example of FIG. 12D. As such, the bank 600 does not cover one end of the third upper layer 332b in the above-described process of the example of FIG. 12E.

As illustrated in the example of FIG. 13, when the bank 600 does not cover the one end of the third upper layer 332b, a region X in which a light-emitting layer 700 directly contacts the third lower layer 332a may occur. In an embodiment of the present disclosure, a third upper electrode 332 may be configured by a combination of the third lower layer 332a and the third upper layer 332b. Therefore, although the bank 600 may not cover one end of the third upper layer 332b, the bank 600 may cover one end of the third lower layer 332a. Thus, the light-emitting layer 700 may not directly contact the third lower electrode 331.

Therefore, the light-emitting layer 700 may contact the third upper electrode 332, functioning as an anode in the region X, but may not contact the third lower electrode 331 thereunder. Thus, light may be emitted in the region X, thereby solving a problem in which emission efficiency may be reduced as in the above-described embodiment.

Figure 14:
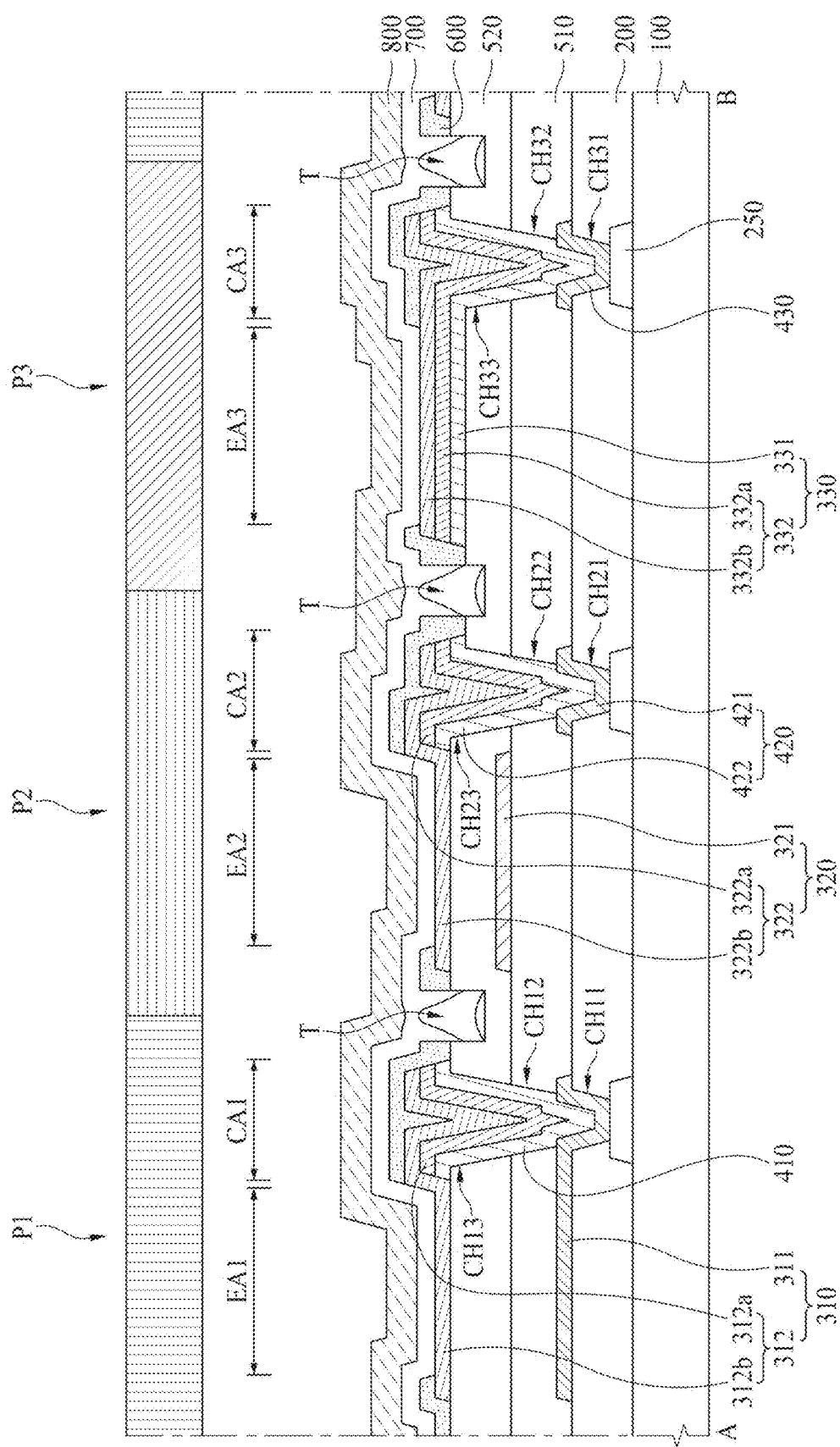
FIG. 14 is a cross-sectional view of an electroluminescent display apparatus according to an embodiment of the present disclosure.

FIG. 14 is a cross-sectional view of an electroluminescent display apparatus according to an embodiment of the present disclosure.

FIG. 14 is an example of a cross-sectional view taken along line A-B of the example of FIG. 8A. The electroluminescent display apparatus of the example of FIG. 14 differs from the electroluminescent display apparatus of the example of FIG. 11A in a structure of each of first electrodes 310 to 330 and contact electrodes 410 to 430. Hereinafter, elements differing from the elements described above with reference to FIG. 11A will be described.

As shown in FIG. 14, the first electrodes 310 to 330 and the contact electrodes 410 to 430 may be patterned in the respective subpixels P1 to P3 on a circuit device layer 200. The first electrode 310 in the first subpixel P1 may include a first lower electrode 311 and a first upper electrode 312. The first lower electrode 311 and the first upper electrode 312 may extend from a first emission area EA1 to a first contact area CA1.

The first lower electrode 311 may be connected to a driving TFT 250 through a first contact hole CH11 of the circuit device layer 200 in the first subpixel P1 area. The first upper electrode 312 may be connected to the first contact electrode 410 in the first subpixel P1 area. The first contact electrode 410 in the first subpixel P1 may include one single contact layer. The first contact electrode 410 may be connected to the first lower electrode 311 through a second contact hole CH12 in a first insulation layer 510 and a third contact hole CH3 in a second insulation layer 520 in the first subpixel P1 area.

The first electrode 320 in the second subpixel P2 may include a second lower electrode 321 and a second upper electrode 322. The second lower electrode 321 may be in a second emission area EA2, and may not extend to a second contact area CA2. The second upper electrode 322 may extend from the second emission area EA2 to the second contact area CA2.

The second lower electrode 321 may have an island structure on the first insulation layer 510. For example, the second lower electrode 321 may not be connected to the second contact electrode 420, the second upper electrode 322, and the driving TFT 250. The second upper electrode 322 may be connected to a second upper contact electrode 422, configuring the second contact electrode 420, in the second subpixel P2 area.

The second contact electrode 420 in the second subpixel P2 may include a second lower contact electrode 421 and a second upper contact electrode 422. The second lower contact electrode 421 may be connected to the driving TFT 250 through a first contact hole CH21 of the circuit device layer 200 in the second subpixel P2 area. The second upper contact electrode 422 may be connected to the second lower electrode 321 through a second contact hole CH22 of the first insulation layer 510 and a third contact hole CH23 of the second insulation layer 520, each in the second subpixel P2 area. In the second subpixel P2, the second lower electrode 321 may have an island structure, and may not be connected to another conductive material, and the second upper electrode 322 may be connected to the driving TFT 250 through the second lower contact electrode 421 and the second upper contact electrode 422.

The first electrode 330 in the third subpixel P3 may include a third lower electrode 331 and a third upper electrode 332. The third lower electrode 331 and the third upper electrode 332 may extend from a third emission area EA3 to a third contact area CA3.

The third lower electrode 331 may be connected to the third contact electrode 430 through a second contact hole CH32 of the first insulation layer 510 and a third contact hole CH33 of the second insulation layer 520, each in the third subpixel P3 area. The third upper electrode 332 may be connected to the third lower electrode 331 in the third subpixel P3 area.

The third contact electrode 430 in the third subpixel P3 may include one single contact layer. The third contact electrode 430 may be connected to the driving TFT 250 through a first contact hole CH31 of the circuit device layer 200 in the third subpixel P3 area.

In the above-described example of FIG. 11A, the second contact holes CH12, CH22, and CH32 in the first insulation layer 510 may not communicate or connect with the second contact holes CH13, CH23, and CH33 in the second insulation layer 520. On the other hand, in the structure of FIG. 14, the second contact holes CH12, CH22, and CH32 in the first insulation layer 510 may communicate or connect with the second contact holes CH13, CH23, and CH33 in the second insulation layer 520.

Therefore, in the structure of FIG. 14, the second lower electrode 321 of the first electrode 320 may not overlap the second and third contact holes CH22 and CH23 of the second contact area CA2 to form the second and third contact holes CH22 and CH23, which may rectilinearly and simultaneously pass through the first and second insulation layers 510 and 520 in the second subpixel P2. Therefore, the second lower electrode 321 of the first electrode 320 may not overlap the second contact electrode 420 of the second contact area CA2 in the second subpixel P2. Accordingly, as compared to the example of FIG. 11A, the example of FIG. 14 may decrease the number of processes of forming contact holes.

Figure 15:
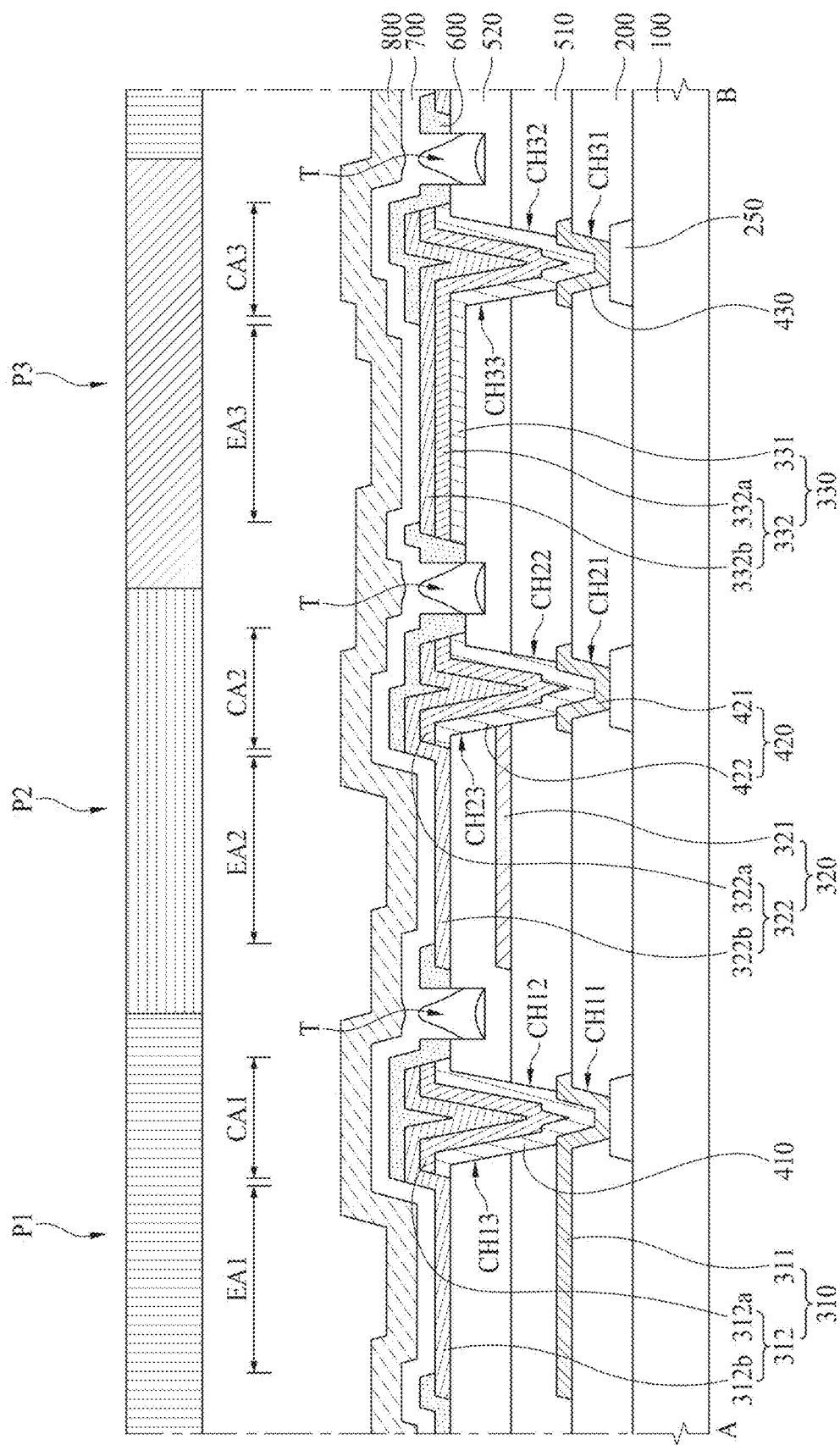
FIG. 15 is a cross-sectional view of an electroluminescent display apparatus according to an embodiment of the present disclosure.

FIG. 15 is a cross-sectional view of an electroluminescent display apparatus according to an embodiment of the present disclosure.

FIG. 15 is an example of a cross-sectional view taken along line A-B of the example of FIG. 8A. The electroluminescent display apparatus of the example of FIG. 15 differs from the electroluminescent display apparatus of the example of FIG. 14 in a configuration of a second lower electrode 321 of a first electrode 310 in a second subpixel P2.

In the above-described example of FIG. 14, the second lower electrode 321 of the first electrode 320 in the second subpixel P2 may have an island structure on the first insulation layer 510. For example, the second lower electrode 321 may not overlap the second contact area CA2, and thus, may not be connected to the second contact electrode 420, the second upper electrode 322, and the driving TFT 250.

On the other hand, in the example of FIG. 15, a second lower electrode 321 of a first electrode 320 provided in a second subpixel P2 may overlap a second contact area CA2, and thus, may be connected to a second contact electrode 420 (for example, a side surface of a second upper contact electrode 422 of a second contact electrode 420). In FIG. 15, a second contact hole CH22, which may simultaneously pass through a first insulation layer 510 and a second insulation layer 520, may be in a second subpixel P2. As compared to the example of FIG. 14, the example of FIG. 15 may increase an area of the second lower electrode 321 of the first electrode 320 in the second subpixel P2, thereby enhancing light efficiency.

Figure 16A:
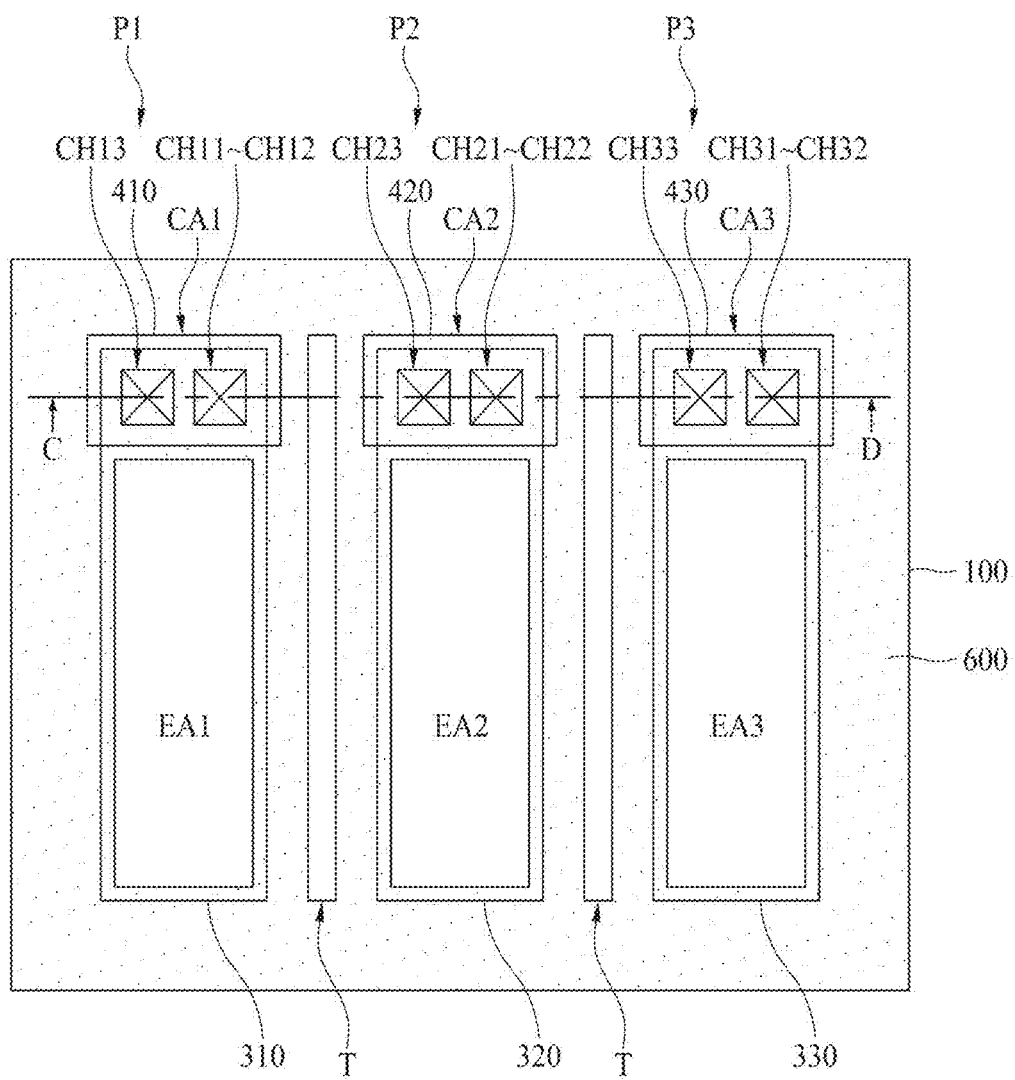
FIG. 16A is a plan view of an electroluminescent display apparatus according to an embodiment of the present disclosure.
Figure 16B:
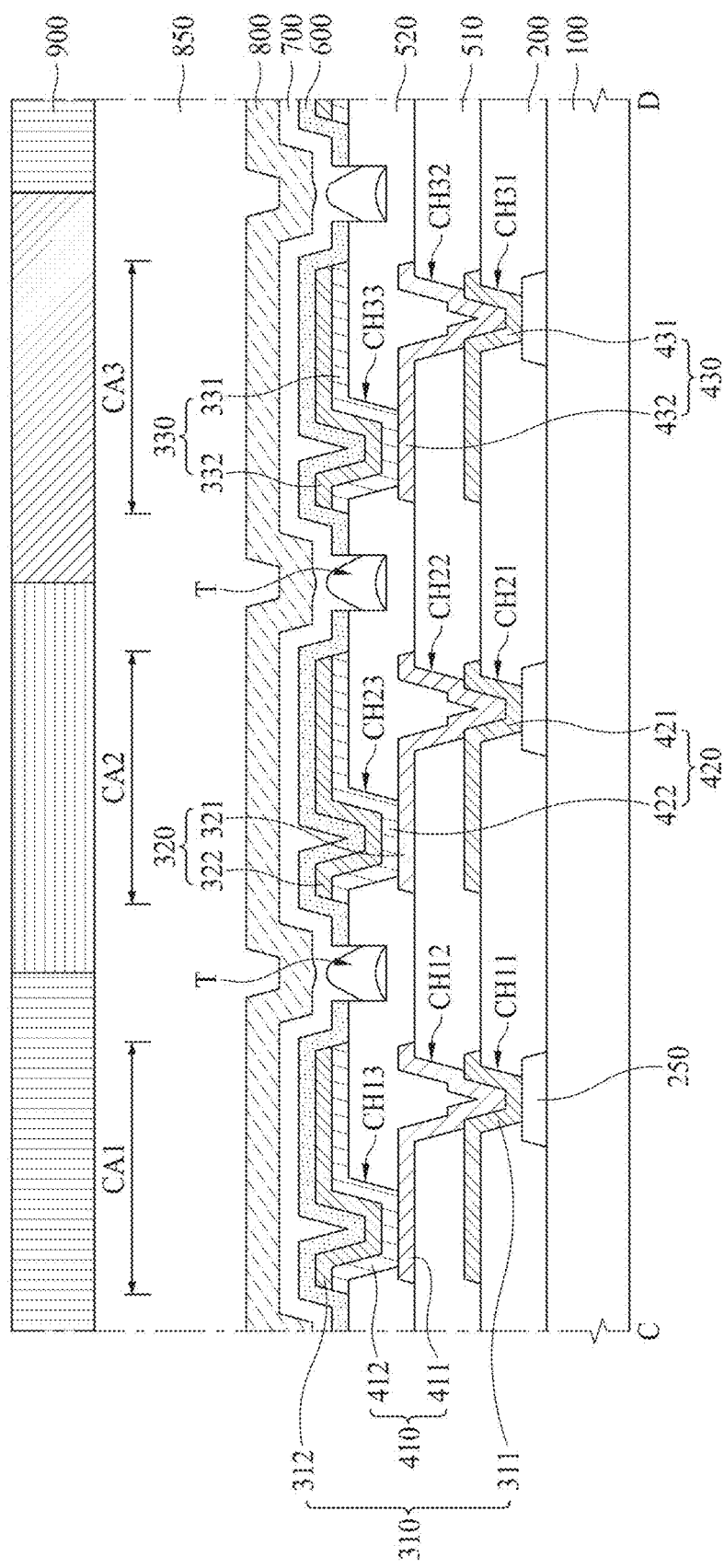
FIG. 16B is a cross-sectional view taken along line C-D of FIG. 16A.

FIG. 16A is a plan view of an electroluminescent display apparatus according to an embodiment of the present disclosure. FIG. 16B is a cross-sectional view taken along line C-D of FIG. 16A.

The electroluminescent display apparatus of each of the examples of FIGS. 16A and 16B differs from the electroluminescent display apparatus of each of the examples of FIGS. 8A to 8D in that a configuration of each of a plurality of contact holes CH11 to CH13, CH21 to CH23, and CH31 to CH33 may be modified. With reference to the examples of FIGS. 8A to 8D described above, the first contact hole CH11, the second contact hole CH12, and the third contact hole CH13 of the first subpixel P1 may overlap one another; the first contact hole CH21, the second contact hole CH22, and the third contact hole CH23 of the second subpixel P2 may overlap one another; and the first contact hole CH31, the second contact hole CH32, and the third contact hole CH33 of the third subpixel P3 may overlap one another. On the other hand, with reference to the examples of FIGS. 16A and 16B, a first contact hole CH11 may overlap a second contact hole CH12, but may not overlap a third contact hole CH13 in a first subpixel P1; a first contact hole CH21 may overlap a second contact hole CH22, but may not overlap a third contact hole CH23 in a second subpixel P2; and a first contact hole CH31 may overlap a second contact hole CH32, but may not overlap a third contact hole CH33 in a third subpixel P3.

Although not shown, the first contact hole CH11 may overlap the third contact hole CH13, but may not overlap the second contact hole CH12 in the first subpixel P1; the first contact hole CH21 may overlap the third contact hole CH23, but may not overlap the second contact hole CH22 in the second subpixel P2; and the first contact hole CH31 may overlap the third contact hole CH33, but may not overlap the second contact hole CH32 in the third subpixel P3. None of the first contact hole CH11, the second contact hole CH12, and the third contact hole CH13 may overlap in the first subpixel P1; none of the first contact hole CH21, the second contact hole CH22, and the third contact hole CH23 may overlap in the second subpixel P2; and none of the first contact hole CH31, the second contact hole CH32, and the third contact hole CH33 may overlap in the third subpixel P3.

As compared to a case in which all of the first contact holes CH11, CH21, and CH31, the second contact holes CH12, CH22, and CH32, and the third contact holes CH13, CH23, and CH33 overlap, when at least one contact hole does not overlap the other contact holes, a process of forming the contact holes CH11 to CH13, CH21 to CH23, and CH31 to CH33 may be more easily performed, and a size of each of the contact holes CH11 to CH13, CH21 to CH23, and CH31 to CH33 may be reduced.

A structure of each of the contact holes CH11 to CH13, CH21 to CH23, and CH31 to CH33 illustrated in the example of FIG. 16A may be applied to the structure of each of the examples of FIGS. 1 and 4A described above. For example, in FIGS. 1 and 4A, fourth contact holes CH14, CH24, and CH34 may or may not overlap at least one of the first contact holes CH11, CH21, and CH31, the second contact holes CH12, CH22, and CH32, and the third contact holes CH13, CH23, and CH33 in the same subpixels P1 to P3.

Figure 17:
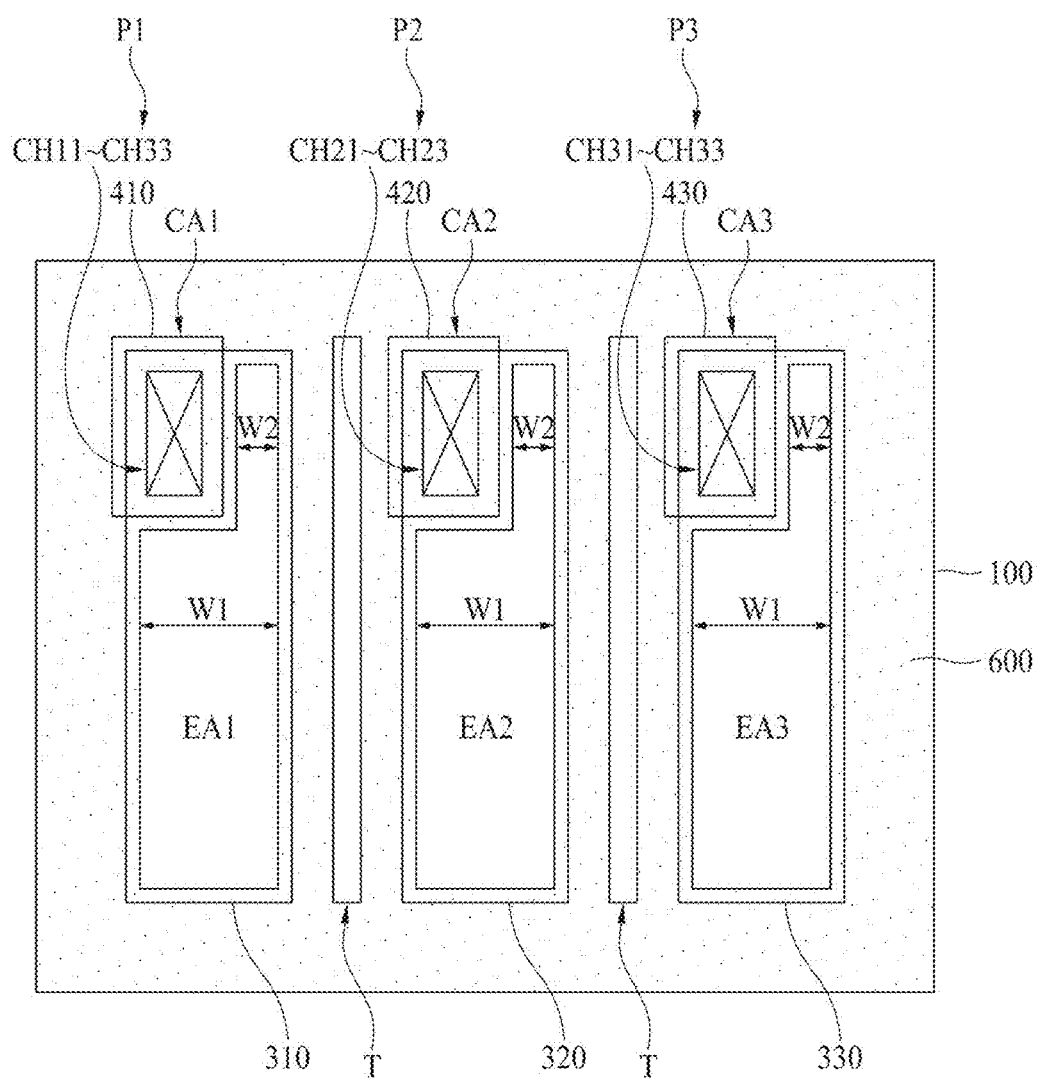
FIG. 17 is a plan view of an electroluminescent display apparatus according to an embodiment of the present disclosure.

FIG. 17 is a plan view of an electroluminescent display apparatus according to an embodiment of the present disclosure.

The electroluminescent display apparatus of the FIG. 17 example differs from the electroluminescent display apparatus of the FIG. 8A example in that a structure of each of a plurality of emission areas EA1 to EA3 and a plurality of contact areas CA1 to CA3 may be modified.

With reference to FIG. 8A, only one side of the first contact area CA1 may face the first emission area EA1, only one side of the second contact area CA2 may face the second emission area EA2, and only one side of the third contact area CA3 may face the third emission area EA3. On the other hand, with reference to FIG. 17, two sides (for example, a lower side and a right side) of a first contact area CA1 may face a first emission area EA1, two sides (for example, a lower side and a right side) of a second contact area CA2 may face a second emission area EA2, and two sides (for example, a lower side and a right side) of a third contact area CA3 may face a third emission area EA3.

Therefore, in FIG. 17, the first to third emission areas EA1 to EA3 may each include a first portion that may be under the first to third contact areas CA1 to CA3, and may have a first width W1 that may be relatively wide; and a second portion that may be disposed to the right of the first to third contact areas CA1 to CA3, and may have a second width W2 that may be relatively narrow.

In FIG. 8A, when the contact areas CA1 to CA3 are provided in a long structure in a widthwise direction at an upper position of the emission areas EA1 to EA3, there may be a limitation in reducing a widthwise-direction width of each of the contact areas CA1 to CA3. Even if the widthwise-direction width of each of the contact areas CA1 to CA3 is less than a widthwise-direction width of each of the emission areas EA1 to EA3, when an empty space next to each of the contact areas CA1 to CA3 is small, it may be difficult to form the emission areas EA1 to EA3 next to the contact areas CA1 to CA3. As such, even is the widthwise-direction width of each of the contact areas CA1 to CA3 is greatly or maximally reduced, it may be difficult to increase a size of each of the emission areas EA1 to EA3.

On the other hand, in FIG. 17, when contact areas CA1 to CA3 are provided in a long structure, emission areas EA1 to EA3 may be formed to the right of the contact areas CA1 to CA3. For example, when a lengthwise-direction width of each of the contact areas CA1 to CA3 is reduced, a size of each of the emission areas EA1 to EA3 may increase by a small amount, and an aperture ratio may be enhanced.

In a first subpixel P1, an upper side and a left side of a first contact electrode 410 may be mismatched or may match with an upper side and a left side of a first electrode 310. Similarly, in a second subpixel P2, an upper side and a left side of a second contact electrode 420 may be mismatched or may match with an upper side and a left side of a first electrode 320. Also, in a third subpixel P3, an upper side and a left side of a third contact electrode 430 may be mismatched or may match with an upper side and a left side of a first electrode 330.

The contact areas (for example, first to third contact areas) CA1 to CA3 may be respectively disposed in right upper ends of the emission areas (for example, first to third emission areas) EA1 to EA3. Thus, a lower side and a left side of the first contact area CA1 may face the first emission area EA1, a lower side and a left side of the second contact area CA2 may face the second emission area EA2, and a lower side and a left side of the third contact area CA3 may face the third emission area EA3. A structure of each of the contact areas CA1 to CA3 and the emission areas EA1 to EA3 illustrated in the example of FIG. 17 may be applied to the structure of each of the examples of FIGS. 1 and 4A described above.

Figure 18:
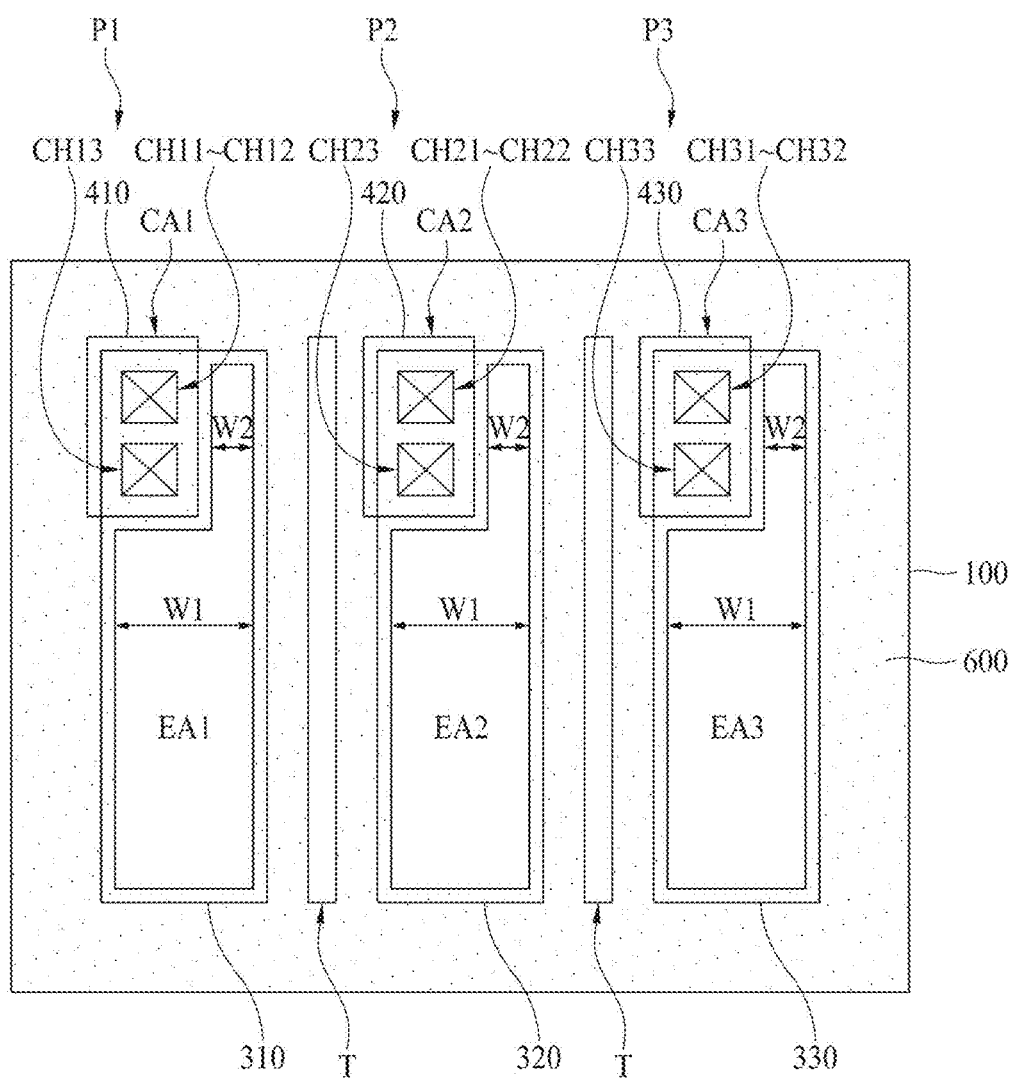
FIG. 18 is a cross-sectional view of an electroluminescent display apparatus according to an embodiment of the present disclosure.

FIG. 18 is a cross-sectional view of an electroluminescent display apparatus according to an embodiment of the present disclosure.

The electroluminescent display apparatus of example of FIG. 18 differs from the electroluminescent display apparatus of example of FIG. 17 in that a configuration of each of a plurality of contact holes CH11 to CH13, CH21 to CH23, and CH31 to CH33 may be modified.

With reference to example of FIG. 18, a first contact hole CH11 may overlap a second contact hole CH12, but may not overlap a third contact hole CH13 in a first subpixel P1; a first contact hole CH21 may overlap a second contact hole CH22, but may not overlap a third contact hole CH23 in a second subpixel P2; and a first contact hole CH31 may overlap a second contact hole CH32 but may not overlap a third contact hole CH33 in a third subpixel P3. Although not shown, the first contact hole CH11 may overlap the third contact hole CH13, but may not overlap the second contact hole CH12 in the first subpixel P1; the first contact hole CH21 may overlap the third contact hole CH23, but may not overlap the second contact hole CH22 in the second subpixel P2; and the first contact hole CH31 may overlap the third contact hole CH33, but may not overlap the second contact hole CH32 in the third subpixel P3.

Moreover, none of the first contact hole CH11, the second contact hole CH12, and the third contact hole CH13 may overlap in the first subpixel P1; none of the first contact hole CH21, the second contact hole CH22, and the third contact hole CH23 may overlap in the second subpixel P2; and none of the first contact hole CH31, the second contact hole CH32, and the third contact hole CH33 may overlap in the third subpixel P3. As compared to a case in which all of the first contact holes CH11, CH21, and CH31, the second contact holes CH12, CH22, and CH32, and the third contact holes CH13, CH23, and CH33 overlap, when at least one contact hole does not overlap the other contact holes, a process of forming the contact holes CH11 to CH13, CH21 to CH23, and CH31 to CH33 may be more easily performed, and a size of each of the contact holes CH11 to CH13, CH21 to CH23, and CH31 to CH33 may be reduced.

Figure 19A:
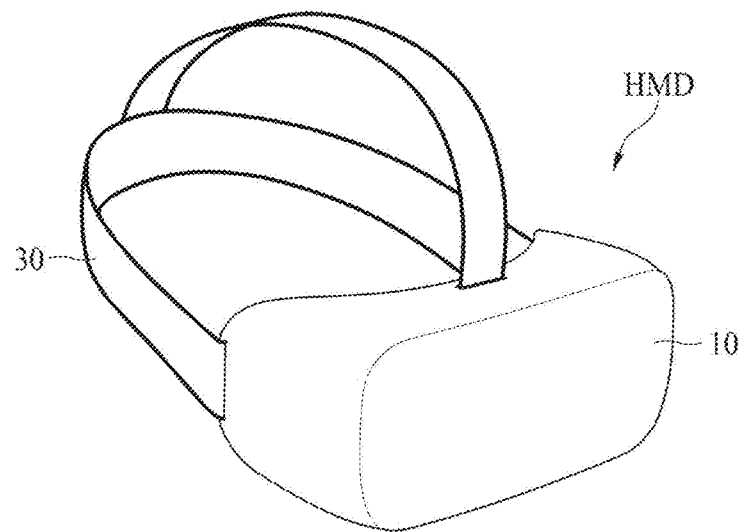
FIGS. 19A to 19C illustrate a head-mounted display (HMD) apparatus according to an embodiment of the present disclosure.
Figure 19B:
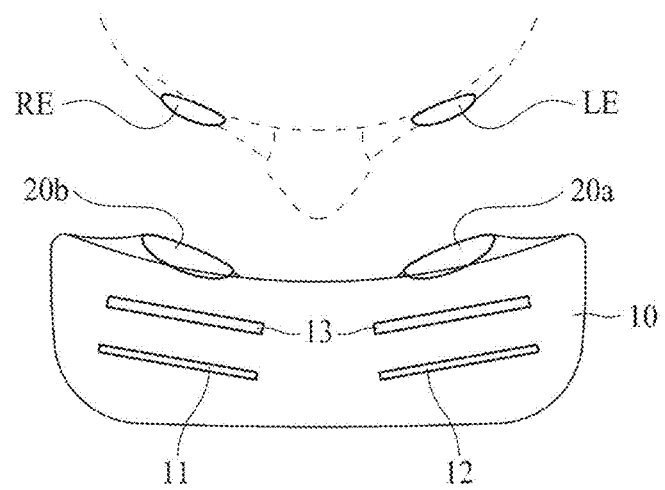
Figure 19C:
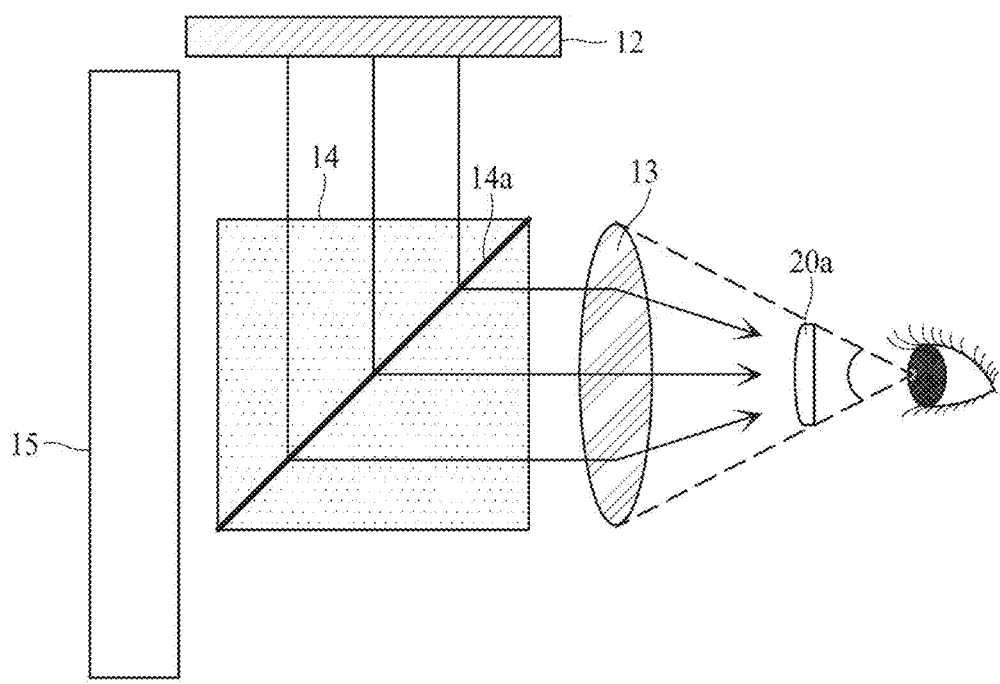

FIGS. 19A to 19C illustrate a head-mounted display (HMD) apparatus according to an embodiment of the present disclosure.

FIG. 19A is a perspective view. FIG. 19B is a plan view of a virtual reality (VR) structure. FIG. 19C is a cross-sectional view of an augmented reality (AR) structure.

As shown in the example of FIG. 19A, the HMD apparatus according to an embodiment of the present disclosure may include an accommodating case 10 and a head-mounted band 30. The accommodating case 10 may accommodate elements, such as a display apparatus, a lens array, and an eyepiece lens.

The head-mounted band 30 may be fixed to the accommodating case 10. The head-mounted band 30 is illustrated as surrounding an upper surface of both side surfaces of a user, but is not limited thereto. For example, the head-mounted band 30 may fix the HMD apparatus to a head of a user, and may be replaced by a glasses frame type structure or a helmet type structure.

As shown in the example of FIG. 19B, an HMD apparatus having the VR structure according to an embodiment of the present disclosure may include a left-eye display apparatus 12, a right-eye display apparatus 11, a lens array 13, a left-eye eyepiece lens 20a, and a right-eye eyepiece lens 20b. The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and for example, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus of any of the examples of FIGS. 1 to 18. For example, in the examples of FIGS. 1 to 18, an upper portion (for example, a color filter layer 900) corresponding to a surface displaying an image may face the lens array 13.

The lens array 13 may be spaced apart from each of the left-eye eyepiece lens 20a and the left-eye display apparatus 12, and may be between the left-eye eyepiece lens 20a and the left-eye display apparatus 12. For example, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11, and may be between the right-eye eyepiece lens 20b and the right-eye display apparatus 11. For example, the lens array 13 may be disposed in front of the right-eye eyepiece lens 20b and behind the right-eye display apparatus 11.

The lens array 13 may be a micro-lens array. The lens array 13 may be replaced by a pin hole array. Using the lens array 13, an image displayed by the left-eye display apparatus 12 or the right-eye display apparatus 11 may be zoomed in by a certain magnification. Thus, a zoomed-in image may be seen by a user.

A left eye LE of a user may be located at the left-eye eyepiece lens 20a. A right eye RE of the user may be located at the right-eye eyepiece lens 20b.

As shown in the example of FIG. 19C, an HMD apparatus having the AR structure according to an embodiment of the present disclosure may include a left-eye display apparatus 12, a lens array 13, a left-eye eyepiece lens 20a, a transmissive reflection part 14, and a transmissive window 15. In FIG. 19C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10. The left-eye display apparatus 12 may be disposed in one side (for example, an upper side) of the transmissive reflection part 14, without covering the transmissive window 15. Therefore, the left-eye display apparatus 12 may provide an image to the transmissive reflection part 14, without covering an external background seen through the transmissive window 15.

The left-eye display apparatus 12 may be configured as the electroluminescent display apparatus of any of the examples of FIGS. 1 to 18. For example, in the examples of FIGS. 1 to 18, an upper portion (for example, a color filter layer 900) corresponding to a surface displaying an image may face the transmissive reflection part 14.

The lens array 13 may be between the left-eye eyepiece lens 20a and the transmissive reflection part 14. The left eye of the user may be located at the left-eye eyepiece lens 20a.

The transmissive reflection part 14 may be between the lens array 13 and the transmissive window 15. The transmissive reflection part 14 may include a reflection surface 14a, which may transmit a portion of light, and may reflect the other portion of the light. The reflection surface 14a may be provided such that an image displayed by the left-eye display apparatus 12 may travel to the lens array 13. Accordingly, the user may see, through the transmissive window 15, all of the external background and the image displayed by the left-eye display apparatus 12. For example, the user may see one image, which may include a real background, and a virtual image. Thus, AR may be implemented. The transmissive window 15 may be disposed in front of the transmissive reflection part 14.

According to an embodiment of the present disclosure, when a first distance between a first lower electrode and a first upper electrode in a first subpixel, a second distance between a second lower electrode and a second upper electrode in a second subpixel, and a third distance between a third lower electrode and a third upper electrode in a third subpixel differ, a micro-cavity characteristic may be obtained in each subpixel, thereby enhancing light efficiency. For example, according to an embodiment of the present disclosure, when a first contact electrode is in the first subpixel, a second contact electrode is in the second subpixel, and a third contact electrode is in the third subpixel, the first to third distances may be easily set through the first to third contact electrodes.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:
1. An electroluminescent display apparatus, comprising:
   a substrate comprising:
      a first subpixel;
      a second subpixel; and
      a third subpixel;
   a circuit device layer comprising a driving thin-film transistor respectively in each of the first to third subpixels on the substrate;
   a first electrode respectively in each of the first to third subpixels on the circuit device layer;
   a bank covering an end of the first electrodes;
   a light-emitting layer on the first electrodes; and
   a second electrode on the light-emitting layer,
   wherein the first electrode of the first subpixel comprises:
      a first lower electrode, and
      a first upper electrode,
   wherein the first electrode of the second subpixel comprises:
      a second lower electrode, and
      a second upper electrode,
   wherein a distance between the first lower electrode and the first upper electrode differs from a distance between the second lower electrode and the second upper electrode,
   wherein the first lower electrode and the first upper electrode are electrically connected to each other through a first contact electrode therebetween,
   wherein the bank comprises a trench in a boundary region between the first to third subpixels,
   wherein the light-emitting layer overlaps the trench and a portion of the light-emitting layer is noncontiguous in the trench,
   wherein the light-emitting layer comprises:
      a first stack for emitting light of a first color,
      a second stack for emitting light of a second color, and a charge generation layer between the first stack and the second stack, wherein the first stack and the charge generation layer of the light-emitting layer are noncontiguous in the trench, wherein the second stack is contiguous in the boundary region between the first to third subpixels, and wherein a portion of the first stack on an inner side surface of the trench is noncontiguous with a portion of the first stack on an inner lower surface of the trench.

2. The electroluminescent display apparatus of claim 1, wherein:

the first contact electrode comprises:
  a first lower contact electrode; and
  a first upper contact electrode;
the first lower contact electrode is between the first lower electrode and the first upper contact electrode, the first lower contact electrode electrically connecting the first lower electrode to the first upper contact electrode;
the first upper contact electrode is between the first lower contact electrode and the first upper electrode, the first upper contact electrode electrically connecting the first lower contact electrode to the first upper electrode; and
the first lower electrode is electrically connected to the driving thin-film transistor of the first subpixel through a contact hole in the circuit device layer.

3. The electroluminescent display apparatus of claim 1, wherein:

the second lower electrode is electrically connected, through a second contact electrode, to the second upper electrode and the driving thin-film transistor of the second subpixel;
the second contact electrode comprises:
  a second lower contact electrode; and
  a second upper contact electrode,
the second lower contact electrode is between the second lower electrode and the driving thin-film transistor of the second subpixel, the second lower contact electrode electrically connecting the second lower electrode to the driving thin-film transistor of the second subpixel, and
the second upper contact electrode is between the second lower contact electrode and the second upper electrode, the second upper contact electrode electrically connecting the second lower contact electrode to the second upper electrode.

4. The electroluminescent display apparatus of claim 1, wherein:

the first contact electrode comprises a single contact layer;
the first lower electrode is electrically connected to the driving thin-film transistor of the first subpixel through a contact hole in the circuit device layer; and
a first insulation layer and a second insulation layer are between the first lower electrode and the first contact electrode.

5. The electroluminescent display apparatus of claim 1, wherein:

the second upper electrode is electrically connected to the driving thin-film transistor of the second subpixel through a second contact electrode;
the second contact electrode comprises:
  a second lower contact electrode; and
  a second upper contact electrode;
the second lower contact electrode is between the second upper contact electrode and the driving thin-film transistor of the second subpixel, the second lower contact electrode electrically connecting the second upper contact electrode to the driving thin-film transistor of the second subpixel;
the second upper contact electrode is between the second lower contact electrode and the second upper electrode, the second upper contact electrode electrically connecting the second lower contact electrode to the second upper electrode; and
a first insulation layer and a second insulation layer are between the second lower contact electrode and the second upper contact electrode.

6. The electroluminescent display apparatus of claim 5, wherein the second lower electrode is not electrically connected to the second upper electrode and the second contact electrode.

7. The electroluminescent display apparatus of claim 5, wherein the second lower electrode is electrically connected to a side surface of the second upper contact electrode.

8. The electroluminescent display apparatus of claim 1, wherein:

the first electrode of the third subpixel comprises:
  a third lower electrode; and a third upper electrode;
a distance between the third lower electrode and the third upper electrode differs from:
  the distance between the first lower electrode and the first upper electrode; and
  the distance between the second lower electrode and the second upper electrode; and
the third lower electrode is electrically connected to the driving thin-film transistor of the third subpixel through a third contact electrode.

9. The electroluminescent display apparatus of claim 8, wherein:

the third contact electrode comprises:
  a third lower contact electrode; and
  a third upper contact electrode;
the third lower contact electrode is between the third upper contact electrode and the driving thin-film transistor of the third subpixel, the third lower contact electrode electrically connecting the third upper contact electrode to the driving thin-film transistor of the third subpixel; and
the third upper contact electrode is between the third lower contact electrode and the third lower electrode, the third upper contact electrode electrically connecting the third lower contact electrode to the third lower electrode.

10. The electroluminescent display apparatus of claim 8, wherein:

the third contact electrode comprises a single contact layer;
the third contact electrode is electrically connected to the driving thin-film transistor of the first subpixel through a contact hole in the circuit device layer; and
a first insulation layer and a second insulation layer are between the third contact electrode and the third lower electrode.

11. The electroluminescent display apparatus of claim 8, wherein:

the third upper electrode comprises:
  a third lower layer; and
  a third upper layer; and
the third lower layer has a same pattern as a pattern of the third lower electrode in an upper surface of the third lower electrode.

12. The electroluminescent display apparatus of claim 11, further comprising:

wherein the third upper layer has the same pattern as the pattern of the third lower layer, and wherein the bank covers both ends of the third upper layer.

13. The electroluminescent display apparatus of claim 11, further comprising:

wherein the third upper layer has a pattern differing from the pattern of the third lower layer, wherein the bank does not cover one end of the third upper layer, and wherein the light-emitting layer contacts the third lower layer.

14. The electroluminescent display apparatus of claim 8, wherein:

the first upper electrode comprises:
a first lower layer; and
a first upper layer;
the first lower layer has a same pattern as a pattern of the first contact electrode; and
the first upper layer has a pattern differing from a pattern of the first lower layer.

15. The electroluminescent display apparatus of claim 14, wherein:

the first contact electrode comprises:
a first lower contact electrode; and
a first upper contact electrode;
the first lower contact electrode is between the first lower electrode and the first upper contact electrode;
the first upper contact electrode is between the first lower contact electrode and the first upper electrode; and
the first lower layer has a same pattern as a pattern of the first upper contact electrode in an upper surface of the first upper contact electrode.

16. The electroluminescent display apparatus of claim 8, further comprising:

a second contact electrode electrically connecting the second upper electrode to the driving thin-film transistor of the second subpixel, wherein the second upper electrode comprises:
a second lower layer, and
a second upper layer,
wherein the second lower layer has a same pattern as a pattern of the second contact electrode, and
wherein the second upper layer has a pattern differing from the pattern of the second lower layer.

17. The electroluminescent display apparatus of claim 16, wherein:

the second contact electrode comprises:
a second lower contact electrode; and
a second upper contact electrode;
the second lower contact electrode is between the second lower electrode and the driving thin-film transistor of the second subpixel;
the second upper contact electrode is between the second lower electrode and the second upper electrode; and
the second lower layer has a same pattern as a pattern of the second upper contact electrode in an upper surface of the second upper contact electrode.

18. The electroluminescent display apparatus of claim 8, wherein:

a number of insulation layers between the second lower electrode and the second upper electrode is smaller than a number of insulation layers between the first lower electrode and the first upper electrode; and the number of insulation layers between the second lower electrode and the second upper electrode is larger than a number of insulation layers between the third lower electrode and the third upper electrode.

19. The electroluminescent display apparatus of claim 1, wherein a portion of the first electrode contacting the light-emitting layer has one work function.

20. The electroluminescent display apparatus of claim 1, further comprising:

a lens array spaced apart from the substrate; and
an accommodating case configured to accommodate the substrate and the lens array.

* * * * *